US012813067B2

(12) United States Patent
Yoshiyasu et al.

(10) Patent No.: US 12,813,067 B2
(45) Date of Patent: Nov. 24, 2026

(54) LIGHT-EMITTING DEVICE, LIGHT-EMITTING APPARATUS, ELECTRONIC APPLIANCE, AND LIGHTING DEVICE

(71) Applicant: Semiconductor Energy Laboratory Co., Ltd., Kanagawa-ken (JP)

(72) Inventors: Yui Yoshiyasu, Atsugi (JP); Naoaki Hashimoto, Sagamihara (JP); Tatsuyoshi Takahashi, Atsugi (JP); Sachiko Kawakami, Atsugi (JP); Satoshi Seo, Sagamihara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 751 days.

(21) Appl. No.: 18/276,508

(22) PCT Filed: Jan. 28, 2022

(86) PCT No.: PCT/IB2022/050740

§ 371 (c)(1),
(2) Date: Aug. 9, 2023

(87) PCT Pub. No.: WO2022/172116

PCT Pub. Date: Aug. 18, 2022

(65) Prior Publication Data

US 2024/0315066 A1 Sep. 19, 2024

(30) Foreign Application Priority Data

Feb. 12, 2021 (JP) ................................ 2021-021325

(51) Int. Cl.

| | |
|---|---|
| ***H10K 50/844*** | (2023.01) |
| ***H10K 50/00*** | (2023.01) |
| ***H10K 50/16*** | (2023.01) |
| ***H10K 59/00*** | (2023.01) |
| *H10K 85/30* | (2023.01) |
| *H10K 85/60* | (2023.01) |

(52) U.S. Cl.

CPC ........... *H10K 50/844* (2023.02); *H10K 50/00* (2023.02); *H10K 50/166* (2023.02); *H10K 59/00* (2023.02); *H10K 85/342* (2023.02); *H10K 85/615* (2023.02); *H10K 85/626* (2023.02); *H10K 85/633* (2023.02); *H10K 85/636* (2023.02); *H10K 85/6572* (2023.02)

(58) Field of Classification Search

None

See application file for complete search history.

(56) References Cited

U.S. PATENT DOCUMENTS

| | | | | |
|---|---|---|---|---|
| 5,953,985 | A | 9/1999 | Kobayashi | |
| 6,120,338 | A | 9/2000 | Hirano et al. | |
| 7,211,948 | B2 | 5/2007 | Liao et al. | |
| 11,302,873 | B2 | 4/2022 | La et al. | |
| 11,678,550 | B2 | 6/2023 | Kato | |
| 12,581,796 | B2 * | 3/2026 | Seo | H10K 50/171 |
| 2002/0072139 | A1 | 6/2002 | Kashiwabara | |
| 2005/0151466 | A1 | 7/2005 | Liao et al. | |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |

(Continued)

FOREIGN PATENT DOCUMENTS

| | | |
|---|---|---|
| CN | 001902769 A | 1/2007 |
| CN | 109509765 A | 3/2019 |

(Continued)

OTHER PUBLICATIONS

International Search Report (Application No. PCT/IB2022/050740) Dated May 17, 2022.

Written Opinion (Application No. PCT/IB2022/050740) Dated May 17, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

(Continued)

*Primary Examiner* — Robert S Loewe

(74) *Attorney, Agent, or Firm* — Husch Blackwell LLP

(57) ABSTRACT

A light-emitting device having high heat resistance in a manufacturing process is provided. Provided is a light-emitting device which includes a second electrode over a first electrode with a first EL layer therebetween and in which the first EL layer includes at least a first light-emitting layer; a second EL layer is over the first EL layer; the second EL layer includes at least a second light-emitting layer, a first electron-transport layer, and a second electron-transport layer; the first electron-transport layer is over the second light-emitting layer; an insulating layer is in contact with the side surface of the first light-emitting layer, the side surface of the second light-emitting layer, and the side surface of the first electron-transport layer; the second electron-transport layer is over the first electron-transport layer; the insulating layer is positioned between the second electron-transport layer and the side surface of the first light-emitting layer, the side surface of the second light-emitting layer, and the side surface of the first electron-transport layer; and the first electron-transport layer includes a heteroaromatic compound including at least one heteroaromatic ring and an organic compound different from the heteroaromatic compound.

12 Claims, 24 Drawing Sheets

(56) References Cited

U.S. PATENT DOCUMENTS

| | | | | |
|---|---|---|---|---|
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069357 | A1 | 3/2015 | Park | |
| 2015/0069360 | A1 | 3/2015 | Sato | |
| 2015/0076476 | A1 | 3/2015 | Odaka et al. | |
| 2015/0228697 | A1* | 8/2015 | Liu | H10K 50/125 438/23 |
| 2016/0172595 | A1 | 6/2016 | Malinowski et al. | |
| 2016/0254474 | A1* | 9/2016 | Zou | B82Y 20/00 257/40 |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2019/0172876 | A1* | 6/2019 | Xia | H10K 59/32 |
| 2020/0066996 | A1 | 2/2020 | La et al. | |
| 2020/0161383 | A1 | 5/2020 | Kim et al. | |
| 2020/0203662 | A1 | 6/2020 | Mollard et al. | |
| 2021/0028243 | A1* | 1/2021 | Yang | H10D 84/01 |
| 2021/0265432 | A1 | 8/2021 | Kato | |
| 2022/0165974 | A1* | 5/2022 | Kim | H10K 50/131 |
| 2022/0190052 | A1* | 6/2022 | Park | H10K 59/35 |
| 2022/0209162 | A1* | 6/2022 | Seo | H10K 50/171 |
| 2022/0367831 | A1* | 11/2022 | Ohsawa | H10K 50/16 |
| 2022/0416217 | A1* | 12/2022 | Wei | H10K 50/15 |
| 2023/0413645 | A1* | 12/2023 | Imai | H10K 59/122 |

FOREIGN PATENT DOCUMENTS

| | | | |
|---|---|---|---|
| CN | 110121794 | A | 8/2019 |
| CN | 111200068 | A | 5/2020 |
| CN | 112314056 | A | 2/2021 |
| EP | 1704604 | A | 9/2006 |
| EP | 1 704 604 | B1 | 4/2012 |
| EP | 3 561 892 | A1 | 10/2019 |
| JP | 2000-036385 | A | 2/2000 |
| JP | 2003-059663 | A | 2/2003 |
| JP | 2007-525023 | | 8/2007 |
| JP | 2007-258237 | A | 10/2007 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-504911 | | 2/2020 |
| JP | 2020-160305 | A | 10/2020 |
| KR | 2006-0128915 | A | 12/2006 |
| KR | 2015-0028554 | A | 3/2015 |
| KR | 2015-0038800 | A | 4/2015 |
| KR | 2018-0075398 | A | 7/2018 |
| KR | 2020-0057922 | A | 5/2020 |
| TW | 200541405 | | 12/2005 |
| TW | 201829736 | | 8/2018 |
| WO | WO 2005/071772 | A1 | 8/2005 |
| WO | WO 2018/124588 | A1 | 7/2018 |
| WO | WO 2020/004086 | A1 | 1/2020 |

OTHER PUBLICATIONS

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

<<Structure>> Glass＼NBPhen (10 nm)

<<Structure>> Glass＼2mpPCBPDBq (10 nm)

<<Structure>> Glass＼2mpPCBPDBq: PCBBiF: Ir(tBuppm)$_3$ (0.8:0.2:0.06) (40 nm)

<<Structure>> Glass＼2mpPCBPDBq (10 nm)＼NBPhen (10 nm)

<<Structure>> Glass＼2mpPCBPDBq: PCBBiF: Ir(tBuppm)$_3$ (0.8:0.2:0.06) (40 nm)＼
2mpPCBPDBq (10 nm)＼NBPhen (10 nm)

<<Structure>> Glass╲PCBBiF (40)

<<Structure>> Glass╲2mpPCBPDBq: NBPhen (0.5:0.5) (20 nm)

<<Structure>> Glass╲2mpPCBPDBq: PCBBiF: $Ir(tBuppm)_3$ (0.8:0.2:0.06) (40 nm)╲
NBPhen (20 nm)

<<Structure>> Glass╲2mpPCBPDBq: PCBBiF: $Ir(tBuppm)_3$ (0.8:0.2:0.06) (40 nm)╲
2mpPCBPDBq: NBPhen (0.5:0.5) (20 nm)

LIGHT-EMITTING DEVICE, LIGHT-EMITTING APPARATUS, ELECTRONIC APPLIANCE, AND LIGHTING DEVICE

This application is a 371 of international application PCT/IB2022/050740 filed on Jan. 28, 2022, which is incorporated herein by reference.

TECHNICAL FIELD

One embodiment of the present invention relates to a light-emitting device, a display apparatus, a light-emitting apparatus, an electronic appliance, a light-emitting and light-receiving device, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display apparatus, a liquid crystal display apparatus, a light-emitting apparatus, a lighting device, a power storage device, a memory device, an imaging device, a driving method thereof, and a manufacturing method thereof.

BACKGROUND ART

Light-emitting devices (organic EL devices) including organic compounds and utilizing electroluminescence (EL) have been put to more practical use. In the basic structure of such light-emitting devices, an organic compound layer containing a light-emitting material (an EL layer) is held between a pair of electrodes. Carriers are injected by application of a voltage to the element, and light emission can be obtained from the light-emitting material by using the recombination energy of the carriers.

Such light-emitting devices are of self-light-emitting type and thus have advantages over liquid crystal, such as high visibility and no need for backlight when used in pixels of a display, and are suitable as flat panel display elements. Displays including such light-emitting devices are also highly advantageous in that they can be thin and lightweight. Another feature is an extremely fast response speed.

Since light-emitting layers of such light-emitting devices can be successively formed two-dimensionally, planar light emission can be obtained. This feature is difficult to realize with point light sources typified by incandescent lamps and LEDs or linear light sources typified by fluorescent lamps; thus, the light-emitting devices also have great potential as planar light sources, which can be applied to lighting and the like.

Displays or lighting devices including light-emitting devices are suitable for a variety of electronic appliances as described above, and research and development of light-emitting devices has progressed for more favorable characteristics.

In a known method for manufacturing a high-resolution light-emitting device among a variety of known methods for manufacturing light-emitting devices, a light-emitting layer is formed without using a fine metal mask. An example is a method for manufacturing an organic EL display (Patent Document 1) having a step of forming a first light-emitting layer as a continuous film across a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film across a display region by deposition of a second luminescent organic material that contains a mixture of a host material and a dopant material but differs from the first luminescent organic material, over the first light-emitting layer; and a step of forming a counter electrode over the second light-emitting layer.

REFERENCE

Patent Document

[Patent Document 1] Japanese Published Patent Application No. 2012-160473

SUMMARY OF THE INVENTION

Problems to be Solved by the Invention

An object of one embodiment of the present invention is to provide a novel light-emitting device that is highly convenient, useful, or reliable. Another object of one embodiment of the present invention is to provide a novel light-emitting apparatus that is highly convenient, useful, or reliable. Another object of one embodiment of the present invention is to provide a novel electronic appliance that is highly convenient, useful, or reliable. Another object of one embodiment of the present invention is to provide a novel lighting device that is highly convenient, useful, or reliable.

Another object of one embodiment of the present invention is to provide a light-emitting device having high heat resistance. Another object of one embodiment of the present invention is to provide a light-emitting device having high heat resistance in a manufacturing process. Another object of one embodiment of the present invention is to provide a light-emitting device having high reliability. Another object of one embodiment of the present invention is to provide a light-emitting device, a light-emitting apparatus, an electronic appliance, a display apparatus, and an electronic device each having low power consumption. Another object of one embodiment of the present invention is to provide a light-emitting device, a light-emitting apparatus, an electronic appliance, a display apparatus, and an electronic device each having low power consumption and high reliability.

Note that the description of these objects does not preclude the existence of other objects. In one embodiment of the present invention, there is no need to achieve all these objects. Other objects will be apparent from and can be derived from the description of the specification, the drawings, the claims, and the like.

Means for Solving the Problems

One embodiment of the present invention is a light-emitting device which includes a second electrode over a first electrode with a first EL layer therebetween and in which the first EL layer includes at least a first light-emitting layer; a second EL layer is over the first EL layer; the second EL layer includes at least a second light-emitting layer, a first electron-transport layer, and a second electron-transport layer; the first electron-transport layer is over the second light-emitting layer; an insulating layer is in contact with the side surface of the first light-emitting layer, the side surface of the second light-emitting layer, and the side surface of the first electron-transport layer; the second electron-transport layer is over the first electron-transport layer; the insulating layer is positioned between the second electron-transport layer and the side surface of the first light-emitting layer, the side surface of the second light-emitting layer, and the side surface of the first electron-transport layer; and the first electron-transport layer includes a heteroaromatic compound including at least one heteroaromatic ring and an organic compound different from the heteroaromatic compound.

Another embodiment of the present invention is a light-emitting device which includes a second electrode over a first electrode with a first EL layer therebetween and in which the first EL layer includes at least a first light-emitting layer; a second EL layer is over the first EL layer; the second EL layer includes at least a second light-emitting layer, a first electron-transport layer, and a second electron-transport layer; the first electron-transport layer is over the second light-emitting layer; an insulating layer is in contact with the side surface of the first light-emitting layer, the side surface of the second light-emitting layer, and the side surface of the first electron-transport layer; the second electron-transport layer is over the first electron-transport layer; the insulating layer is positioned between the second electron-transport layer and the side surface of the first light-emitting layer, the side surface of the second light-emitting layer, and the side surface of the first electron-transport layer; the first electron-transport layer includes a first heteroaromatic compound including at least one heteroaromatic ring and an organic compound different from the first heteroaromatic compound; and the second electron-transport layer includes a second heteroaromatic compound including at least one heteroaromatic ring.

In the light-emitting device having any of the above structures, the organic compound preferably includes at least one heteroaromatic ring.

In the light-emitting device having any of the above structures, the heteroaromatic ring preferably includes any one of a pyridine skeleton, a diazine skeleton, a triazine skeleton, and a polyazole skeleton.

In the light-emitting device having any of the above structures, the heteroaromatic ring preferably includes a fused heteroaromatic ring having a fused ring structure.

In the light-emitting device having the above structure, the fused heteroaromatic ring is preferably any one of a quinoline ring, a benzoquinoline ring, a quinoxaline ring, a dibenzoquinoxaline ring, a quinazoline ring, a benzoquinazoline ring, a dibenzoquinoxaline ring, a phenanthroline ring, a furodiazine ring, and a benzimidazole ring.

Another embodiment of the present invention is a light-emitting apparatus including the light-emitting device having any of the above structures, and a transistor or a substrate.

Another embodiment of the present invention is a light-emitting apparatus which includes a first light-emitting device and a second light-emitting device adjacent to each other and in which the first light-emitting device includes a second electrode over a first electrode with a first EL layer therebetween; the first EL layer includes at least a first light-emitting layer; the first light-emitting device includes a second EL layer over the first EL layer; the second EL layer includes at least a second light-emitting layer, a first electron-transport layer, and a second electron-transport layer; the first electron-transport layer is over the second light-emitting layer; the first light-emitting device includes a first insulating layer in contact with the side surface of the first light-emitting layer, the side surface of the second light-emitting layer, and the side surface of the first electron-transport layer; the second electron-transport layer is over the first electron-transport layer; the first insulating layer is positioned between the second electron-transport layer and the side surface of the first light-emitting layer, the side surface of the second light-emitting layer, and the side surface of the first electron-transport layer; the second light-emitting device includes the second electrode over a third electrode with a third EL layer therebetween; the third EL layer includes at least a third light-emitting layer; the second light-emitting device includes a fourth EL layer over the third EL layer; the fourth EL layer includes at least a fourth light-emitting layer, a third electron-transport layer, and the second electron-transport layer; the third electron-transport layer is over the fourth light-emitting layer; the second light-emitting device includes a second insulating layer in contact with the side surface of the third light-emitting layer, the side surface of the fourth light-emitting layer, and the side surface of the third electron-transport layer; the second electron-transport layer is over the third electron-transport layer; the second insulating layer is positioned between the second electron-transport layer and the side surface of the third light-emitting layer, the side surface of the fourth light-emitting layer, and the side surface of the third electron-transport layer; and the first electron-transport layer and the third electron-transport layer each include a heteroaromatic compound including at least one heteroaromatic ring and an organic compound different from the heteroaromatic compound.

Another embodiment of the present invention is a light-emitting apparatus which includes a first light-emitting device and a second light-emitting device adjacent to each other and in which the first light-emitting device includes a second electrode over a first electrode with a first EL layer therebetween; the first EL layer includes at least a first light-emitting layer; the first light-emitting device includes a second EL layer over the first EL layer; the second EL layer includes at least a second light-emitting layer, a first electron-transport layer, and a second electron-transport layer; the first electron-transport layer is over the second light-emitting layer; the first light-emitting device includes a first insulating layer in contact with the side surface of the first light-emitting layer, the side surface of the second light-emitting layer, and the side surface of the first electron-transport layer; the second electron-transport layer is over the first electron-transport layer; the first insulating layer is positioned between the second electron-transport layer and the side surface of the first light-emitting layer, the side surface of the second light-emitting layer, and the side surface of the first electron-transport layer; the second light-emitting device includes the second electrode over a third electrode with a third EL layer therebetween; the third EL layer includes at least a third light-emitting layer; the second light-emitting device includes a fourth EL layer over the third EL layer; the fourth EL layer includes at least a fourth light-emitting layer, a third electron-transport layer, and the second electron-transport layer; the third electron-transport layer is over the fourth light-emitting layer; the second light-emitting device includes a second insulating layer in contact with the side surface of the third light-emitting layer, the side surface of the fourth light-emitting layer, and the side surface of the third electron-transport layer; the second electron-transport layer is over the third electron-transport layer; the second insulating layer is positioned between the second electron-transport layer and the side surface of the third light-emitting layer, the side surface of the fourth light-emitting layer, and the side surface of the third electron-transport layer; the first electron-transport layer and the third electron-transport layer each include a first heteroaromatic compound including at least one heteroaromatic ring and an organic compound different from the first heteroaromatic compound; and the second electron-transport layer includes a second heteroaromatic compound including at least one heteroaromatic ring.

In the light-emitting apparatus having any of the above structures, the organic compound preferably includes at least one heteroaromatic ring.

In the light-emitting apparatus having any of the above structures, the heteroaromatic ring is preferably any one of a pyridine skeleton, a diazine skeleton, a triazine skeleton, and a polyazole skeleton.

In the light-emitting apparatus having any of the above structures, the heteroaromatic ring preferably includes a fused heteroaromatic ring having a fused ring structure.

In the light-emitting apparatus having the above structure, the fused heteroaromatic ring is preferably any one of a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

In the light-emitting apparatus having any of the above structures, the second electron-transport layer is preferably positioned between the second electrode and the side surface of the first electron-transport layer, the side surface of the third electron-transport layer, the side surface of the first light-emitting layer, the side surface of the second light-emitting layer, the side surface of the third light-emitting layer, and the side surface of the fourth light-emitting layer.

In addition to the above-described light-emitting devices, the present invention includes a light-emitting device including a layer (e.g., a cap layer) that is in contact with an electrode and contains an organic compound. In addition to the light-emitting devices, a light-emitting apparatus including a transistor, a substrate, and the like is also included in the scope of the invention. Furthermore, an electronic appliance or a lighting device including any of these light-emitting devices and any of a sensing portion, an input portion, a communication portion, and the like is also included in the scope of the invention.

In addition, the scope of one embodiment of the present invention includes a light-emitting apparatus including a light-emitting device, and a lighting device including the light-emitting apparatus. Accordingly, a light-emitting apparatus in this specification refers to an image display device or a light source (including a lighting device). In addition, a light-emitting apparatus includes a module in which a light-emitting apparatus is connected to a connector such as an FPC (Flexible Printed Circuit) or a TCP (Tape Carrier Package), a module in which a printed wiring board is provided on the tip of a TCP, or a module in which an IC (integrated circuit) is directly mounted on a light-emitting device by a COG (Chip On Glass) method.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; actually, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state in which a current, a voltage, or a potential can be supplied or transmitted. Accordingly, connection means not only direct connection but also indirect connection through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring serves as an electrode. The term "connection" in this specification also includes such a case where one conductive film has functions of a plurality of components, in its category.

Effect of the Invention

One embodiment of the present invention can provide a novel light-emitting device that is highly convenient, useful, or reliable. One embodiment of the present invention can provide a novel light-emitting apparatus that is highly convenient, useful, or reliable. One embodiment of the present invention can provide a novel electronic appliance that is highly convenient, useful, or reliable. One embodiment of the present invention can provide a novel lighting device that is highly convenient, useful, or reliable.

One embodiment of the present invention can provide a light-emitting device having high heat resistance. One embodiment of the present invention can provide a light-emitting device having high heat resistance in a manufacturing process. One embodiment of the present invention can provide a light-emitting device having high reliability. One embodiment of the present invention can provide a light-emitting device, a light-emitting apparatus, an electronic appliance, a display apparatus, and an electronic device each having low power consumption. One embodiment of the present invention can provide a light-emitting device, a light-emitting apparatus, an electronic appliance, a display apparatus, and an electronic device each having low power consumption and high reliability.

Note that the description of these effects does not preclude the existence of other effects. One embodiment of the present invention does not necessarily have all these effects. Other effects will be apparent from and can be derived from the description of the specification, the drawings, the claims, and the like.

MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

In this embodiment, a structure of a light-emitting device of one embodiment of the present invention is described with reference to FIG. 1.

Figure 1A:
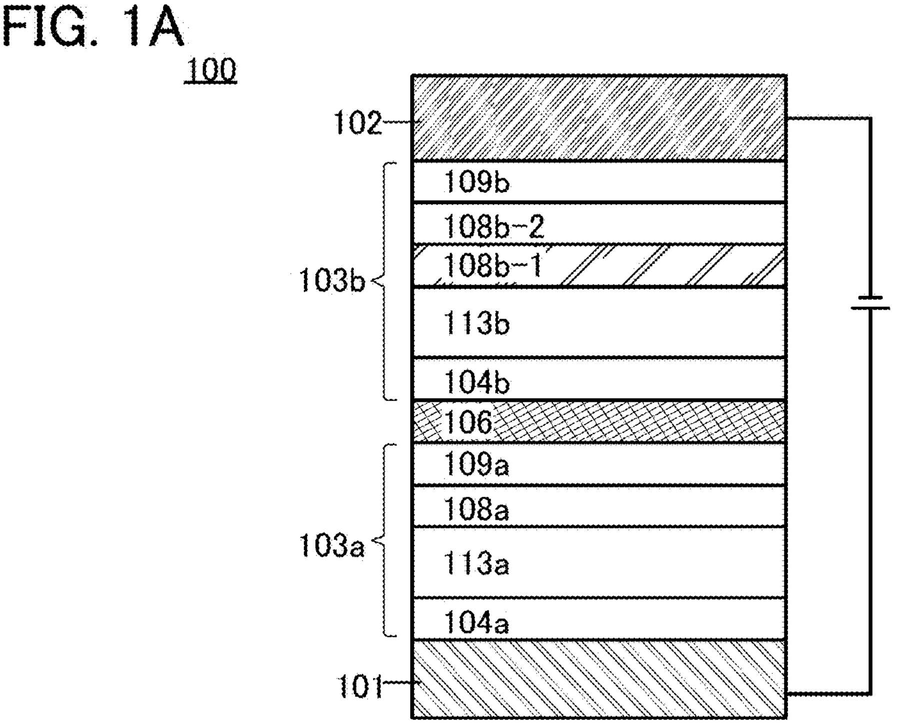
FIG. 1A and FIG. 1B are diagrams illustrating a structure of a light-emitting device according to an embodiment.
Figure 1B:
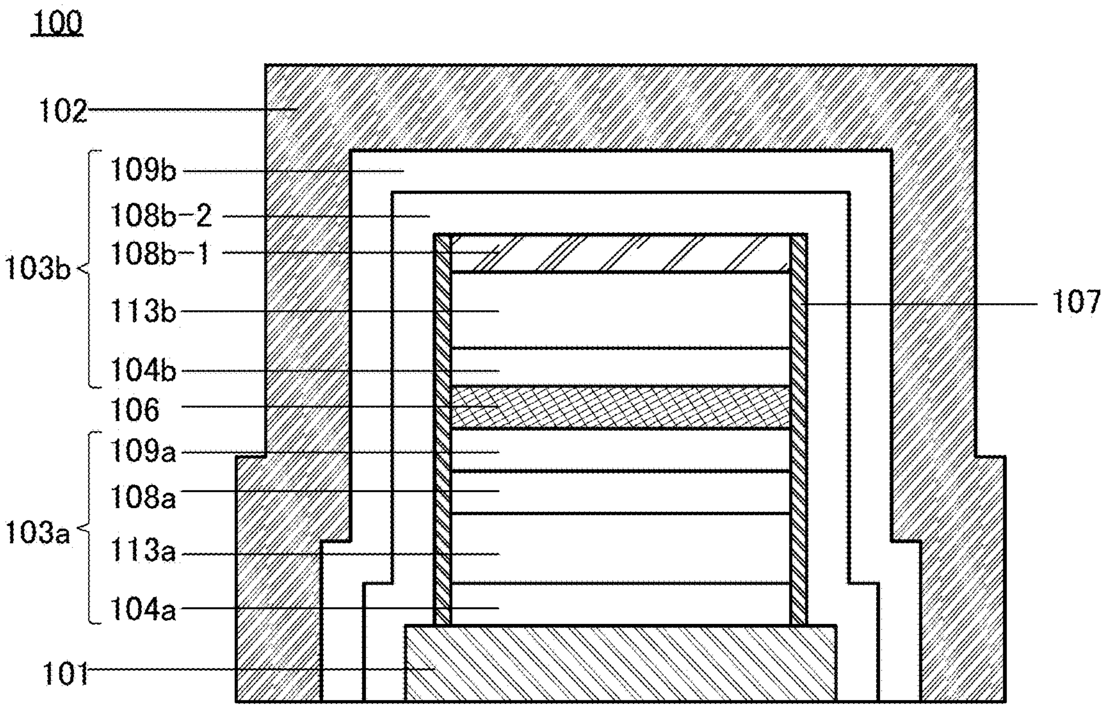

FIG. 1A is a cross-sectional view illustrating a structure of a light-emitting device 100 of one embodiment of the present invention. FIG. 1B is a cross-sectional view illustrating a specific structure of the light-emitting device 100.

As shown in FIG. 1A and FIG. 1B, the light-emitting device 100 includes a first electrode 101 and a second electrode 102 and has a structure in which an EL layer **103*a*, a charge-generation layer 106, and an EL layer 103*b* are stacked in this order between the first electrode 101 and the second electrode 102. The EL layer 103*a* has a structure in which a hole-injection/transport layer 104*a*, a light-emitting layer 113*a*, an electron-transport layer 108*a*, and an electron-injection layer 109*a* are stacked in this order, over the first electrode 101. The EL layer 103*b* has a structure in which a hole-injection/transport layer 104*b*, a light-emitting layer 113*b*, a first electron-transport layer 108*b*-1, a second electron-transport layer 108*b*-2, and an electron-injection layer 109*b* are stacked in this order, over the charge-generation layer 106**.

The first electron-transport layer **108*b*-1 contains a heteroaromatic compound including at least one heteroaromatic ring and an organic compound different from the heteroaromatic compound. Each of the heteroaromatic compound and the organic compound is contained in the first electron-transport layer 108*b*-1 at preferably greater than or equal to 10%, further preferably greater than or equal to 20%, still further preferably greater than or equal to 30%, in which case an effect of increasing heat resistance is brought to the fore. The organic compound preferably includes at least one heteroaromatic ring. In other words, the first electron-transport layer 108*b*-1 contains, as organic compounds with a high electron-transport property, either a heteroaromatic compound and an organic compound or a plurality of kinds of heteroaromatic compounds (the first electron-transport layer 108*b*-1** is preferably a mixed film of these compounds). In the case where the heteroaromatic ring of the heteroaromatic compound is a fused heteroaromatic ring, a thermophysical property such as a glass transition temperature (Tg) would be improved; however, a single film of the heteroaromatic compound has a strong interaction between molecules, which makes it difficult to form a completely glassy state, and faces a problem of easy crystallization over time even at a temperature lower than or equal to Tg. In one embodiment of the present invention, by contrast, the crystallization can be inhibited owing to the organic compound even when the heteroaromatic ring is a fused heteroaromatic ring. That is, the phenomenon of the crystallization of the film at lower than or equal to Tg can be prevented while the glass transition temperature is improved.

Note that the heteroaromatic compound, which is among organic compounds, includes at least one heteroaromatic ring.

The heteroaromatic ring has any one of a pyridine skeleton, a diazine skeleton, a triazine skeleton, and a polyazole skeleton.

The heteroaromatic ring includes a fused heteroaromatic ring having a fused ring structure.

Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

When including either the heteroaromatic compound and the organic compound or the plurality of kinds of heteroaromatic compounds, the first electron-transport layer **108*b*-1 can be more inhibited from being crystallized during heating than when including a single material. Accordingly, the first electron-transport layer 108*b*-1 can have improved heat resistance. Thus, the first electron-transport layer 108*b*-1 has higher heat resistance than the electron-transport layer 108*a* and the second electron-transport layer 108*b*-2**.

Note that the first electron-transport layer **108*b*-1** may be a layer formed using one kind of heteroaromatic compound, a layer formed using a heteroaromatic compound and an organic compound, or a layer formed using a plurality of kinds of heteroaromatic compounds.

The following embodiment will specifically describe the electron-transport materials that can be used for the second electron-transport layer **108*b*-2, the electron-transport layer 108*a*, and the first electron-transport layer 108*b*-1**, such as a heteroaromatic compound and an organic compound. It is preferable that in the light-emitting device of one embodiment of the present invention, the electron-transport layer not include a metal complex. As examples of the metal complex, an alkaline earth metal complex and an alkali metal complex, or specifically, an alkali metal quinolinolato and an alkaline earth metal quinolinolato can be given.

The second electron-transport layer **108*b*-2 and the electron-injection layer 109*b*, which are part of the EL layer 103*b*, have shapes different from those of the other layers (the hole-injection/transport layer 104*b*, the light-emitting layer 113*b*, and the first electron-transport layer 108*b*-1) of the EL layer 103*b* as shown in FIG. 1B. In general, making a layer in an EL layer have a shape different from that of another layer in the EL layer causes high temperatures in the manufacturing process, so that a problem such as crystallization of the another layer occurs and a light-emitting device has reduced reliability and luminance in some cases. By contrast, the light-emitting device 100 can be inhibited from having reduced reliability and luminance because in the manufacturing process of the light-emitting device 100, high temperatures might be caused after the formation of the first electron-transport layer 108*b*-1, which has high heat resistance. Accordingly, in the light-emitting device 100, the second electron-transport layer 108*b*-2 and the electron-injection layer 109*b* can have shapes different from those of the other layers (the hole-injection/transport layer 104*b*, the light-emitting layer 113*b*, and the first electron-transport layer 108*b*-1) of the EL layer 103*b***.

As shown in FIG. 1B, the second electron-transport layer **108*b*-2 and the electron-injection layer 109*b* can have the same shape as the second electrode 102. The second electron-transport layer 108*b*-2, the electron-injection layer 109*b*, and the second electrode 102 can be shared by a plurality of light-emitting devices; hence, the manufacturing process of the light-emitting device 100** can be simplified and the throughput can be improved.

In the EL layer **103*b*, the electron-transport layer 108*b*-2 and the electron-injection layer 109*b* are processed using a mask different from a mask used for processing the other layers (the hole-injection/transport layer 104*b*, the light-emitting layer 113*b*, and the first electron-transport layer 108*b*-1) of the EL layer 103*b*, so that the electron-transport layer 108*b*-2 and the electron-injection layer 109*b* can be formed in shapes different from those of the other layers of the EL layer 103*b***. In other words, the different shapes mean those in a plan view (a top view).

In the case where the same shape is formed, the same shape in a plan view (a top view) can be formed through processing using the same mask.

Accordingly, a shape such that the end portions (side surfaces) of the hole-injection/transport layer **104*b*, the light-emitting layer 113*b*, and the first electron-transport layer 108*b*-1 have substantially the same surface (or are positioned on substantially the same plane) is obtained. By contrast, the end portions (side surfaces) of the electron-transport layer 108*b*-2 and the electron-injection layer 109*b* are not positioned on substantially the same plane as the end portions (side surfaces) of the other layers (the hole-injection/transport layer 104*b*, the light-emitting layer 113*b*, and the first electron-transport layer 108*b*-1) of the EL layer 103*b***.

As shown in FIG. 1B, the light-emitting device 100 includes an insulating layer 107. The insulating layer 107 is in contact with the side surface of the EL layer **103*a* (the hole-injection/transport layer 104*a*, the light-emitting layer 113*a*, the electron-transport layer 108*a*, and the electron-injection layer 109*a*), the side surface of the charge-generation layer 106, the side surface of the hole-injection/transport layer 104*b*, the side surface of the light-emitting layer 113*b*, and the side surface of the first electron-transport layer 108*b*-1. The insulating layer 107 is positioned between the second electron-transport layer 108*b*-2 and the side surface of the EL layer 103*a* (the hole-injection/transport layer 104*a*, the light-emitting layer 113*a*, the electron-transport layer 108*a*, and the electron-injection layer 109*a*), the side surface of the charge-generation layer 106, the side surface of the hole-injection/transport layer 104*b*, the side surface of the light-emitting layer 113*b*, and the side surface of the first electron-transport layer 108*b*-1**.

Providing the insulating layer 107 can protect the side surface of the EL layer **103*a* (the hole-injection/transport layer 104*a*, the light-emitting layer 113*a*, the electron-transport layer 108*a*, and the electron-injection layer 109*a*), the side surface of the charge-generation layer 106, the side surface of the hole-injection/transport layer 104*b*, the side surface of the light-emitting layer 113*b*, and the side surface of the first electron-transport layer 108*b*-1. Even when the second electrode 102 is close to the side surface of the EL layer 103*a* (the hole-injection/transport layer 104*a*, the light-emitting layer 113*a*, the electron-transport layer 108*a*, and the electron-injection layer 109*a*), the side surface of the charge-generation layer 106, the side surface of the hole-injection/transport layer 104*b*, the side surface of the light-emitting layer 113***b*, and the side surface of the first electron-transport layer 108*b*-1 as shown in FIG. 1B, conduction between the second electrode 102 and the hole-injection/transport layer 104*a* or the hole-injection/transport layer 104*b* can be hindered in some cases. Furthermore, conduction between the second electrode 102 and the first electrode 101 can be hindered in some cases. Consequently, the light-emitting device 100 can employ any of a variety of structures. For example, when a plurality of the light-emitting devices 100 are arranged, the second electron-transport layers 108*b*-2 can be connected to each other, the electron-injection layers 109*b* can be connected to each other, and the second electrodes 102 can be connected to each other in the adjacent light-emitting devices 100.

Depending on circumstances, the light-emitting device 100 does not necessarily include the insulating layer 107. For example, when conduction between the second electrode 102 and the hole-injection/transport layer 104*a* or the hole-injection/transport layer 104*b* is sufficiently low, the light-emitting device 100 does not necessarily include the insulating layer 107. When conduction between the second electrode 102 and the first electrode 101 is sufficiently low, the light-emitting device 100 does not necessarily include the insulating layer 107.

The following embodiment will describe the materials that can be used for the first electrode 101, the second electrode 102, the hole-injection/transport layer 104*a*, the light-emitting layer 113*a*, the electron-injection layer 109*a*, the charge-generation layer 106, the hole-injection/transport layer 104*b*, the light-emitting layer 113*b*, the electron-injection layer 109*b*, and the insulating layer 107.

The structures described in this embodiment can be used in an appropriate combination with any of the structures described in the other embodiments.

Embodiment 2

In this embodiment, light-emitting devices using the organic compound described in Embodiment 1 will be described with reference to FIG. 2A to FIG. 2E.

<<Specific Structure of Light-Emitting Device>>

Figure 2A:
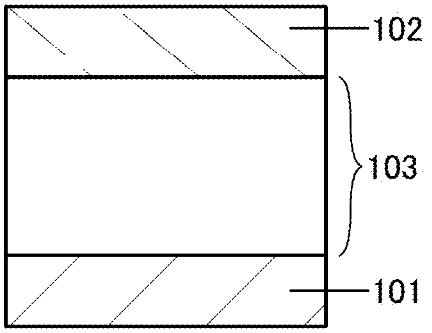
FIG. 2A to FIG. 2E are diagrams illustrating structures of light-emitting devices according to an embodiment.
Figure 2B:
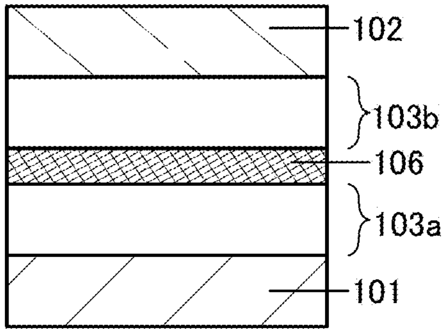
Figure 2C:
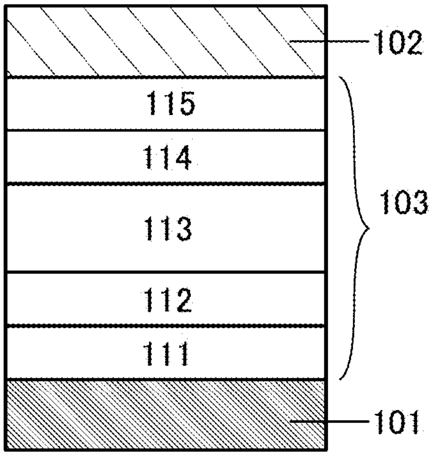
Figure 2D:
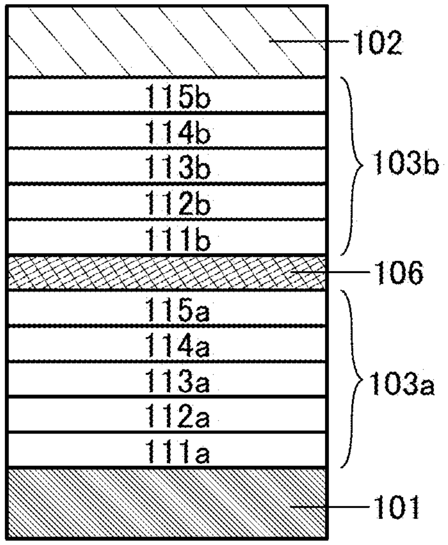
Figure 2E:
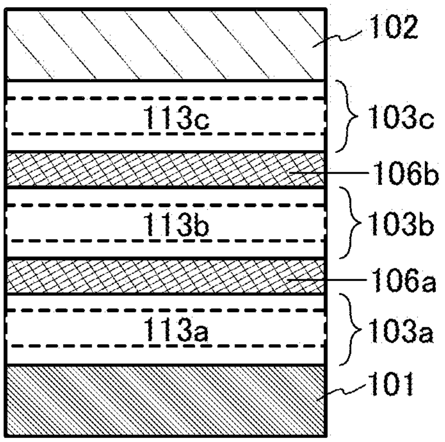

Among light-emitting devices shown in FIG. 2A to FIG. 2E, the light-emitting devices shown in FIG. 2A and FIG. 2C each have a structure in which an EL layer is held between a pair of electrodes (a single structure), whereas the light-emitting devices shown in FIG. 2B, FIG. 2D, and FIG. 2E each have a structure in which, between a pair of electrodes, two or more EL layers are stacked with a charge-generation layer positioned therebetween (a tandem structure). Note that the structure of the EL layer is common between these structures. In the case where the light-emitting device in FIG. 2D has a microcavity structure, the first electrode 101 is formed as a reflective electrode and the second electrode 102 is formed as a semi-transmissive and semi-reflective electrode. Thus, a single-layer structure or a stacked-layer structure can be formed using one or more kinds of desired electrode materials. Note that the second electrode 102 is formed after formation of the EL layer 103*b*, with the use of a material selected as described above.

<First Electrode and Second Electrode>

As materials for forming the first electrode 101 and the second electrode 102, any of the following materials can be used in an appropriate combination as long as the functions of the electrodes described above can be fulfilled. For example, a metal, an alloy, an electrically conductive compound, and a mixture of these can be used as appropriate. Specifically, In—Sn oxide (also referred to as ITO), In—Si—Sn oxide (also referred to as ITSO), In—Zn oxide, or In—W—Zn oxide can be given. It is also possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not listed above as an example (e.g., lithium (Li), cesium (Cs), calcium (Ca), or strontium (Sr)), a rare earth element such as europium (Eu) or ytterbium (Yb), an alloy containing an appropriate combination of any of these elements, graphene, or the like.

In each of the light-emitting devices illustrated in FIG. 2A and FIG. 2C, when the first electrode 101 is an anode, an EL layer 103 is formed over the first electrode 101 by a vacuum evaporation method. Specifically, as shown in FIG. 2C, a hole-injection layer 111, a hole-transport layer 112, a light-emitting layer 113, an electron-transport layer 114, and an electron-injection layer 115 are sequentially stacked as the EL layer 103 between the first electrode 101 and the second electrode by a vacuum evaporation method. In each of the light-emitting devices in FIG. 2B, FIG. 2D, and FIG. 2E, when the first electrode 101 is an anode, a hole-injection layer 111*a* and a hole-transport layer 112*a* of the EL layer 103*a* are sequentially stacked over the first electrode 101 by a vacuum evaporation method. After the EL layer 103*a* and the charge-generation layer 106 (or a charge-generation layer 106*a*) are formed, a hole-injection layer 111*b* and a hole-transport layer 112*b* of the EL layer 103*b* are sequentially stacked over the charge-generation layer 106 (or the charge-generation layer 106*a*) in a similar manner.

<Hole-injection Layer>

The hole-injection layers (111, 111*a*, and 111*b*) inject holes from the first electrode 101 serving as the anode or the charge-generation layers (106, 106*a*, and 106*b*) to the EL layers (103, 103*a*, and 103*b*) and contain an organic acceptor material or a material with a high hole-injection property.

The organic acceptor material allows holes to be generated in another organic compound whose energy value at the HOMO level (highest occupied molecular orbital) is close to the energy value at the LUMO level (lowest unoccupied molecular orbital) of the organic acceptor material when charge separation is caused between the organic acceptor material and the organic compound. Thus, as the organic acceptor material, a compound having an electron-withdrawing group (a halogen group or a cyano group), such as a quinodimethane derivative, a chloranil derivative, or a hexaazatriphenylene derivative, can be used. For example, it is possible to use 7,7,8,8-tetracyano-2,3,5,6-tetrafluoroquinodimethane (abbreviation: F4-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane F6-TCNNQ), 2-(7-dicyanomethylen-1,3,4,5,6,8,9,10-octafluoro-7H-pyren-2-(abbreviation: ylidene)malononitrile, or the like. Note that among organic acceptor materials, a compound in which electron-withdrawing groups are bonded to fused aromatic rings each having a plurality of heteroatoms, such as HAT-CN, is particularly preferred because it has a high acceptor property and stable film quality against heat. In addition, a [3]radialene derivative having an electron-withdrawing group (in particular, a cyano group or a halogen group such as a fluoro group) has a very high electron-accepting property and is thus preferable; specifically, α,α',α"-1,2,3-cyclopropanetriylidenetris[4-cyano-2,3,5,6-tetrafluorobenzeneacetonitrile], α,α', α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

As the material having a high hole-injection property, an oxide of a metal belonging to Group 4 to Group 8 in the periodic table (e.g., a transition metal oxide such as molybdenum oxide, vanadium oxide, ruthenium oxide, tungsten oxide, or manganese oxide) can be used. As specific examples, molybdenum oxide, vanadium oxide, niobium oxide, tantalum oxide, chromium oxide, tungsten oxide, manganese oxide, and rhenium oxide can be given. In particular, molybdenum oxide is preferable because it is stable in the air, has a low hygroscopic property, and is easily handled. It is also possible to use a phthalocyanine-based compound such as phthalocyanine (abbreviation: $H_2Pc$) or copper phthalocyanine (abbreviation: CuPc), or the like.

In addition to the above materials, it is also possible to use an aromatic amine compound, which is a low molecular compound, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1), or the like.

It is also possible to use a high molecular compound (an oligomer, a dendrimer, a polymer, or the like) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N-bis(phenyl)benzidine] (abbreviation: Poly-TPD). Alternatively, it is also possible to use a high molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

Alternatively, as the material having a high hole-injection property, a composite material containing a hole-transport material and the above-described organic acceptor material (electron-accepting material) can be used. In this case, the organic acceptor material extracts electrons from a hole-transport material, so that holes are generated in the hole-injection layer 111 and the holes are injected into the light-emitting layer 113 through the hole-transport layer 112. Note that the hole-injection layer 111 may be formed as a single layer made of a composite material containing a hole-transport material and an organic acceptor material (electron-accepting material), or may be formed by stacking a layer containing a hole-transport material and a layer containing an organic acceptor material (electron-accepting material).

The hole-transport material is preferably a substance having a hole mobility higher than or equal to $1\times10^{-6}$ $cm^2/Vs$ in the case where the square root of the electric field strength [V/cm] is 600. Note that other substances can be used as long as they have a hole-transport property higher than an electron-transport property.

As the hole-transport material, materials having a high hole-transport property, such as a π-electron rich heteroaromatic compound (e.g., a carbazole derivative, a furan derivative, or a thiophene derivative) or an aromatic amine (an organic compound having an aromatic amine skeleton), are preferred.

Examples of the above carbazole derivative (an organic compound having a carbazole skeleton) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the above aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N-diphenyl-9,9-dimethylfluorene-2,7-diamine (abbreviation: YGA2F), and 4,4',4"-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (the organic compound having a furan skeleton) include 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

Specific examples of the thiophene derivative (the organic compound having a thiophene skeleton) include 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Specific examples of the aromatic amine include 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)-triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiONB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

It is also possible to use a high molecular compound (an oligomer, a dendrimer, a polymer, or the like) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) as a hole-transport material. Alternatively, it is also possible to use a high molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

Note that the hole-transport material is not limited to the above, and one or a combination of various known materials may be used as the hole-transport material.

Note that the hole-injection layers (111, 111*a*, and 111*b*) can be formed by any of various known film formation methods, and can be formed by a vacuum evaporation method, for example.

<Hole-Transport Layer>

The hole-transport layers (112, 112*a*, and 112*b*) transport the holes, which are injected from the first electrode 101 by the hole-injection layers (111, 111*a*, and 111*b*), to the light-emitting layers (113, 113*a*, and 113*b*). Note that the hole-transport layers (112, 112*a*, and 112*b*) are each a layer containing a hole-transport material. Thus, for the hole-transport layers (112, 112*a*, and 112*b*), a hole-transport material that can be used for the hole-injection layers (111, 111*a*, and 111*b*) can be used.

Note that in the light-emitting device of one embodiment of the present invention, the organic compound used for the hole-transport layers (112, 112*a*, and 112*b*) can also be used for the light-emitting layers (113, 113*a*, and 113*b*). The same organic compound is preferably used for the hole-transport layers (112, 112*a*, and 112*b*) and the light-emitting layers (113, 113*a*, and 113*b*), in which case holes can be efficiently transported from the hole-transport layers (112, 112*a*, and 112*b*) to the light-emitting layers (113, 113*a*, and 113*b*).

<Light-Emitting Layer>

The light-emitting layers (113, 113*a*, and 113*b*) each contain a light-emitting substance. As the light-emitting substance that can be used for the light-emitting layers (113, 113*a*, and 113*b*), a substance that exhibits an emission color of blue, violet, bluish violet, green, yellowish green, yellow, orange, red, or the like can be used as appropriate. When different light-emitting substances are used for a plurality of light-emitting layers, different emission colors can be exhibited (for example, complementary emission colors are combined to obtain white light emission). Furthermore, a stacked-layer structure in which one light-emitting layer contains different light-emitting substances may be employed.

The light-emitting layers (113, 113*a*, and 113*b*) may each contain one or more kinds of organic compounds (a host material and the like) in addition to a light-emitting substance (a guest material).

In the case where a plurality of host materials are used in the light-emitting layers (113, 113*a*, and 113*b*), a second host material that is additionally used is preferably a substance having a larger energy gap than those of a known guest material and a first host material. Preferably, the lowest singlet excitation energy level (S1 level) of the second host material is higher than the S1 level of the first host material, and the lowest triplet excitation energy level (T1 level) of the second host material is higher than the T1 level of the guest material. Furthermore, the lowest triplet excitation energy level (T1 level) of the second host material is preferably higher than the T1 level of the first host material. With such a structure, an exciplex can be formed by the two kinds of host materials. In order to form an exciplex efficiently, it is particularly preferable to combine a compound that easily accepts holes (a hole-transport material) and a compound that easily accepts electrons (an electron-transport material). With the structure, high efficiency, a low voltage, and a long lifetime can be achieved at the same time.

The organic compound used as the host material (including the first host material and the second host material) may be any of the hole-transport materials usable for the hole-transport layers (112, 112*a*, and 112*b*) described above, electron-transport materials usable for electron-transport layers (114, 114*a*, and 114*b*) described later, and the like as long as they satisfy requirements for the host material used in the light-emitting layer, and may be an exciplex formed by a plurality of kinds of organic compounds (the first host material and the second host material). An exciplex (also referred to as Exciplex) whose excited state is formed by a plurality of kinds of organic compounds has an extremely small difference between the S1 level and the T1 level and functions as a TADF material that can convert triplet excitation energy into singlet excitation energy. In an example of a preferred combination of the plurality of kinds of organic compounds forming an exciplex, one includes a π-electron deficient heteroaromatic compound and the other includes a π-electron rich heteroaromatic compound. A phosphorescent substance such as an iridium-, rhodium-, or platinum-based organometallic complex or a metal complex may be used as one compound of the combination for forming an exciplex.

The light-emitting substance that can be used for the light-emitting layers (113, 113*a*, and 113*b*) is not particularly limited, and a light-emitting substance that converts singlet excitation energy into light emission in a visible light range or a light-emitting substance that converts triplet excitation energy into light emission in a visible light range can be used.

<<Light-Emitting Substance that Converts Singlet Excitation Energy into Light Emission>>

The following substances emitting fluorescent light (fluorescent substances) can be given as the light-emitting substance that can be used for the light-emitting layer 113 and convert singlet excitation energy into light emission. Examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of pyrene derivatives include N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-diphenyl-N,N-bis[4-(9-phenyl-9H-fluoren-9-yl)phenyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b]naphtho[1,2-d]furan)-6-amine] (abbreviation: 1,6BnfAPrn), N,N-(pyrene-1,6-diyl)bis[(N-phenylbenzo[b]naphtho[1,2-d]furan)-8-amine] (abbreviation: 1,6BnfAPrn-02), and N,N-(pyrene-1,6-diyl)bis[(6,N-diphenylbenzo[b]naphtho[1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra-tert-butylperylene (abbreviation: TBP), N,N'-(2-tert-butylanthracene-9,10-diyldi-4,1-phenylene)bis[N,N,N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), or the like.

Other examples include N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(1,1'-biphenyl-2-yl)-2-anthryl]-N,N,N-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[i]quinolizin-9-yl)ethenyl]-4H-pyran-4-ylidene}propanedinitrile (abbreviation: DCM2), N,N,N,N-tetrakis(4-methylphenyl) tetracene-5,11-diamine (abbreviation: p-mPhTD), 7,14-diphenyl-N,N,N,N-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 1,6BnfAPrn-03, 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b'] bisbenzofuran (abbreviation: 3,10FrA2Nbf(IV)-02). In particular, pyrenediamine compounds such as 1,6FLPAPrn, 1,6mMemFLPAPrn, and 1,6BnfAPrn-03 can be used, for example.

<<Light-Emitting Substance that Converts Triplet Excitation Energy into Light Emission>>

Next, as examples of the light-emitting substance that converts triplet excitation energy into light emission and can be used for the light-emitting layer 113, a substance that emits phosphorescent light (a phosphorescent substance) and a thermally activated delayed fluorescent (TADF) material that exhibits thermally activated delayed fluorescence can be given.

A phosphorescent substance refers to a compound that exhibits phosphorescence but does not exhibit fluorescence at a temperature higher than or equal to low temperatures (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), a rare earth metal complex, or the like. Specifically, a transition metal element is preferable and it is particularly preferable that a platinum group element (ruthenium (Ru), rhodium (Rh), palladium (Pd), osmium (Os), iridium (Ir), or platinum (Pt)), especially iridium, be contained, in which case the transition probability relating to direct transition between the singlet ground state and the triplet excited state can be increased.

<<Phosphorescent Substance (from 450 nm to 570 nm: Blue or Green)>>

As examples of a phosphorescent substance that exhibits blue or green emission and whose emission spectrum has a peak wavelength greater than or equal to 450 nm and less than or equal to 570 nm, the following substances can be given.

The examples include organometallic complexes having a 4H-triazole skeleton, such as tris{2-[5-(2-methylphenyl)-4-(2,6-dimethylphenyl)-4H-1,2,4-triazol-3-yl-KN2]phenyl-K (}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir (iPrptz-3b)$_3$]), and tris[3-(5-biphenyl)-5-isopropyl-4-phenyl-4H-1,2,4-triazolato]iridium(III) (abbreviation: [Ir (iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir (Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris [3-(2,6-dimethylphenyl)-7-methylimidazo[1,2-f] phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$] iridium(III) picolinate (abbreviation: FIrpic), bis {2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)).

<<Phosphorescent Substance (from 495 nm to 590 nm: Green or Yellow)>

As examples of a phosphorescent substance that exhibits green or yellow emission and whose emission spectrum has a peak wavelength greater than or equal to 495 nm and less than or equal to 590 nm, the following substances can be given.

The examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$ (acac)]), (acetylacetonato)bis(6-tert-butyl-4-phenylpyrimidinato)iridium(III) (abbreviation: [Ir(tBuppm) $_2$(acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato) bis{4,6-dimethyl-2-[6-(2,6-dimethylphenyl)-4-pyrimidinyl-κN3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm) $_2$(acac)]); organometallic iridium complexes having a pyrazine skeleton, such as (acetylacetonato)bis(3,5-dimethyl-2-phenylpyrazinato)iridium(III) (abbreviation: [Ir (mppr-Me)$_2$(acac)]) and (acetylacetonato)bis(5-isopropyl-3-methyl-2-phenylpyrazinato)iridium(III) (abbreviation: [Ir (mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo [h]quinolinato)iridium(III) (abbreviation: [Ir(bzq)$_3$]), tris(2-phenylquinolinato-N,C$^{2'}$)iridium(III) (abbreviation: [Ir(pq) $_3$]), bis(2-phenylquinolinato-N,C$^{2'}$)iridium(III) acetylacetonate (abbreviation: [Ir(pq)$_2$(acac)]), bis[2-(2-pyridinyl-κN)phenyl-κC][2-(4-phenyl-2-pyridinyl-κN)phenyl-κC]iridium(III) (abbreviation: [Ir(ppy)$_2$(4dppy)]), bis[2-(2-pyridinyl-κN)phenyl-κC][2-(4-methyl-5-phenyl-2-pyridinyl-κN)phenyl-κC], [2-d$_3$-methyl-8-(2-pyridinyl-κN) benzofuro[2,3-b]pyridine-κC]bis[2-(5-d$_3$-methyl-2-pyridinyl-κN$^2$)phenyl-κC]iridium(III) (abbreviation: Ir(5mppy-d$_3$)$_2$(mbfpypy-d$_3$)), [2-(methyl-d$_3$)-8-[4-(1-methylethyl-1-d)-2-pyridinyl-κN]benzofuro[2,3-b]pyridin-7-yl-κC]bis[5-(methyl-d$_3$)-2-[5-(methyl-d$_3$)-2-pyridinyl-KM]phenyl-κC]iridium(III) (abbreviation: Ir(5mtpy-d$_6$)$_2$ (mbfpypy-iPr-$d_4$)), [2-$d_3$-methyl-(2-pyridinyl-κN)benzofuro[2,3-b]pyridine-κC]bis[2-(2-pyridinyl-κN)phenyl-κC]iridium(III) (abbreviation: $Ir(ppy)_2$(mbfpypy-$d_3$)), and [2-(4-methyl-5-phenyl-2-pyridinyl-κN)phenyl-κC]bis[2-(2-pyridinyl-κN)phenyl-κC]iridium(III) (abbreviation: $Ir(ppy)_2$(mdppy)); organometallic complexes such as bis(2,4-diphenyl-1,3-oxazolato-N,$C^{2'}$)iridium(III) acetylacetonate (abbreviation: [$Ir(dpo)_2$(acac)]), bis{2-[4'-(perfluorophenyl)phenyl]pyridinato-N,$C^{2'}$}iridium(III) acetylacetonate (abbreviation: [Ir(p-PF-ph)$_2$(acac)]), and bis(2-phenylbenzothiazolato-N,$C^{2'}$)iridium(III) acetylacetonate (abbreviation: [$Ir(bt)_2$(acac)]); and rare earth metal complexes such as tris(acetylacetonato)(monophenanthroline)terbium(III) (abbreviation: [$Tb(acac)_3$(Phen)]).

<<Phosphorescent Substance (from 570 nm to 750 nm: Yellow or Red)>>

As examples of a phosphorescent substance that exhibits yellow or red emission and whose emission spectrum has a peak wavelength greater than or equal to 570 nm and less than or equal to 750 nm, the following substances can be given.

The examples include organometallic complexes having a pyrimidine skeleton, such as (diisobutyrylmethanato)bis[4,6-bis(3-methylphenyl)pyrimidinato]iridium(III) (abbreviation: [$Ir(5mdppm)_2$(dibm)]), bis[4,6-bis(3-methylphenyl)pyrimidinato](dipivaloylmethanato)iridium(III) (abbreviation: [$Ir(5mdppm)_2$(dpm)]), and (dipivaloylmethanato)bis[4,6-di(naphthalen-1-yl)pyrimidinato]iridium(III) (abbreviation: [$Ir(d1npm)_2$(dpm)]); organometallic complexes having a pyrazine skeleton, such as (acetylacetonato)bis(2,3,5-triphenylpyrazinato)iridium(III) (abbreviation: [$Ir(tppr)_2$(acac)]), bis(2,3,5-triphenylpyrazinato)(dipivaloylmethanato)iridium(III) (abbreviation: [$Ir(tppr)_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-$κ^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-$κ^2$O,O')iridium(III) (abbreviation: [Ir(dmdppr-dmCP)$_2$(dpm)]), bis[2-(5-(2,6-dimethylphenyl)-3-(3,5-dimethylphenyl)-2-pyrazinyl-κN)-4,6-dimethylphenyl-κC](2,2',6,6'-tetramethyl-3,5-heptadionato-κ2O,O')iridium(III) (abbreviation: [Ir(dmdppr-dmp)$_2$(dpm)]), (acetylacetonato)bis[2-methyl-3-phenylquinoxalinato-N,$C^{2'}$]iridium(III) (abbreviation: [$Ir(mpq)_2$(acac)]), (acetylacetonato)bis(2,3-diphenylquinoxalinato-N,$C^{2'}$)iridium(III) (abbreviation: [$Ir(dpq)_2$(acac)]), and (acetylacetonato)bis[2,3-bis(4-fluorophenyl)quinoxalinato]iridium(III) (abbreviation: [$Ir(Fdpq)_2$(acac)]); organometallic complexes having a pyridine skeleton, such as tris(1-phenylisoquinolinato-N,$C^{2'}$)iridium(III) (abbreviation: [$Ir(piq)_3$]), bis(1-phenylisoquinolinato-N,$C^{2'}$)iridium(III) acetylacetonate (abbreviation: [$Ir(piq)_2$(acac)]), and bis[4,6-dimethyl-2-(2-quinolinyl-κN)phenyl-κC](2,4-pentanedionato-$κ^2$O,O')iridium(III) (abbreviation: [$Ir(dmpqn)_2$(acac)]); platinum complexes such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato)(monophenanthroline)europium(III) (abbreviation: [$Eu(DBM)_3$(Phen)]) and tris[1-(2-thenoyl)-3,3,3-trifluoroacetonato](monophenanthroline)europium(III) (abbreviation: [$Eu(TTA)_3$(Phen)]).

<<TADF Material>>

Any of materials shown below can be used as the TADF material. The TADF material refers to a material that has a small energy difference (preferably, less than or equal to 0.2 eV) between the S1 level and the T1 level, enables up-conversion of a triplet excited state into a singlet excited state (reverse intersystem crossing) using a little thermal energy, and efficiently exhibits light emission (fluorescence) from the singlet excited state. The thermally activated delayed fluorescence is efficiently obtained under the condition where the difference in energy between the triplet excited energy level and the singlet excited energy level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $1\times10^{-6}$ seconds or longer, preferably $1\times10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

[Chemical Formula 1]

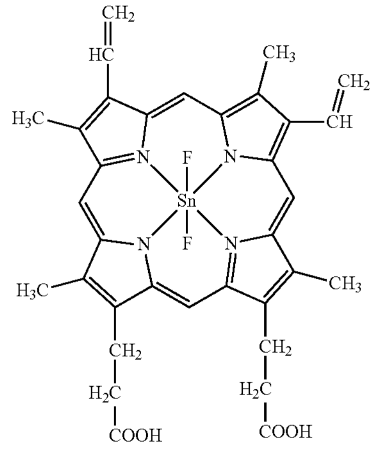

$SnF_2$(Proto IX)

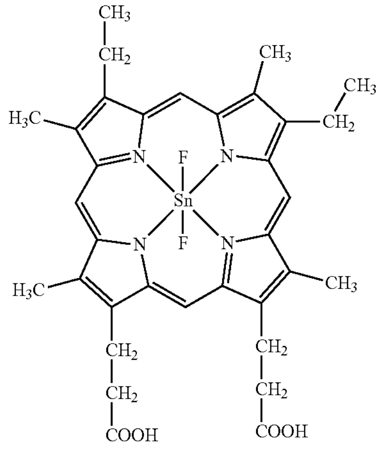

$SnF_2$(Meso IX)

-continued

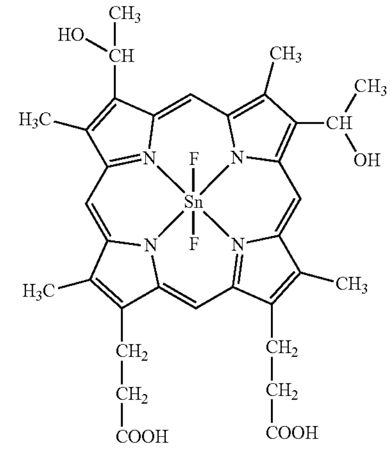

$SnF_2$(Hemato IX)

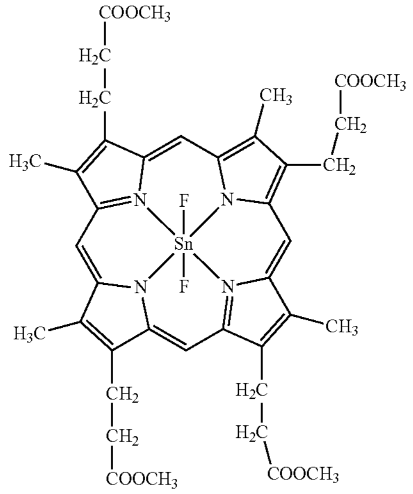

$SnF_2$(Copro III-4Me)

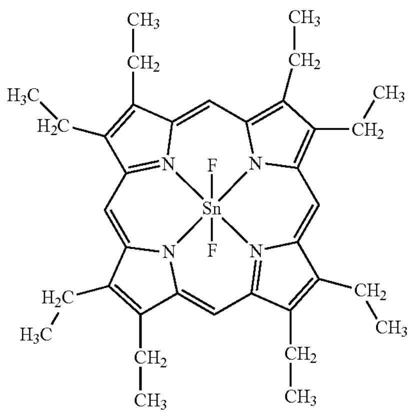

$SnF_2$(OEP)

-continued

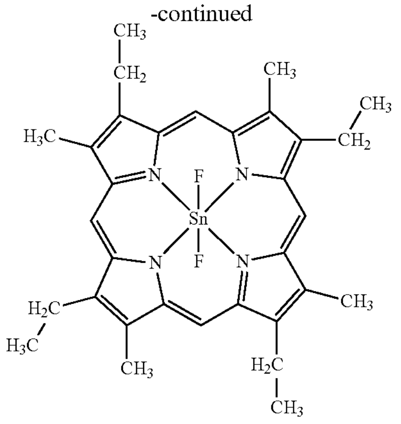

$SnF_2$(Etio I)

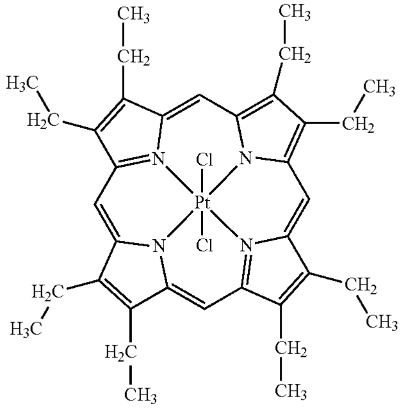

$PtCl_2OEP$

Alternatively, a heteroaromatic compound that includes a π-electron rich heteroaromatic compound and a π-electron deficient heteroaromatic compound, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02), may be used.

Note that a substance in which a π-electron rich heteroaromatic compound is directly bonded to a π-electron deficient heteroaromatic compound is particularly preferable because both the donor property of the π-electron rich heteroaromatic compound and the acceptor property of the π-electron deficient heteroaromatic compound are improved and the energy difference between the singlet excited state and the triplet excited state becomes small.

[Chemical Formula 2]
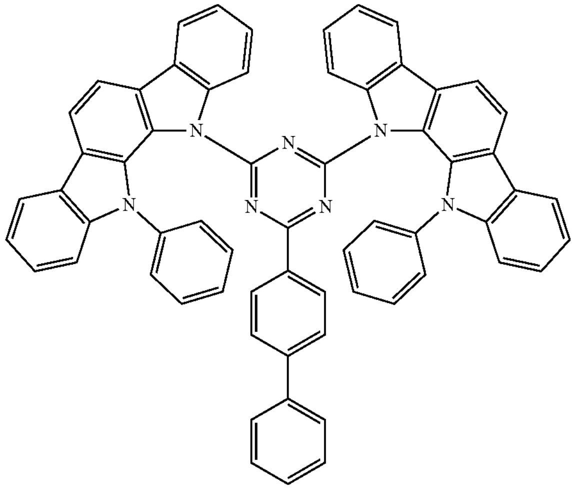
PIC-TRZ
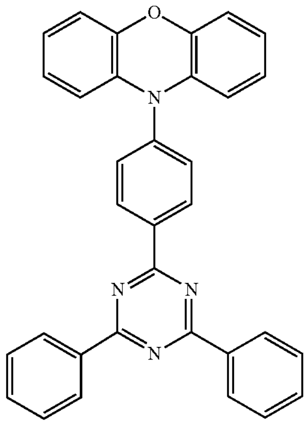
PXZ-TRZ
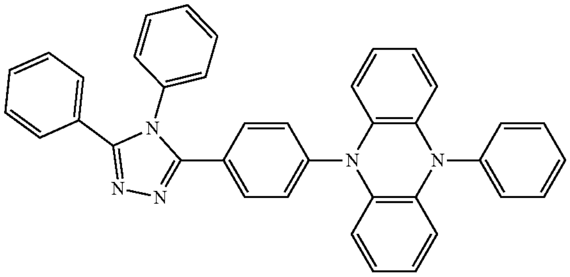
PPZ-3TPT
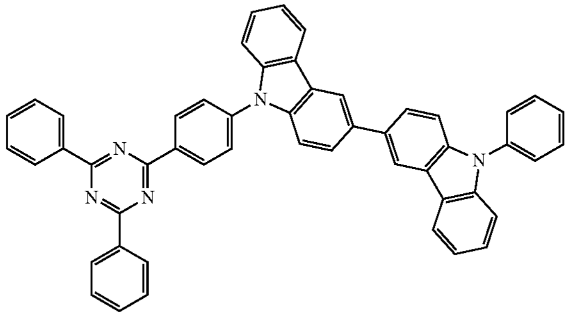
PCCzPTzn
-continued
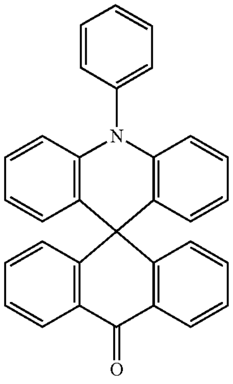
ACRSA
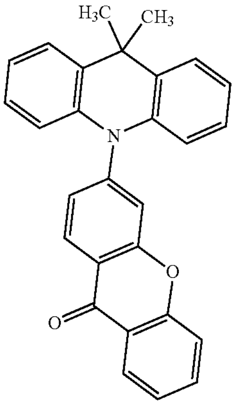
ACRXTN
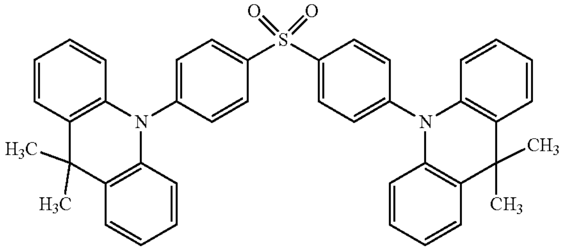
DMAC-DPS
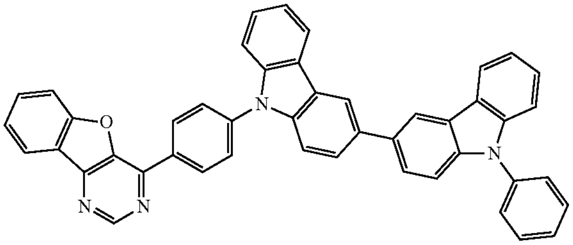
4PCCzPBfpm
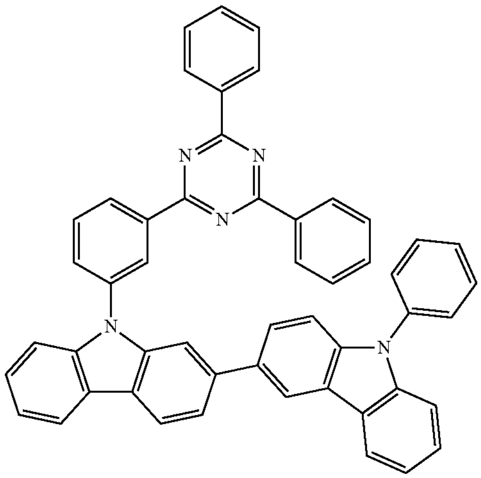
mPCCzPTzn-02

-continued

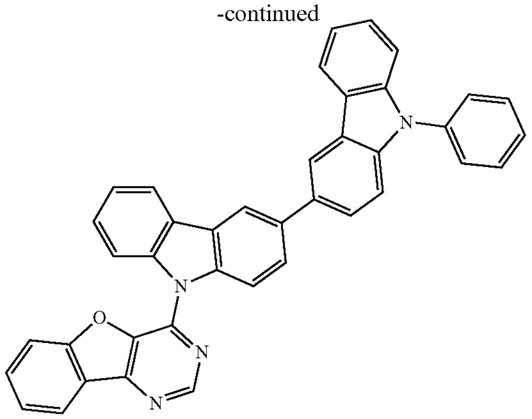

4PCCzBfpm

In addition to the above, another example of a material having a function of converting triplet excitation energy into light emission is a nanostructure of a transition metal compound having a perovskite structure. In particular, a nanostructure of a metal-halide perovskite material is preferable. The nanostructure is preferably a nanoparticle or a nanorod.

As the organic compounds (the host material and the like) used in combination with any of the above light-emitting substances (guest material) in the light-emitting layers (113, 113*a*, 113*b*, and 113*c*), one or more kinds of substances having a larger energy gap than the light-emitting substance (the guest material) are selected to be used.

<<Host Material for Fluorescence>>

In the case where the light-emitting substance used in the light-emitting layers (113, 113*a*, 113*b*, and 113*c*) is a fluorescent substance, an organic compound (a host material) used in combination with the fluorescent substance is preferably an organic compound that has a high energy level in a singlet excited state and has a low energy level in a triplet excited state or an organic compound having a fluorescence quantum yield. Therefore, the hole-transport material (described above) or the electron-transport material (described below) shown in this embodiment, for example, can be used as long as they are organic compounds that satisfy such a condition.

In terms of a preferred combination with the light-emitting substance (fluorescent substance), examples of the organic compound (host material), some of which overlap with the above specific examples, include fused polycyclic aromatic compounds such as an anthracene derivative, a tetracene derivative, a phenanthrene derivative, a pyrene derivative, a chrysene derivative, and a dibenzo[g,p]chrysene derivative.

Specific examples of the organic compound (the host material) preferably used in combination with a fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9-(1-naphthyl)-10-(2-naphthyl)anthracene (abbreviation: α,βADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(1-naphthyl)-10-[4-(2-naphthyl)phenyl]anthracene (abbreviation: αN-βNPAnth), 9-(2-naphthyl)-10-[3-(2-naphthyl)phenyl]anthracene (abbreviation: βN-mβNPAnth), 1-[4-(10-[1,1'-biphenyl]-4-yl-9-anthracenyl)phenyl]-2-ethyl-1H-benzimidazole (abbreviation: EtBImPBPhA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), and 5,12-diphenyltetracene, 5,12-bis(biphenyl-2-yl)tetracene.

<<Host Material for Phosphorescence>>

In the case where the light-emitting substance used for the light-emitting layers (113, 113*a*, 113*b*, and 113*c*) is a phosphorescent substance, an organic compound having triplet excitation energy (energy difference between a ground state and a triplet excited state) which is higher than that of the light-emitting substance is preferably selected as the organic compound (the host material) used in combination with the phosphorescent substance. Note that in the case where a plurality of organic compounds (e.g., a first host material and a second host material (also referred to as an assist material)) are used in combination with a light-emitting substance in order to form an exciplex, the plurality of organic compounds are preferably mixed with the phosphorescent substance.

Such a structure makes it possible to efficiently obtain light emission utilizing ExTET (Exciplex-Triplet Energy Transfer), which is energy transfer from an exciplex to a light-emitting substance. Note that a combination of the plurality of organic compounds that easily forms an exciplex is preferably employed, and it is particularly preferable to combine a compound that easily accepts holes (a hole-transport material) and a compound that easily accepts electrons (an electron-transport material).

In terms of a preferred combination with the light-emitting substance (phosphorescent substance), examples of the organic compounds (the host material and the assist material), some of which overlap with the above specific examples, include an aromatic amine (an organic compound having an aromatic amine skeleton), a carbazole derivative (an organic compound having a carbazole skeleton), a dibenzothiophene derivative (an organic compound having a dibenzothiophene skeleton), a dibenzofuran derivative (an organic compound having a dibenzofuran skeleton), an oxadiazole derivative (an organic compound having an oxadiazole skeleton), a triazole derivative (an organic compound having a triazole skeleton), a benzimidazole derivative (an organic compound having a benzimidazole skeleton), a quinoxaline derivative (an organic compound having a quinoxaline skeleton), a dibenzoquinoxaline derivative (an organic compound having a dibenzoquinoxaline skeleton), a pyrimidine derivative (an organic compound having a pyrimidine skeleton), a triazine derivative (an organic compound having a triazine skeleton), a pyridine derivative (an organic compound having a pyridine skeleton), a bipyridine derivative (an organic compound having a bipyridine skeleton), a phenanthroline derivative (an organic compound having a phenanthroline skeleton), a furodiazine derivative (an organic compound having a furodiazine skeleton), and zinc- and aluminum-based metal complexes.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II), and these materials are preferable as the host material.

Other examples of preferred host materials include metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Among the above organic compounds, specific examples of the oxadiazole derivative, the triazole derivative, the benzimidazole derivative, the quinoxaline derivative, the dibenzoquinoxaline derivative, the quinazoline derivative, the phenanthroline derivative, and the like, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOS), bathophenanthroline (abbreviation: Bphen), bathocuproine (abbreviation: BCP), 2,9-di(2-naphthyl)-4,7-diphenyl-1,10-phenanthroline (abbreviation: NBPhen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-{4-[9,10-di(2-naphthyl)-2-anthryl]phenyl}-1-phenyl-1H-benzimidazole (abbreviation: ZADN), and 2-[4'-(9-phenyl-9H-carbazol-3-yl)-3,1'-biphenyl-1-yl]dibenzo[f;h]quinoxaline (abbreviation: 2mpPCBPDBq), and these materials are preferable as the host material.

Among the above organic compounds, specific examples of the pyridine derivative, the diazine derivative (including the pyrimidine derivative, the pyrazine derivative, and the pyridazine derivative), the triazine derivative, the furodiazine derivative, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 9,9'-[pyrimidine-4,6-diylbis(biphenyl-3,3'-diyl)]bis(9H-carbazole) (abbreviation: 4,6mCzBP2Pm), 2-[3'-(9,9-dimethyl-9H-fluoren-2-yl)-1,1'-biphenyl-3-yl]-4,6-diphenyl-1,3,5-triazine (abbreviation: mFBPTzn), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-[3'-(dibenzothiophen-4-yl)biphenyl-3-yl]naphtho[1',2':4,5]furo[2,3-b]pyrazine (abbreviation: 9mDBtBPNfpr), 9-[(3'-dibenzothiophen-4-yl)biphenyl-4-yl]naphtho[1',2':4,5]furo[2,3-b]pyrazine (abbreviation: 9pmDBtBPNfpr), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1':4',1''-terphenyl]-4-yl-1-dibenzofuranyl)-1,3,5-triazine (abbreviation: mBP-TPDBfTzn), 6-(1,1'-biphenyl-3-yl)-4-[3,5-bis(9H-carbazol-9-yl)phenyl)-2-phenylpyrimidine (abbreviation: 6mBP-4Cz2PPm), and 4-[3,5-bis(9H-carbazol-9-yl)phenyl]-2-phenyl-6-(1,1'-biphenyl-4-yl)pyrimidine (abbreviation: 6BP-4Cz2PPm), and these materials are preferable as the host material.

Among the above organic compounds, specific examples of metal complexes that are organic compounds having a high electron-transport property include zinc- and aluminum-based metal complexes, such as tris(8-quinolinolato)aluminum(III) (abbreviation: $Alq_3$), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq), and metal complexes having a quinoline skeleton or a benzoquinoline skeleton, and these materials are preferable as the host material.

Furthermore, high molecular compounds such as poly(2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy), and the like are preferable as the host material.

Furthermore, an organic compound having a bipolar property, i.e., both a high hole-transport property and a high electron-transport property, such as 9-phenyl-9'-(4-phenyl- 2-quinazolinyl)-3,3'-bi-9H-carbazole (abbreviation: PCCzQz), 2-[4'-(9-phenyl-9H-carbazol-3-yl)-3,1'-biphenyl-1-yl]dibenzo[f,h]quinoxaline (abbreviation: 2mpPCBPDBq), 5-[3-(4,6-diphenyl-1,3,5-triazin-2yl)phenyl]-7,7-dimethyl-5H,7H-indeno[2,1-b]carbazole (abbreviation: mINc(II)PTzn), 11-(4-[1,1'-niphenyl]-4-yl-6-phenyl-1,3,5-triazin-2-yl)-11,12-dihydro-12-phenyl-indolo[2,3-a]carbazole (abbreviation: BP-Icz(II)Tzn), or 7-[4-(9-phenyl-9H-carbazol-2-yl)quinazolin-2-yl]-7H-dibenzo[c,g] carbazole (abbreviation: PC-cgDBCzQz) can be used as the host material.

<Electron-Transport Layer>

The electron-transport layers (114, 114*a*, and 114*b*) transport the electrons, which are injected from the second electrode 102 or the charge-generation layers (106, 106*a*, and 106*b*) by the electron-injection layers (115, 115*a*, and 115*b*) described later, to the light-emitting layers (113, 113*a*, and 113*b*). Note that the electron-transport layers (114, 114*a*, and 114*b*) are each a layer containing an electron-transport material. It is preferable that the electron-transport materials used in the electron-transport layers (114, 114*a*, and 114*b*) be substances with an electron mobility higher than or equal to $1\times10^{-6}$ $cm^2/Vs$ in the case where the square root of the electric field strength [V/cm] is 600. Note that other substances can also be used as long as they have an electron-transport property higher than a hole-transport property. Each of the electron-transport layers (114, 114*a*, and 114*b*) functions even in the form of a single layer but preferably has a stacked-layer structure of two or more layers in one embodiment of the present invention. In the case where each of the electron-transport layers (114, 114*a*, and 114*b*) has a stacked-layer structure, since the electron-transport layer that includes either a heteroaromatic compound and an organic compound or a plurality of kinds of heteroaromatic compounds (the electron-transport layer is preferably a mixed film of these compounds) has higher heat resistance than an electron-transport layer having any other structure as described in Embodiment 1, performing a photolithography process over the electron-transport layer that includes either a heteroaromatic compound and an organic compound or a plurality of kinds of heteroaromatic compounds can suppress the influence of a heating step on device characteristics.

<<Electron-Transport Material>>

As the electron-transport material that can be used for the electron-transport layers (114, 114*a*, and 114*b*), a heteroaromatic compound, which is an organic compound with a high electron-transport property, can be used. The heteroaromatic compound refers to a cyclic compound containing at least two different kinds of elements in a ring. Examples of cyclic structures include a three-membered ring, a four-membered ring, a five-membered ring, a six-membered ring, and the like, among which a five-membered ring and a six-membered ring are particularly preferred; the elements contained in the heteroaromatic compound are preferably one or more of nitrogen, oxygen, sulfur, and the like, as well as carbon. In particular, a heteroaromatic compound containing nitrogen (a nitrogen-containing heteroaromatic compound) is preferred, and any of materials having a high electron-transport property (electron-transport materials), such as a nitrogen-containing heteroaromatic compound and a π-electron deficient heteroaromatic compound including the nitrogen-containing heteroaromatic compound, is preferably used.

Note that the heteroaromatic compound, which is among organic compounds, includes at least one heteroaromatic ring.

The heteroaromatic ring has any one of a pyridine skeleton, a diazine skeleton, a triazine skeleton, and a polyazole skeleton.

The heteroaromatic ring includes a fused heteroaromatic ring having a fused ring structure.

Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

Examples of a heteroaromatic compound including carbon and one or more of nitrogen, oxygen, sulfur, and the like and having a five-membered ring structure include an organic compound having an imidazole skeleton, an organic compound having a triazole skeleton, an organic compound having an oxazole skeleton, an organic compound having an oxadiazole skeleton, an organic compound having a thiazole skeleton, and an organic compound having a benzimidazole skeleton.

Examples of a heteroaromatic compound including carbon and one or more of nitrogen, oxygen, sulfur, and the like and having a six-membered ring structure include an organic compound having a heteroaromatic ring such as a pyridine skeleton, a diazine skeleton (a pyrimidine skeleton, a pyrazine skeleton, a pyridazine skeleton, or the like), a triazine skeleton, or a polyazole skeleton. Other examples include an organic compound having a bipyridine structure and an organic compound having a terpyridine structure, although they are included in examples of an organic compound in which pyridine skeletons are connected.

Examples of the heteroaromatic compound having a fused ring structure including the above six-membered ring structure as a part include an organic compound having a fused heteroaromatic ring such as a quinoline ring, a benzoquinoline ring, a quinoxaline ring, a dibenzoquinoxaline ring, a phenanthroline ring, a furodiazine ring (including a skeleton in which an aromatic ring is fused to the furan ring of a furodiazine skeleton), or a benzimidazole ring.

Specific examples of the above-described heteroaromatic compound having a five-membered ring structure (e.g., an imidazole skeleton, a triazole skeleton, an oxazole skeleton, an oxadiazole skeleton, a thiazole skeleton, or a benzimidazole skeleton) include 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBT-BIm-II), and 4,4'-bis(5-methylbenzoxazol-2-yl)stilbene (abbreviation: BzOS).

Specific examples of the above-described heteroaromatic compound having a six-membered ring structure (e.g., a pyridine skeleton, a diazine skeleton (including a pyrimidine skeleton, a pyrazine skeleton, a pyridazine skeleton, and the like), a triazine skeleton, or a polyazole skeleton) include 4,6-bis[3-(phenanthren-9-yl)phenyl]pyrimidine (abbreviation: 4,6mPnP2Pm), 4,6-bis[3-(4-dibenzothienyl)phenyl] pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)

phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 4,6mCzBP2Pm, mFBPTzn, 8BP-4mDBtPBfpm, 9mDBtBPNfpr, 9pmDBtBPNfpr, 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1':4',1''-terphenyl]-4-yl-1-dibenzofuranyl)-1,3,5-triazine (abbreviation: mBP-TPDBfTzn), 6-(1,1'-biphenyl-3-yl)-4-[3,5-bis(9H-carbazol-9-yl)phenyl)-2-phenylpyrimidine (abbreviation: 6mBP-4Cz2PPm), and 4-[3,5-bis(9H-carbazol-9-yl)phenyl]-2-phenyl-6-(1,1'-biphenyl-4-yl)pyrimidine (abbreviation: 6BP-4Cz2PPm).

Other examples include 2-{3-[3-(dibenzothiophen-4-yl) phenyl]phenyl}-4,6-diphenyl-1,3,5-triazine (abbreviation: mDBtBPTzn), 4-[3-(dibenzothiophen-4-yl)phenyl]-8-(naphthalen-2-yl)-[1]benzofuro[3,2-d]pyrimidine (abbreviation: 8PN-4mDBtPBfpm), 3,8-bis[3-(dibenzothiophen-4-yl) phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2':4,5]furo[3,2-d]pyrimidine (abbreviation: 8mDBtBPNfpm), and 8-[(2,2'-binaphthalen)-6-yl]-4-[3-(dibenzothiophen-4-yl)phenyl]-[1]benzofuro[3,2-d] pyrimidine (abbreviation: 8(pN2)-4mDBtPBfpm).

Other examples include 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), 6-(1,1'-biphenyl-3-yl)-4-[3,5-bis(9H-carbazol-9-yl)phenyl]-2-phenylpyrimidine (abbreviation: 6mBP-4Cz2PPm), 2,4,6-tris (3'-(pyridin-3-yl)biphenyl-3-yl)-1,3,5-triazine (abbreviation: TmPPPyTz), 2,4,6-tris(2-pyridyl)-1,3,5-triazine (abbreviation: 2Py3Tz), and 2-[3-(2,6-dimethyl-3-pyridyl)-5-(9-phenanthryl)phenyl)-4,6-diphenyl-1,3,5-triazine (abbreviation: mPn-mDMePyPTzn).

Specific examples of the above-described heteroaromatic compound having a fused ring structure including a six-membered ring structure as a part (e.g., a quinoline skeleton, a benzoquinoline skeleton, a quinoxaline skeleton, a dibenzoquinoxaline skeleton, or a phenanthroline skeleton) include bathophenanthroline (abbreviation: Bphen), bathocuproine (abbreviation: BCP), 2,9-di(2-naphthyl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), and 2mpPCBPDBq.

For the electron-transport layer, any of the metal complexes given below as well as the heteroaromatic compounds given above can be used. Examples of the metal complexes include a metal complex having a quinoline skeleton or a benzoquinoline skeleton, such as tris(8-quinolinolato)aluminum(III) (abbreviation: $Alq_3$), $Almq_3$, 8-quinolinolato-lithium(I) (abbreviation: Liq), $BeBq_2$, bis(2-methyl-8-quinolinolato)(4-phenylphenolato)aluminum(III) (abbreviation: BAlq), or bis(8-quinolinolato)zinc(II) (abbreviation: Znq), and a metal complex having an oxazole skeleton or a thiazole skeleton, such as bis[2-(2-benzoxazolyl)phenolato]zinc(II) (abbreviation: ZnPBO) or bis[2-(2-benzothiazolyl)phenolato]zinc(II) (abbreviation: ZnBTZ).

Furthermore, a high molecular compound such as poly (2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used as the electron-transport material.

<Electron-Injection Layer>

The electron-injection layers (115, 115*a*, and 115*b*) are each a layer containing a substance having a high electron-injection property. The electron-injection layers (115, 115*a*, and 115*b*) are each a layer for increasing the efficiency of electron injection from the second electrode 102 and is preferably formed using a material whose energy value at the LUMO level has a small difference (0.5 eV or less) from the work function value of the material used for the second electrode 102. Thus, the electron-injection layers (115, 115*a*, and 115*b*) can be formed using an alkali metal, an alkaline earth metal, or a compound thereof, such as lithium, cesium, lithium fluoride (LiF), cesium fluoride (CsF), calcium fluoride ($CaF_2$), 8-quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate. A rare earth metal compound like erbium fluoride ($ErF_3$) or ytterbium (Yb) can also be used. Electride may also be used for the electron-injection layers (115, 115*a*, and 115*b*). Examples of the electride include a substance in which electrons are added at high concentration to a mixed oxide of calcium and aluminum. Note that any of the substances used in the electron-transport layers (114, 114*a*, and 114*b*), which are given above, can also be used.

A composite material in which an organic compound and an electron donor (donor) are mixed may also be used in the electron-injection layers (115, 115*a*, and 115*b*). Such a composite material is excellent in an electron-injection property and an electron-transport property because electrons are generated in the organic compound by the electron donor. In this case, the organic compound is preferably a material excellent in transporting the generated electrons; specifically, for example, the above-mentioned electron-transport materials (metal complexes, heteroaromatic compounds, or the like) used in the electron-transport layers (114, 114*a*, and 114*b*) can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given as examples. In addition, an alkali metal oxide and an alkaline earth metal oxide are preferable, and lithium oxide, calcium oxide, barium oxide, and the like are given as examples. A Lewis base such as magnesium oxide can be used. Furthermore, an organic compound such as tetrathiafulvalene (abbreviation: TTF) can be used. Alternatively, a stack of these materials may be used.

Moreover, a composite material in which an organic compound and a metal are mixed may also be used in the electron-injection layers (115, 115*a*, and 115*b*). The organic compound used here preferably has a LUMO level higher than or equal to −3.6 eV and lower than or equal to −2.3 eV. Moreover, a material having an unshared electron pair is preferable.

Thus, as the organic compound used in the above composite material, a composite material obtained by mixing a metal and the heteroaromatic compound given above as the material that can be used for the electron-transport layer may be used. Preferred examples of the heteroaromatic compound include materials having an unshared electron pair, such as a heteroaromatic compound having a five-membered ring structure (e.g., an imidazole skeleton, a triazole skeleton, an oxazole skeleton, an oxadiazole skeleton, a thiazole skeleton, or a benzimidazole skeleton), a heteroaromatic compound having a six-membered ring structure (e.g., a pyridine skeleton, a diazine skeleton (including a pyrimidine skeleton, a pyrazine skeleton, a pyridazine skeleton, and the like), a triazine skeleton, a bipyridine skeleton, or a terpyridine skeleton), and a heteroaromatic compound having a fused ring structure including a six-membered ring structure as a part (e.g., a quinoline skeleton, a benzoquinoline skeleton, a quinoxaline skeleton, a dibenzoquinoxaline skeleton, or a phenanthroline skeleton). Since the materials are specifically described above, description thereof is omitted here.

As the metal used for the above composite material, a transition metal that belongs to Group 5, Group 7, Group 9, or Group 11 in the periodic table or a material that belongs to Group 13 is preferably used, and Ag, Cu, Al, In, and the like can be given as examples. In this case, the organic compound forms a singly occupied molecular orbital (SOMO) with the transition metal.

Note that in the case where light obtained from the light-emitting layer 113*b* is amplified, for example, formation is preferably performed such that the optical path length between the second electrode 102 and the light-emitting layer 113*b* is less than one fourth of the wavelength k of light emitted from the light-emitting layer 113*b*. In that case, the optical path length can be adjusted by changing the thickness of the electron-transport layer 114*b* or the electron-injection layer 115*b*.

When the charge-generation layer 106 is provided between two EL layers (103*a* and 103*b*) as in the light-emitting device illustrated in FIG. 2D, a structure in which a plurality of EL layers are stacked between the pair of electrodes (also referred to as a tandem structure) can be employed.

<Charge-Generation Layer>

The charge-generation layer 106 has a function of injecting electrons into the EL layer 103*a* and injecting holes into the EL layer 103*b* when a voltage is applied between the first electrode (anode) 101 and the second electrode (cathode) 102. The charge-generation layer 106 may have either a structure in which an electron acceptor (acceptor) is added to a hole-transport material (also referred to as a P-type layer) or a structure in which an electron donor (donor) is added to an electron-transport material (also referred to as an electron-injection buffer layer). Alternatively, both of these structures may be stacked. Furthermore, an electron-relay layer may be provided between the P-type layer and the electron-injection buffer layer. Note that forming the charge-generation layer 106 with the use of any of the above materials can inhibit an increase in drive voltage in the case where the EL layers are stacked.

In the case where the charge-generation layer 106 has a structure in which an electron acceptor is added to a hole-transport material that is an organic compound (a P-type layer), any of the materials described in this embodiment can be used as the hole-transport material. As examples of the electron acceptor, 7,7,8,8-tetracyano-2,3,5,6-tetrafluoroquinodimethane (abbreviation: F4-TCNQ), chloranil, and the like can be given. Other examples include oxides of metals belonging to Group 4 to Group 8 of the periodic table. Specific examples include vanadium oxide, niobium oxide, tantalum oxide, chromium oxide, molybdenum oxide, tungsten oxide, manganese oxide, and rhenium oxide. Any of the above-described acceptor materials may be used. Furthermore, a mixed film obtained by mixing materials of the P-type layer or a stack of single films containing the respective materials may be used.

In the case where the charge-generation layer 106 has a structure in which an electron donor is added to an electron-transport material (an electron-injection buffer layer), any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, lithium (Li), cesium (Cs), magnesium (Mg), calcium (Ca), ytterbium (Yb), indium (In), lithium oxide (LizO), cesium carbonate ($Cs_2CO_3$), or the like is preferably used. An organic compound such as tetrathianaphthacene may be used as the electron donor.

When an electron-relay layer is provided between a P-type layer and an electron-injection buffer layer in the charge-generation layer 106, the electron-relay layer contains at least a substance having an electron-transport property and has a function of preventing an interaction between the electron-injection buffer layer and the P-type layer and transferring electrons smoothly. The LUMO level of the substance having an electron-transport property in the electron-relay layer is preferably between the LUMO level of the acceptor substance in the P-type layer and the LUMO level of the substance having an electron-transport property in the electron-transport layer in contact with the charge-generation layer 106. A specific energy level of the LUMO level of the substance having an electron-transport property in the electron-relay layer is preferably higher than or equal to −5.0 eV, further preferably higher than or equal to −5.0 eV and lower than or equal to −3.0 eV. Note that as the substance having an electron-transport property in the electron-relay layer, a phthalocyanine-based material or a metal complex having a metal-oxygen bond and an aromatic ligand is preferably used.

Although FIG. 2D illustrates the structure in which two of the EL layers 103 are stacked, three or more EL layers may be stacked with a charge-generation layer provided between different EL layers. FIG. 2E illustrates a structure in which three EL layers (the EL layer 103*a*, the EL layer 103*b*, and an EL layer 103*c*) are stacked with two charge-generation layers (the charge-generation layer 106*a* and the charge-generation layer 106*b*) positioned therebetween.

<Substrate>

The light-emitting device described in this embodiment can be formed over any of a variety of substrates. Note that the type of the substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, a laminate film, paper including a fibrous material, and a base material film.

Note that examples of the glass substrate include barium borosilicate glass, aluminoborosilicate glass, and soda lime glass. Examples of the flexible substrate, the attachment film, and the base material film include plastics typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper.

For fabrication of the light-emitting device in this embodiment, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the layers (the hole-injection layers (111, 111*a*, and 111*b*), the hole-transport layers (112, 112*a*, and 112*b*), the light-emitting layers (113, 113*a*, 113*b*, and 113*c*), the electron-transport layers (114, 114*a*, and 114*b*), and the electron-injection layers (115, 115*a*, and 115*b*)) having a variety of functions and included in the EL layers and the charge-generation layers (106, 106*a*, and 106*b*) in the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

In the case where a film formation method such as the coating method or the printing method is employed, a high molecular compound (e.g., an oligomer, a dendrimer, or a polymer), a middle molecular compound (a compound between a low molecular compound and a high molecular compound, with a molecular weight of 400 to 4000), an inorganic compound (e.g., a quantum dot material), or the like can be used. Note that as the quantum dot material, a colloidal quantum dot material, an alloyed quantum dot material, a core-shell quantum dot material, a core quantum dot material, or the like can be used.

Note that materials that can be used for the layers (the hole-injection layers (111, 111*a*, and 111*b*), the hole-transport layers (112, 112*a*, and 112*b*), the light-emitting layers (113, 113*a*, 113*b*, and 113*c*), the electron-transport layers (114, 114*a*, and 114*b*), and the electron-injection layers (115, 115*a*, and 115*b*)) included in the EL layers (103, 103*a*, and 103*b*) and the charge-generation layers (106, 106*a*, and 106*b*) in the light-emitting device described in this embodiment are not limited to the materials shown in this embodiment, and other materials can also be used in combination as long as the functions of the layers are fulfilled.

The structures described in this embodiment can be used in an appropriate combination with any of the structures described in the other embodiments.

Embodiment 3

In this embodiment, specific structure examples and a manufacturing method of a light-emitting apparatus (also referred to as display panel) of one embodiment of the present invention will be described.

Structure Example 1 of Light-Emitting Apparatus 700

Figure 3A:
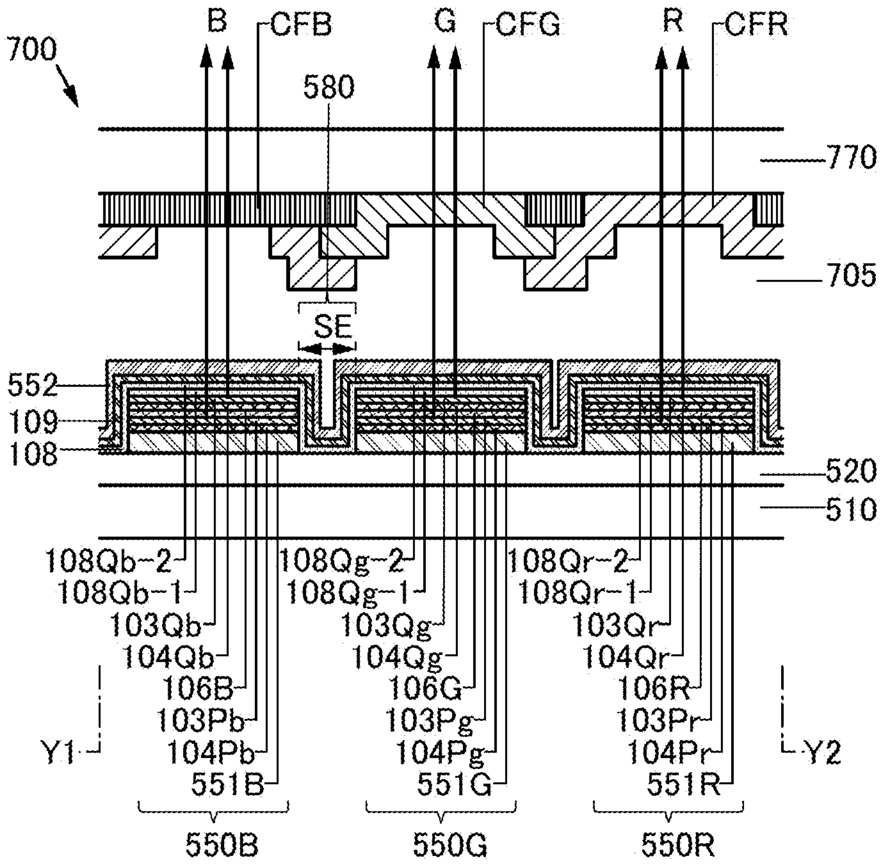
FIG. 3A and FIG. 3B are diagrams illustrating a light-emitting apparatus according to an embodiment.

A light-emitting apparatus 700 illustrated in FIG. 3A includes a light-emitting device 550B, a light-emitting device 550G, and a light-emitting device 550R. The light-emitting device 550B, the light-emitting device 550G, and the light-emitting device 550R are formed over a functional layer 520 provided over a first substrate 510. The functional layer 520 includes, for example, a driver circuit GD, a driver circuit SD, and the like that are composed of a plurality of transistors, and wirings that electrically connect these circuits. Note that these driver circuits are electrically connected to the light-emitting device 550B, the light-emitting device 550G, and the light-emitting device 550R, for example, to drive them. The driver circuit GD and the driver circuit SD will be described in Embodiment 4.

The light-emitting device 550B, the light-emitting device 550G, and the light-emitting device 550R each have the device structure described in Embodiment 2. Specifically, the case is described in which the light-emitting devices have the structure illustrated in FIG. 2B, i.e., the tandem structure.

Light-emitting layers in the light-emitting devices may have the same structure or different structures. To separately form the light-emitting layers in the light-emitting devices of different colors (e.g., blue (B), green (G), and red (R)), the later-described photolithography step is performed repeatedly for each light-emitting device. In this specification and the like, a structure in which light-emitting layers in light-emitting devices of different colors (e.g., blue (B), green (G), and red (R)) are separately formed or separately patterned may be referred to as an SBS (Side By Side) structure.

As shown in FIG. 3A, the light-emitting device 550B has a stacked-layer structure including an electrode 551B, an electrode 552, EL layers (103Pb and 103Qb), and a charge-generation layer 106B. Note that a specific structure of each layer is as described in Embodiment 2. The electrode 551B and the electrode 552 overlap with each other. The EL layer 103Pb and the EL layer 103Qb are stacked with the charge-generation layer 106B therebetween, and the EL layer 103Pb, the EL layer 103Qb, and the charge-generation layer 106B are positioned between the electrode 551B and the electrode 552. Note that each of the EL layers 103Pb and 103Qb has a stacked-layer structure of layers having different functions, including a light-emitting layer, like the EL layers 103, 103*a*, 103*b*, and 103*c* described in Embodiment 2. The EL layers 103Pb and 103Qb each include an electron-transport layer; specifically, the EL layer 103Qb includes an electron-transport layer having a stacked-layer structure (a first electron-transport layer 108Qb-1 and a second electron-transport layer 108Qb-2). Note that the first electron-transport layer 108Qb-1 is a layer formed using either a heteroaromatic compound and an organic compound or a plurality of kinds of heteroaromatic compounds (the first electron-transport layer 108Qb-1 is preferably a layer composed of a mixed film of these compounds) as described in Embodiment 1. The second electron-transport layer 108Qb-2 is formed using an electron-transport material and may be a layer formed using one kind of heteroaromatic compound, a layer formed using one kind of organic compound, a layer formed using an organic compound and a heteroaromatic compound, or a layer containing an organic substance and a plurality of kinds of heteroaromatic compounds. A structure may be employed in which, for example, the EL layer 103Pb is capable of emitting blue light and the EL layer 103Qb is capable of emitting yellow light. For another example, a structure can be employed in which the EL layer 103Pb is capable of emitting blue light and the EL layer 103Qb is also capable of emitting blue light.

A region of a second electron-transport layer 108 that constitutes the light-emitting device 550B is sometimes referred to as the second electron-transport layer 108Qb-2. Likewise, a region of the second electron-transport layer 108 that constitutes the light-emitting device 550G is sometimes referred to as a second electron-transport layer 108Qg-2, and a region of the second electron-transport layer 108 that constitutes the light-emitting device 550R is sometimes referred to as a second electron-transport layer 108Qr-2.

In FIG. 3A, only a hole-injection/transport layer 104Pb is illustrated as layers included in the EL layer 103Pb, and only a hole-injection/transport layer 104Qb, the electron-transport layers (the first electron-transport layer 108Qb-1 and the second electron-transport layer 108Qb-2), and an electron-injection layer 109 are illustrated as layers included in the EL layer 103Qb. Thus, in the following description, the EL layer (the EL layer 103Pb or the EL layer 103Qb) is used for convenience to describe the layers included in the EL layer as well. Among the electron-transport layers (the first electron-transport layer 108Qb-1 and the second electron-transport layer 108Qb-2), the first electron-transport layer 108Qb-1 formed in contact with the light-emitting layer may have a function of blocking holes that move from the anode side to the cathode side through the light-emitting layer. The electron-injection layer 109 may have a stacked-layer structure in which some or all of layers are formed using different materials.

Among the electron-transport layers (the first electron-transport layer 108Qb-1 and the second electron-transport layer 108Qb-2), the second electron-transport layer 108Qb-2 is formed after the removal of a sacrificial layer formed over part (in this embodiment, the formed layers up to the first electron-transport layer 108Qb-1 over the light-emitting layer) of the EL layer 103Qb over the electrode 551B as illustrated in FIG. 3A. Thus, the second electron-transport layer 108Qb-2 is formed in contact with the side surfaces (or the end portions) of part (the above) of the EL layer 103Qb, the EL layer 103Pb, and the charge-generation layer 106B. Accordingly, it is possible to inhibit entry of oxygen, moisture, or constituent elements thereof into the inside through the side surfaces of the EL layer 103Pb, the EL layer 103Qb, and the charge-generation layer 106B. The second electron-transport layer 108Qb-2 can be formed using one or more kinds of electron-transport materials. An insulating layer may be formed before the removal of the above sacrificial layer and then, the sacrificial layer may be removed, in which case the insulating layer is formed in contact with the side surfaces (or end portions) of part (the above) of the EL layer 103Qb, the EL layer 103Pb, and the charge-generation layer 106B. In other words, the second electron-transport layer 108Qb-2 may be formed after the formation of the insulating layer. As a material used for the insulating layer, aluminum oxide, magnesium oxide, hafnium oxide, gallium oxide, indium gallium zinc oxide, silicon nitride, silicon nitride oxide, or the like can be used, for example. The insulating layer can be formed by a sputtering method, a CVD method, an MBE method, a PLD method, an ALD method, or the like and is formed preferably by an ALD method, which enables favorable coverage.

The electron-injection layer 109 is formed to cover part (the above) of the EL layer 103Qb. The electron-injection layer 109 preferably has a stacked-layer structure of two or more layers having different electric resistances. For example, the electron-injection layer 109 may have one of the following structures: a structure in which a first layer in contact with the second electron-transport layer 108Qb-2 is formed using only an electron-transport material, and a second layer formed using an electron-transport material containing a metal material is stacked over the first layer; and the aforementioned structure including a third layer formed using an electron-transport material containing a metal material, between the first layer and the second electron-transport layer 108Qb-2.

The electrode 552 is formed over the electron-injection layer 109. Note that the electrode 551B and the electrode 552 have an overlap region. The EL layer 103Pb, the EL layer 103Qb, and the charge-generation layer 106B are positioned between the electrode 551B and the electrode 552. Thus, the electron-injection layer 109 is in contact with the side surfaces (or end portions) of the EL layer 103Qb, the EL layer 103Pb, and the charge-generation layer 106B with the second electron-transport layer 108Qb-2 (in the case where the above insulating layer is also formed, the second electron-transport layer 108Qb-2 and the insulating layer) therebetween, or the electrode 552 is in contact with the side surfaces (or end portions) of the EL layer 103Qb, the EL layer 103Pb, and the charge-generation layer 106B with the electron-injection layer 109 and the second electron-transport layer 108Qb-2 therebetween. Consequently, the EL layer 103Pb and the electrode 552, specifically the hole-injection/transport layer 104Pb in the EL layer 103Pb and the electrode 552 or the EL layer 103Qb and the electrode 552, more specifically the hole-injection/transport layer 104Qb in the EL layer 103Qb and the electrode 552 or the charge-generation layer 106B and the electrode 552 can be prevented from being electrically short-circuited.

As shown in FIG. 3A, the light-emitting device 550G has a stacked-layer structure including an electrode 551G, the electrode 552, EL layers (103Pg and 103Qg), and a charge-generation layer 106G. Note that a specific structure of each layer is as described in Embodiment 2. The electrode 551G and the electrode 552 overlap with each other. The EL layer 103Pg and the EL layer 103Qg are stacked with the charge-generation layer 106G therebetween, and the EL layer 103Pg, the EL layer 103Qg, and the charge-generation layer 106G are positioned between the electrode 551G and the electrode 552. Note that each of the EL layers 103Pg and 103Qg has a stacked-layer structure of layers having different functions, including a light-emitting layer, like the EL layers 103, 103*a*, 103*b*, and 103*c* described in Embodiment 2. The EL layers 103Pg and 103Qg each include an electron-transport layer; specifically, the EL layer 103Qg includes an electron-transport layer having a stacked-layer structure (a first electron-transport layer 108Qg-1 and the second electron-transport layer 108Qg-2). Note that the first electron-transport layer 108Qg-1 is a layer containing either a heteroaromatic compound and an organic compound or a plurality of kinds of heteroaromatic compounds (the first electron-transport layer 108Qg-1 is preferably a layer composed of a mixed film of these compounds) as described in Embodiment 1. The second electron-transport layer 108Qg-2 is formed using an electron-transport material and may be a layer formed using one kind of heteroaromatic compound, a layer formed using one kind of organic compound, a layer formed using an organic compound and a heteroaromatic compound, or a layer containing an organic substance and a plurality of kinds of heteroaromatic compounds. A structure may be employed in which, for example, the EL layer 103Pg is capable of emitting blue light and the EL layer 103Qg is capable of emitting yellow light. For another example, a structure can be employed in which the EL layer 103Pg is capable of emitting green light and the EL layer 103Qg is also capable of emitting green light.

In FIG. 3A, only a hole-injection/transport layer 104Pg is illustrated as layers included in the EL layer 103Pg, and only a hole-injection/transport layer 104Qg, the electron-transport layers (the first electron-transport layer 108Qg-1 and the second electron-transport layer 108Qg-2), and the electron-injection layer 109 are illustrated as layers included in the EL layer 103Qg. Thus, in the following description, the EL layer (the EL layer 103Pg or the EL layer 103Qg) is used for convenience to describe the layers included in the EL layer as well. Among the electron-transport layers (the first electron-transport layer 108Qg-1 and the second electron-transport layer 108Qg-2), the first electron-transport layer 108Qg-1 formed in contact with the light-emitting layer may have a function of blocking holes that move from the anode side to the cathode side through the light-emitting layer. The electron-injection layer 109 may have a stacked-layer structure in which some or all of layers are formed using different materials.

Among the electron-transport layers (the first electron-transport layer 108Qg-1 and the second electron-transport layer 108Qg-2), the second electron-transport layer 108Qg-2 is formed while a sacrificial layer formed over part (in this embodiment, the formed layers up to the first electron-transport layer 108Qg-1 over the light-emitting layer) of the EL layer 103Qg remains over the electrode 551G as illustrated in FIG. 3A. Thus, the second electron-transport layer 108Qg-2 is formed in contact with the side surfaces (or the end portions) of part (the above) of the EL layer 103Qg, the EL layer 103Pg, and the charge-generation layer 106G. Accordingly, it is possible to inhibit entry of oxygen, moisture, or constituent elements thereof into the inside through the side surfaces of the EL layer 103Pg, the EL layer 103Qg, and the charge-generation layer 106G. The second electron-transport layer 108Qg-2 can be formed using one or more kinds of electron-transport materials. An insulating layer may be formed before the removal of the above sacrificial layer and then, the sacrificial layer may be removed, in which case the insulating layer is formed in contact with the side surfaces (or end portions) of part (the above) of the EL layer 103Qg, the EL layer 103Pg, and the charge-generation layer 106G. In other words, the second electron-transport layer 108Qg-2 may be formed after the formation of the insulating layer. As a material used for the insulating layer, aluminum oxide, magnesium oxide, hafnium oxide, gallium oxide, indium gallium zinc oxide, silicon nitride, silicon nitride oxide, or the like can be used, for example. The insulating layer can be formed by a sputtering method, a CVD method, an MBE method, a PLD method, an ALD method, or the like and is formed preferably by an ALD method, which enables favorable coverage.

The electron-injection layer 109 is formed to cover part (the above) of the EL layer 103Qg. The electron-injection layer 109 preferably has a stacked-layer structure of two or more layers having different electric resistances. For example, the electron-injection layer 109 may have one of the following structures: a structure in which a first layer in contact with the second electron-transport layer 108Qg-2 is formed using only an electron-transport material, and a second layer formed using an electron-transport material containing a metal material is stacked over the first layer; and the aforementioned structure including a third layer formed using an electron-transport material containing a metal material, between the first layer and the second electron-transport layer 108Qg-2.

The electrode 552 is formed over the electron-injection layer 109. Note that the electrode 551G and the electrode 552 have an overlap region. The EL layer 103Pg, the EL layer 103Qg, and the charge-generation layer 106G are positioned between the electrode 551G and the electrode 552. Thus, the electron-injection layer 109 is in contact with the side surfaces (or end portions) of the EL layer 103Qg, the EL layer 103Pg, and the charge-generation layer 106G with the second electron-transport layer 108Qg-2 (in the case where the above insulating layer is also formed, the second electron-transport layer 108Qg-2 and the insulating layer) therebetween, or the electrode 552 is in contact with the side surfaces (or end portions) of the EL layer 103Qg, the EL layer 103Pg, and the charge-generation layer 106G with the electron-injection layer 109 and the second electron-transport layer 108Qg-2 therebetween. Consequently, the EL layer 103Pg and the electrode 552, specifically the hole-injection/transport layer 104Pg in the EL layer 103Pg and the electrode 552 or the EL layer 103Qg and the electrode 552, more specifically the hole-injection/transport layer 104Qg in the EL layer 103Qg and the electrode 552 or the charge-generation layer 106G and the electrode 552 can be prevented from being electrically short-circuited.

The light-emitting device 550R shown in FIG. 3A has a stacked-layer structure including an electrode 551R, the electrode 552, EL layers (103Pr and 103Qr), and a charge-generation layer 106R. Note that a specific structure of each layer is as described in Embodiment 2. The electrode 551R and the electrode 552 overlap with each other. The EL layer 103Pr and the EL layer 103Qr are stacked with the charge-generation layer 106R therebetween, and the EL layer 103Pr, the EL layer 103Qr, and the charge-generation layer 106R are positioned between the electrode 551R and the electrode 552. Note that each of the EL layers 103Pr and 103Qr has a stacked-layer structure of layers having different functions, including a light-emitting layer, like the EL layers 103, 103*a*, 103*b*, and 103*c* described in Embodiment 2. The EL layers 103Pr and 103Qr each include an electron-transport layer; specifically, the EL layer 103Qr includes an electron-transport layer having a stacked-layer structure (a first electron-transport layer 108Qr-1 and the second electron-transport layer 108Qr-2). Note that the first electron-transport layer 108Qr-1 is a layer containing either a heteroaromatic compound and an organic compound or a plurality of kinds of heteroaromatic compounds (the first electron-transport layer 108Qr-1 is preferably a layer composed of a mixed film of these compounds) as described in Embodiment 1. The second electron-transport layer 108Qr-2 is formed using an electron-transport material and may be a layer formed using one kind of heteroaromatic compound, a layer formed using one kind of organic compound, a layer formed using an organic compound and a heteroaromatic compound, or a layer containing an organic substance and a plurality of kinds of heteroaromatic compounds. A structure may be employed in which, for example, the EL layer 103Pr is capable of emitting blue light and the EL layer 103Qr is capable of emitting red light. For another example, a structure can be employed in which the EL layer 103Pr is capable of emitting red light and the EL layer 103Qr is also capable of emitting red light.

In FIG. 3A, only a hole-injection/transport layer 104Pr is illustrated as layers included in the EL layer 103Pr, and only a hole-injection/transport layer 104Qr, the electron-transport layers (the first electron-transport layer 108Qr-1 and the second electron-transport layer 108Qr-2), and the electron-injection layer 109 are illustrated as layers included in the EL layer 103Qr. Thus, in the following description, the EL layer (the EL layer 103Pr or the EL layer 103Qr) is used for convenience to describe the layers included in the EL layer as well. Among the electron-transport layers (the first electron-transport layer 108Qr-1 and the second electron-transport layer 108Qr-2), the first electron-transport layer 108Qr-1 formed in contact with the light-emitting layer may have a function of blocking holes that move from the anode side to the cathode side through the light-emitting layer. The electron-injection layer 109 may have a stacked-layer structure in which some or all of layers are formed using different materials.

Among the electron-transport layers (the first electron-transport layer 108Qr-1 and the second electron-transport layer 108Qr-2), the second electron-transport layer 108Qr-2 is formed while a sacrificial layer formed over part (in this embodiment, the formed layers up to the first electron-transport layer 108Qr-1 over the light-emitting layer) of the EL layer 103Qr remains over the electrode 551R as illustrated in FIG. 3A. Thus, the second electron-transport layer 108Qr-2 is formed in contact with the side surfaces (or the end portions) of part (the above) of the EL layer 103Qr, the EL layer 103Pr, and the charge-generation layer 106R. Accordingly, it is possible to inhibit entry of oxygen, moisture, or constituent elements thereof into the inside through the side surfaces of the EL layer 103Pr, the EL layer 103Qr, and the charge-generation layer 106R. The second electron-transport layer 108Qr-2 can be formed using one or more kinds of electron-transport materials. An insulating layer may be formed before the removal of the above sacrificial layer and then, the sacrificial layer may be removed, in which case the insulating layer is formed in contact with the side surfaces (or end portions) of part (the above) of the EL layer 103Qr, the EL layer 103Pr, and the charge-generation layer 106R. In other words, the second electron-transport layer 108Qr-2 may be formed after the formation of the insulating layer. As a material used for the insulating layer, aluminum oxide, magnesium oxide, hafnium oxide, gallium oxide, indium gallium zinc oxide, silicon nitride, silicon nitride oxide, or the like can be used, for example. The insulating layer can be formed by a sputtering method, a CVD method, an MBE method, a PLD method, an ALD method, or the like and is formed preferably by an ALD method, which enables favorable coverage.

The electron-injection layer 109 is formed to cover part (the above) of the EL layer 103Qr. The electron-injection layer 109 preferably has a stacked-layer structure of two or more layers having different electric resistances. For example, the electron-injection layer 109 may have one of the following structures: a structure in which a first layer in contact with the second electron-transport layer 108Qr-2 is formed using only an electron-transport material, and a second layer formed using an electron-transport material containing a metal material is stacked over the first layer; and the aforementioned structure including a third layer formed using an electron-transport material containing a metal material, between the first layer and the second electron-transport layer 108Qr-2.

The electrode 552 is formed over the electron-injection layer 109. Note that the electrode 551R and the electrode 552 have an overlap region. The EL layer 103Pr, the EL layer 103Qr, and the charge-generation layer 106R are positioned between the electrode 551R and the electrode 552. Thus, the electron-injection layer 109 is in contact with the side surfaces (or end portions) of the EL layer 103Qr, the EL layer 103Pr, and the charge-generation layer 106R with the second electron-transport layer 108Qr-2 (in the case where the above insulating layer is also formed, the second electron-transport layer 108Qr-2 and the insulating layer) therebetween, or the electrode 552 is in contact with the side surfaces (or end portions) of the EL layer 103Qr, the EL layer 103Pr, and the charge-generation layer 106R with the electron-injection layer 109 and the second electron-transport layer 108Qr-2 therebetween. Consequently, the EL layer 103Pr and the electrode 552, specifically the hole-injection/transport layer 104Pr in the EL layer 103Pr and the electrode 552 or the EL layer 103Qr and the electrode 552, more specifically the hole-injection/transport layer 104Qr in the EL layer 103Qr and the electrode 552 or the charge-generation layer 106R and the electrode 552 can be prevented from being electrically short-circuited.

The EL layers (103Pb, 103Pg, 103Pr, 103Qb, 103Qg, and 103Qr) and the charge-generation layer 106R included in the light-emitting devices are processed to be separated between the light-emitting devices by patterning using a photolithography method; thus, the end portions (side surfaces) of the processed EL layers have substantially the same surface (or are positioned on substantially the same plane).

The EL layers (103Pb, 103Pg, 103Pr, 103Qb, 103Qg, and 103Qr) and the charge-generation layer 106R are provided with a space 580 between one light-emitting device and the adjacent light-emitting device. When the space 580 is denoted by a distance SE between the EL layers in the adjacent light-emitting devices, decreasing the distance SE can increase the aperture ratio and resolution. By contrast, as the distance SE increases, the effect of the difference in the fabrication process between the adjacent light-emitting devices becomes permissible, which leads to an increase in manufacturing yield. Since the light-emitting device fabricated according to this specification is suitable for a miniaturization process, the distance SE between the EL layers in the adjacent light-emitting devices can be longer than or equal to 0.5 μm and shorter than or equal to 5 μm, preferably longer than or equal to 1 μm and shorter than or equal to 3 μm, further preferably longer than or equal to 1 μm and shorter than or equal to 2.5 μm, and still further preferably longer than or equal to 1 μm and shorter than or equal to 2 μm. Typically, the distance SE is preferably longer than or equal to 1 μm and shorter than or equal to 2 μm (e.g., 1.5 μm or a neighborhood thereof).

The hole-injection layers included in the hole-transport regions in the EL layers (103Pb, 103Pg, 103Pr, 103Qb, 103Qg, and 103Qr) and the charge-generation layer 106R often have high conductivity; therefore, these layers formed as layers shared by adjacent light-emitting devices might cause crosstalk. Thus, providing the space 580 as shown in this structure example can suppress occurrence of crosstalk between adjacent light-emitting devices.

When electrical conduction is established between the EL layers (103Pb and 103Qb), the EL layers (103Pg and 103Qg), and the EL layers (103Pr and 103Qr) in a light-emitting apparatus (display panel) with a high resolution exceeding 1000 ppi, a crosstalk phenomenon occurs, resulting in a narrower color gamut that the light-emitting apparatus is capable of reproducing. Providing the space 580 in a display panel with a high resolution exceeding 1000 ppi, preferably a display panel with a high resolution exceeding 2000 ppi, or further preferably a display panel with an ultrahigh resolution exceeding 5000 ppi allows the display panel to express vivid colors.

In this structure example, either a structure in which the light-emitting device 550B emits blue light, the light-emitting device 550G emits green light, and the light-emitting device 550R emits red light or a structure in which each of the light-emitting devices emits white light can be employed. In this specification and the like, a light-emitting device capable of emitting white light may be referred to as a white-light-emitting device. A combination of white-light-emitting devices with coloring layers (e.g., color filters) enables a full-color display apparatus. Accordingly, a second substrate 770 includes a coloring layer CFB, a coloring layer CFG, and a coloring layer CFR. Note that these coloring layers may be provided to partly overlap with each other as illustrated in FIG. 3A. When the coloring layers are provided to partly overlap with each other, the overlap portion can function as a light-blocking film. In this structure example, a material that preferentially transmits blue light (B) is used for the coloring layer CFB, a material that preferentially transmits green light (G) is used for the coloring layer CFG, and a material that preferentially transmits red light (R) is used for the coloring layer CFR, for example.

Figure 3B:
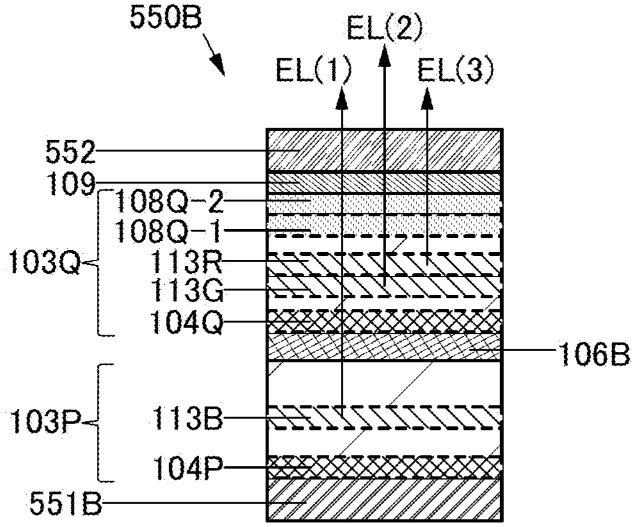

FIG. 3B illustrates a structure of the light-emitting device 550B of the case where each of the light-emitting device 550B, the light-emitting device 550G, and the light-emitting device 550R (illustrated as a light-emitting device 550 collectively) is a white-light-emitting device. An EL layer 103P and an EL layer 103Q are stacked over the electrode 551B, with the charge-generation layer 106B between the EL layers. The EL layer 103P includes a light-emitting layer 113B that emits blue light EL(1), and the EL layer 103Q includes a light-emitting layer 113G that emits green light EL(2), a light-emitting layer 113R that emits red light EL(3), a hole-injection/transport layer 104Q, and electron-transport layers (a first electron-transport layer 108Q-1 and a second electron-transport layer 108Q-2).

Note that a color conversion layer can be used instead of the coloring layer. For example, nanoparticles, quantum dots, or the like can be used for the color conversion layer.

For example, a color conversion layer that converts blue light into green light can be used instead of the coloring layer CFG. In that case, blue light emitted from the light-emitting device 550G can be converted into green light. Moreover, a color conversion layer that converts blue light into red light can be used instead of the coloring layer CFR. In that case, blue light emitted from the light-emitting device 550R can be converted into red light.

Structure Example 2 of Light-Emitting Apparatus 700

Figure 4:
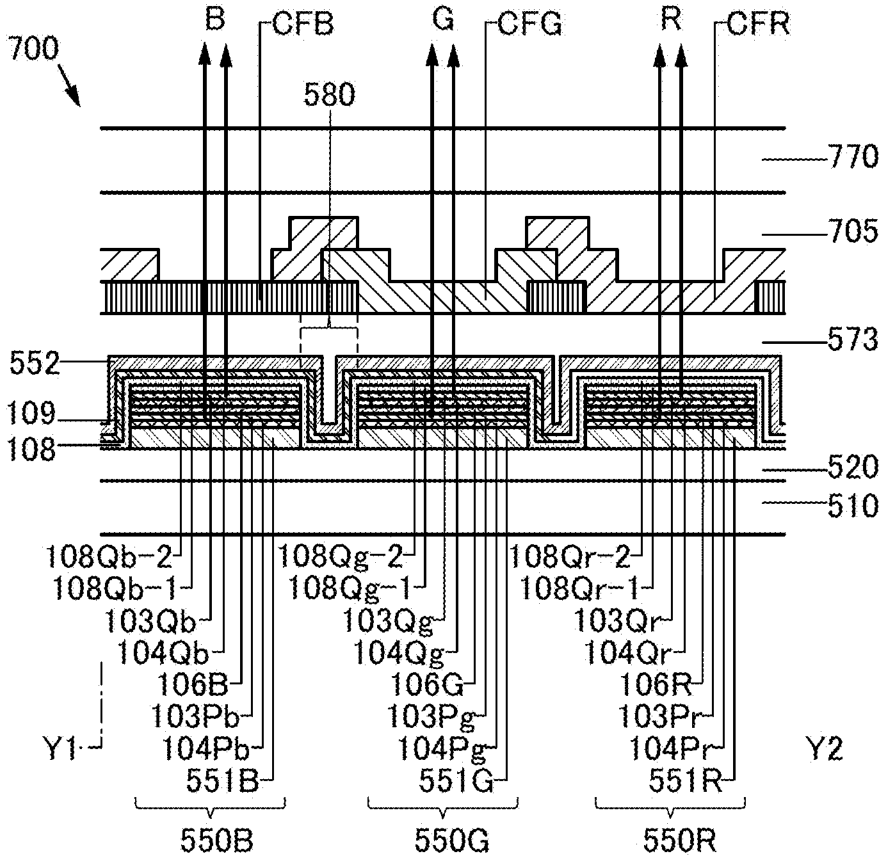
FIG. 4 is a diagram illustrating a method for manufacturing a light-emitting apparatus according to an embodiment.

The light-emitting apparatus (display panel) 700 illustrated in FIG. 4 includes the light-emitting device 550B, the light-emitting device 550G, and the light-emitting device 550R. The light-emitting device 550B, the light-emitting device 550G, and the light-emitting device 550R are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R, for example, to drive them. The driver circuit GD and the driver circuit SD will be described in Embodiment 4.

The light-emitting device 550B, the light-emitting device 550G, and the light-emitting device 550R each have the device structure described in Embodiment 2. Specifically, the case is described in which the light-emitting devices have the structure illustrated in FIG. 2B, i.e., the tandem structure.

Note that specific structures of the light-emitting devices illustrated in FIG. 4 are the same as the structures of the light-emitting device 550B, the light-emitting device 550G, and the light-emitting device 550R described with reference to FIG. 3B, and each of the light-emitting devices emits white light. Note that light-emitting layers in the light-emitting devices may have different structures; to separately form the light-emitting layers in the light-emitting devices of different colors (e.g., blue (B), green (G), and red (R)), the photolithography step described in the later-described manufacturing method is performed repeatedly for each light-emitting device.

The light-emitting apparatus in this structure example is different from the structure of the light-emitting apparatus illustrated in FIG. 3A in including the coloring layer CFB, the coloring layer CFG, and the coloring layer CFR formed over the light-emitting devices over the first substrate 510. In other words, an insulating layer 573 is provided over the electrode 552 of each light-emitting device formed over the first substrate 510, and the coloring layer CFB, the coloring layer CFG, and the coloring layer CFR are provided over the insulating layer 573.

An insulating layer 705 is provided over the coloring layer CFB, the coloring layer CFG, and the coloring layer CFR. The insulating layer 705 includes a region held between the second substrate 770 and the first substrate 510 on the coloring layer (CFB, CFG, and CFR) side of the first substrate 510, which is provided with the functional layer 520, the light-emitting devices (550B, 550G, and 550R), the coloring layer CFB, the coloring layer CFG, and the coloring layer CFR, and the insulating layer 705 has a function of attaching the first substrate 510 and the second substrate 770.

For the insulating layer 573 and the insulating layer 705, an inorganic material, an organic material, a composite material of an inorganic material and an organic material, or the like can be used.

An inorganic oxide film, an inorganic nitride film, an inorganic oxynitride film, or the like, or a stacked-layer material in which a plurality of films selected from these films are stacked can be used as the inorganic material. For example, a silicon oxide film, a silicon nitride film, a silicon oxynitride film, an aluminum oxide film, or the like, or a film including a stacked-layer material in which a plurality of films selected from these films are stacked can be used. Note that the silicon nitride film is a dense film and has an excellent function of inhibiting diffusion of impurities. Alternatively, for an oxide semiconductor (e.g., an IGZO film), a stacked-layer structure of an aluminum oxide film and an IGZO film over the aluminum oxide film, for example, can be used.

Polyester, polyolefin, polyamide, polyimide, polycarbonate, polysiloxane, acrylic, or the like, or a stacked-layer material, a composite material, or the like of a plurality of resins selected from these can be used for the organic material. Alternatively, one or more organic materials among a reactive curable adhesive, a photocurable adhesive, a thermosetting adhesive, an anaerobic adhesive, and the like can be used.

Manufacturing Method Example 1 of Light-Emitting Apparatus

Figure 5A:
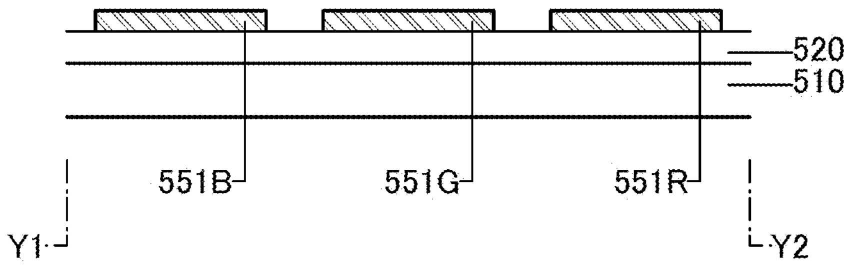
FIG. 5A and FIG. 5B are diagrams illustrating a method for manufacturing a light-emitting apparatus according to an embodiment.

The electrode 551B, the electrode 551G, and the electrode 551R are formed as illustrated in FIG. 5A. For example, a conductive film is formed over the functional layer 520 over the first substrate 510 and processed into predetermined shapes by a photolithography method.

The conductive film can be formed by a sputtering method, a chemical vapor deposition (CVD) method, a molecular beam epitaxy (MBE) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. An example of a thermal CVD method is a metal organic chemical vapor deposition (MOCVD: Metal Organic CVD) method.

The conductive film may be processed by a nanoimprinting method, a sandblasting method, a lift-off method, or the like as well as a photolithography method described above. Alternatively, island-shaped thin films may be directly formed by a film formation method using a shielding mask such as a metal mask. Here, "island shape" refers to a state in which layers formed using the same material in the same step are separated from each other when seen from above.

There are the following two typical examples of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development. The former method involves heat treatment steps such as heating after resist application (PAB: Pre Applied Bake) and heating after light exposure (PEB: Post Exposure Bake). In one embodiment of the present invention, a lithography method is used not only for processing of a conductive film but also for processing of a thin film used for formation of an EL layer (a film made of an organic compound or a film partly including an organic compound).

As the light used for light exposure in a photolithography method, for example, an i-line (wavelength: 365 nm), a g-line (wavelength: 436 nm), an h-line (wavelength: 405 nm), or combined light of any of them can be used. Alternatively, ultraviolet light, KrF laser light, ArF laser light, or the like can be used. Light exposure may be performed by liquid immersion exposure technique. As the light used for light exposure, extreme ultraviolet (EUV) light or X-rays may also be used. Instead of the light used for light exposure, an electron beam can be used. Extreme ultraviolet light, X-rays, or an electron beam is preferably used, in which case extremely minute processing can be performed. Note that a photomask is not needed when light exposure is performed by scanning with a beam such as an electron beam.

For etching of a thin film using a resist mask, a dry etching method, a wet etching method, a sandblast method, or the like can be used.

Figure 5B:
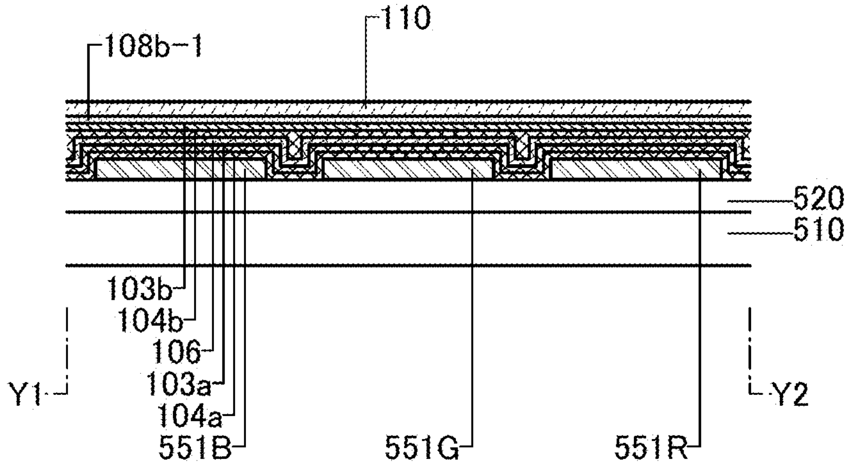

Next, as illustrated in FIG. 5B, over the electrodes (551B, 551G, and 551R) formed over the first substrate 510, the EL layer 103*a* (including the hole-injection/transport layer 104*a*), the charge-generation layer 106, and the EL layer 103*b* (including the hole-injection/transport layer 104*b* and the first electron-transport layer 108*b*-1) are formed so as to cover the electrodes.

Here, in the electron-transport layer with a stacked-layer structure (the first electron-transport layer 108*b*-1 and the second electron-transport layer 108*b*-2) included in the EL layer 103*b*, the first electron-transport layer 108*b*-1 is a layer formed using an organic compound and a heteroaromatic compound (the first electron-transport layer 108*b*-1 is preferably a layer composed of a mixed film of these compounds). The first electron-transport layer 108Qb-1 may be a layer formed using one kind of heteroaromatic compound or one kind of organic compound or a layer formed using an organic compound and a heteroaromatic compound. When the first electron-transport layer 108*b*-1 has such a structure, it is possible to inhibit thermal damage due to the temperature during the formation process of a sacrificial layer 110 formed in the manufacturing process after the formation of the first electron-transport layer 108*b*-1 and the curing temperature of a resist material used for patterning of the sacrificial layer 110. Since the specific structure of the mixed film used here is described in Embodiment 1, description thereof is omitted here.

Then, the sacrificial layer 110 is formed over the first electron-transport layer 108*b*-1 of the EL layer 103*b*.

As the sacrificial layer 110, it is possible to use a film highly resistant to etching treatment performed on the EL layer 103*b*, i.e., a film having high etching selectivity. The sacrificial layer 110 preferably has a stacked-layer structure of a first sacrificial layer and a second sacrificial layer which have different etching selectivities. Moreover, for the sacrificial layer 110, it is possible to use a film that can be removed by a wet etching method less likely to cause damage to the EL layer 103*b*. In wet etching, oxalic acid or the like can be used as an etching material.

The sacrificial layer 110 can be formed using an inorganic film such as a metal film, an alloy film, a metal oxide film, a semiconductor film, or an inorganic insulating film, for example. The sacrificial layer 110 can be formed by any of a variety of film formation methods such as a sputtering method, an evaporation method, a CVD method, and an ALD method.

For the sacrificial layer 110, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

The sacrificial layer 110 can be formed using a metal oxide such as indium gallium zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon, or the like can also be used.

Note that an oxide containing an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) instead of gallium can also be used. In particular, M is preferably one or more of gallium, aluminum, and yttrium.

For the sacrificial layer 110, an inorganic insulating material such as aluminum oxide, hafnium oxide, or silicon oxide can be used.

The sacrificial layer 110 is preferably formed using a material that can be dissolved in a solvent chemically stable with respect to at least the uppermost film of the EL layer 103*b* (the first electron-transport layer 108*b*-1). Specifically, a material that will be dissolved in water or alcohol can be suitably used for the sacrificial layer 110. In formation of the sacrificial layer 110, it is preferable that application of such a material dissolved in a solvent such as water or alcohol be performed by a wet film formation method and followed by heat treatment for evaporating the solvent. At this time, the heat treatment is preferably performed in a reduced-pressure atmosphere, in which case the solvent can be removed at a low temperature in a short time and thermal damage to the EL layer 103*b* can be reduced accordingly.

In the case where the sacrificial layer 110 having a stacked-layer structure is formed, the stacked-layer structure can include the first sacrificial layer formed using any of the above-described materials and the second sacrificial layer thereunder.

The second sacrificial layer in that case is a film used as a hard mask for etching of the first sacrificial layer. In processing the second sacrificial layer, the first sacrificial layer is exposed. Thus, a combination of films having high etching selectivity therebetween is selected for the first sacrificial layer and the second sacrificial layer. Thus, a film that can be used for the second sacrificial layer can be selected in accordance with the etching conditions of the first sacrificial layer and those of the second sacrificial layer.

For example, in the case where dry etching using a gas containing fluorine (also referred to as a fluorine-based gas) is performed for the etching of the second sacrificial layer, silicon, silicon nitride, silicon oxide, tungsten, titanium, molybdenum, tantalum, tantalum nitride, an alloy containing molybdenum and niobium, an alloy containing molybdenum and tungsten, or the like can be used for the second sacrificial layer. Here, a metal oxide film of IGZO, ITO, or the like is given as an example of a film having high etching selectivity (that is, enabling low etching rate) in dry etching using the fluorine-based gas, and such a film can be used as the first sacrificial layer.

Note that the material for the second sacrificial layer is not limited to the above and can be selected from a variety of materials in accordance with the etching conditions of the first sacrificial layer and those of the second sacrificial layer. For example, any of the films that can be used for the first sacrificial layer can be used.

As the second sacrificial layer, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, an oxide film can be used as the second sacrificial layer. Typically, an oxide film or an oxynitride film of silicon oxide, silicon oxynitride, aluminum oxide, aluminum oxynitride, hafnium oxide, hafnium oxynitride, or the like can also be used.

Figure 6A:
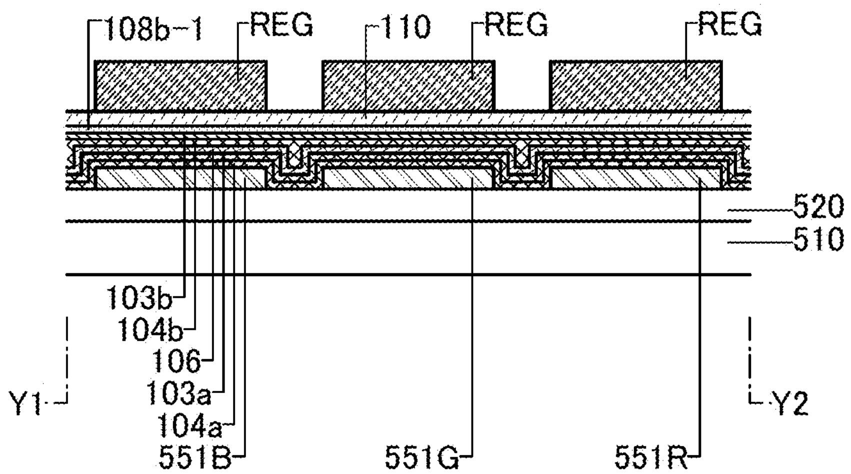
FIG. 6A to FIG. 6C are diagrams illustrating a method for manufacturing a light-emitting apparatus according to an embodiment.
Figure 6B:
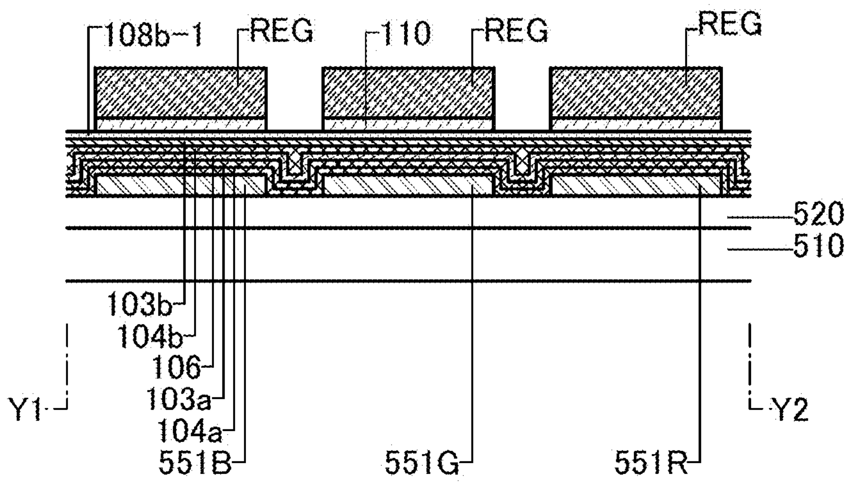

Then, as illustrated in FIG. 6A, resist masks REG are formed in the following manner: a resist is applied onto the sacrificial layer 110, and the resist in the regions of the sacrificial layer 110 which do not overlap with the electrode 551B, the electrode 551G, or the electrode 551R is removed, whereby the resist remains in the regions of the sacrificial layer 110 which overlap with the electrode 551B, the electrode 551G, and the electrode 551R. For example, the resist applied onto the sacrificial layer 110 is formed into desired shapes by a photolithography method. Then, part of the sacrificial layer 110 not covered with the thus formed resist masks REG are removed by etching (see FIG. 6B). After that, the resist masks REG are removed, and part of the EL layer 103*a* (including the hole-injection/transport layer 104*b*), part of the charge-generation layer 106, and part of the EL layer 103*b* (including the hole-injection/transport layer 104*b* and the first electron-transport layer 108*b*-1) which are not covered with the sacrificial layers are removed by etching, whereby the EL layer 103*a*, the charge-generation layer 106, and the EL layer 103*b* are processed to have side surfaces (or have their side surfaces exposed) or have a belt-like shape that extends in the direction intersecting the sheet of the diagram. Specifically, dry etching is performed with the use of the sacrificial layers 110 formed in patterns over the EL layer 103*b* (including the hole-injection/transport layer 104*b* and the first electron-transport layer 108*b*-1). Although not shown, in the case where the sacrificial layers 110 each have the stacked-layer structure of the first sacrificial layer and the second sacrificial layer, which are stacked from the first electron-transport layer 108*b*-1 side, the following process may be employed: part of the second sacrificial layer is etched with the use of the resist mask, the resist mask is then removed, part of the first sacrificial layer is etched with the use of the second sacrificial layer as a mask, and the EL layer 103Q (including the hole-injection/transport layer 104Q and the first electron-transport layer 108*b*-1), the charge-generation layer 106, and the EL layer 103P (including the hole-injection/transport layer 104P) are processed into a predetermined shape.

In the case of employing a method in which a resist is formed into a desired shape over the sacrificial layer 110 by a photolithography method as shown in FIG. 6A, heat treatment steps such as heating after resist application (PAB: Pre Applied Bake) and heating after light exposure (PEB: Post Exposure Bake) are involved. The PAB temperature reaches approximately 100° C. and the PEB temperature reaches approximately 120° C., for example. Therefore, the light-emitting device needs be resistant to such treatment temperatures. In the light-emitting device of one embodiment of the present invention, the high-heat-resistance layer including a heteroaromatic compound and an organic compound, in specific terms, which is described in Embodiment 1, is used and subjected to the photolithography treatment; thus, it is possible to obtain a light-emitting apparatus including the highly reliable light-emitting device which is less affected by the heat treatment.

Figure 6C:
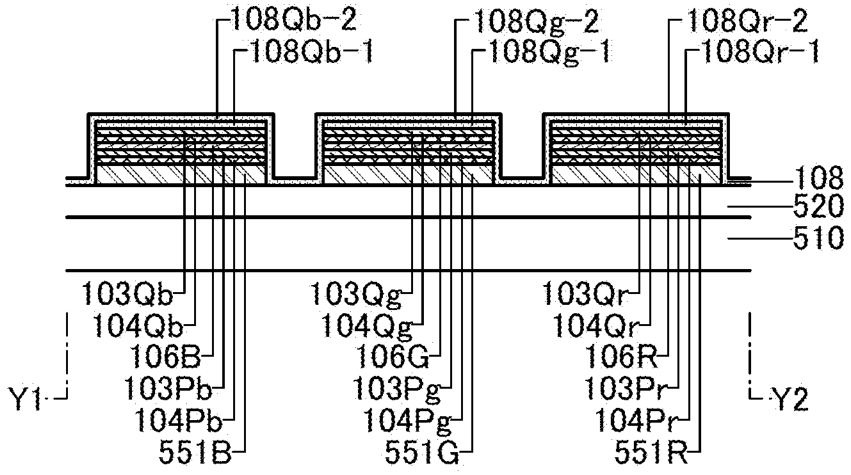

Next, the sacrificial layers 110 are removed and the second electron-transport layers (108Qb-2, 108Qg-2, and 108Qr-2) are formed over the first electron-transport layers (108Qb-1, 108Qg-1, and 108Qr-1) (see FIG. 6C). Note that the second electron-transport layers (108Qb-2, 108Qg-2, and 108Qr-2) are formed using an electron-transport material and may be a layer formed using one kind of heteroaromatic compound or a layer formed using a plurality of kinds of heteroaromatic compounds.

Figure 7A:
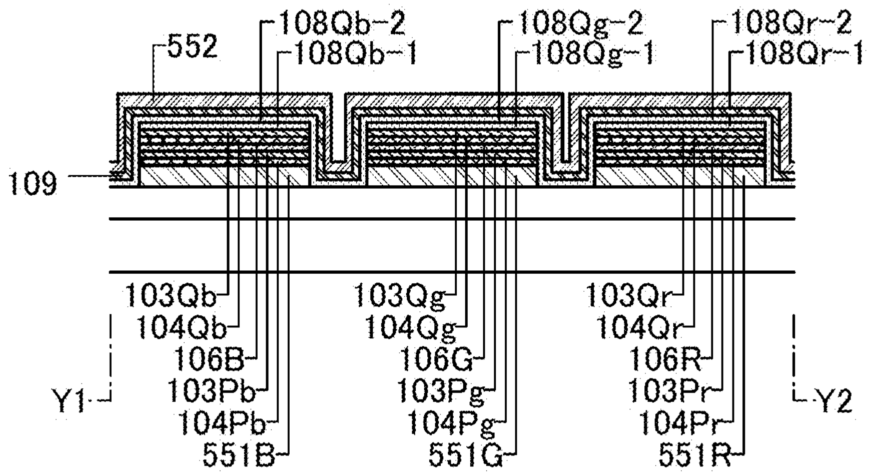
FIG. 7A and FIG. 7B are diagrams illustrating a method for manufacturing a light-emitting apparatus according to an embodiment.

In this case, the second electron-transport layers (108Qb-2, 108Qg-2, and 108Qr-2) are formed to be in contact with the side surfaces of the EL layers (103P and 103Q) as shown in FIG. 7A. Specifically, the second electron-transport layer 108Qb-2 is also formed on side surfaces that are exposed when the EL layer 103Pb (including the hole-injection/transport layer 104Pb and the light-emitting layer), the charge-generation layer 106B, and the EL layer 103Qb (including the hole-injection/transport layer 104Qb, the light-emitting layer, and the first electron-transport layer 108Qb-1) are processed by etching. Furthermore, the second electron-transport layer 108Qg-2 is also formed on side surfaces that are exposed when the EL layer 103Pg (including the hole-injection/transport layer 104Pg and the light-emitting layer), the charge-generation layer 106G, and the EL layer 103Qg (including the hole-injection/transport layer 104Qg, the light-emitting layer, and the first electron-transport layer 108Qg-1) are processed by etching. Furthermore, the second electron-transport layer 108Qr-2 is also formed on side surfaces that are exposed when the EL layer 103Pr (including the hole-injection/transport layer 104Pr and the light-emitting layer), the charge-generation layer 106R, and the EL layer 103Qr (including the hole-injection/transport layer 104Qr, the light-emitting layer, and the first electron-transport layer 108Qr-1) are processed by etching. This can inhibit entry of oxygen, moisture, or constituent elements thereof into the inside through the side surfaces of the EL layers (103P and 103Q).

Then, the electron-injection layer 109 is formed over the second electron-transport layers (108Qb-2, 108Qg-2, and 108Qr-2). The electron-injection layer 109 is formed by a vacuum evaporation method, for example.

The electron-injection layer 109 is in contact with the EL layers (103P and 103Q) and the charge-generation layers (106B, 106G, and 106R) with the second electron-transport layers (108Qb-2, 108Qg-2, and 108Qr-2) therebetween.

Next, the electrode 552 is formed over the electron-injection layer 109. The electrode 552 is formed by a vacuum evaporation method, for example. The electrode 552 is in contact with the side surfaces (or end portions) of the EL layers (103P and 103Q) and the charge-generation layers (106B, 106G, and 106R) with the electron-injection layer 109 and the second electron-transport layers (108Qb-2, 108Qg-2, and 108Qr-2) therebetween. Thus, the EL layers (103P and 103Q) and the electrode 552, specifically the hole-injection/transport layers (104Pb, 104Pg, 104Pr, 104Qb, 104Qg, and 104Qr) in the EL layers (103P and 103Q) and the electrode 552 can be prevented from being electrically short-circuited.

In the above manner, the EL layers 103P (including the hole-injection/transport layers (104Pb, 104Pg, and 104Pr)), the charge-generation layers (106B, 106G, and 106R), and the EL layers 103Q (including the hole-injection/transport layers (104Qb, 104Qg, and 104Qr) and the second electron-transport layers (108Qb-2, 108Qg-2, and 108Qr-2)) in the light-emitting device 550B, the light-emitting device 550G, and the light-emitting device 550R can be separately formed by one patterning using a photolithography method.

Figure 7B:
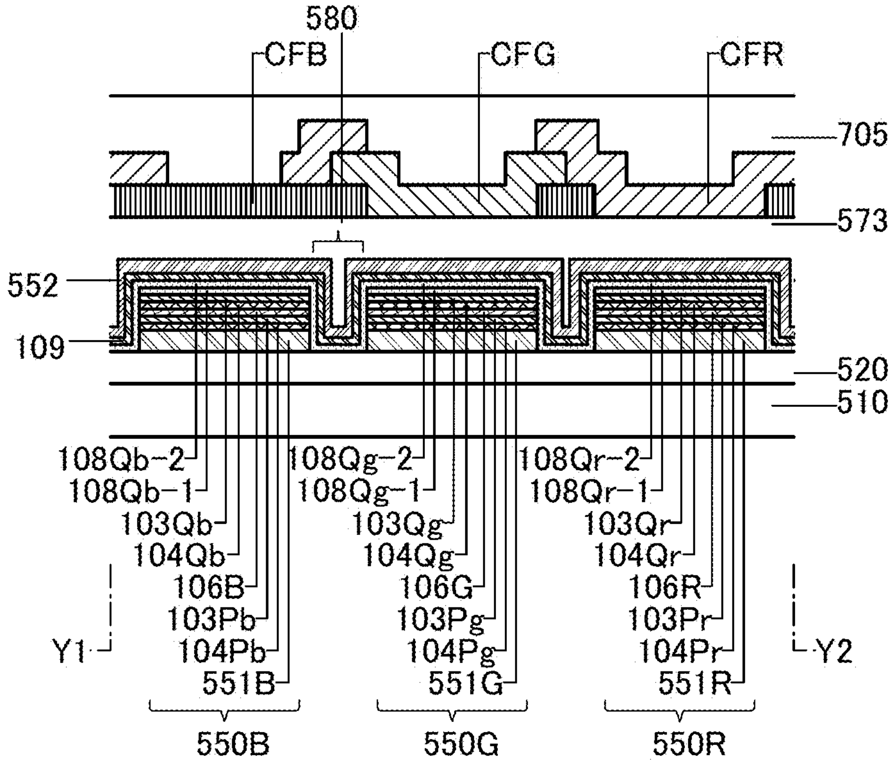

Next, the insulating layer 573, the coloring layer CFB, the coloring layer CFG, the coloring layer CFR, and the insulating layer 705 are formed (see FIG. 7B).

For example, the insulating layer 573 is formed by stacking a flat film and a dense film. Specifically, the flat film is formed by a coating method, and the dense film is stacked over the flat film by a chemical vapor deposition method, an atomic layer deposition (ALD) method, or the like. Thus, the insulating layer 573 with high quality and less defects can be formed.

For example, with use of a color resist, the coloring layer CFB, the coloring layer CFG, and the coloring layer CFR are formed into a predetermined shape. Note that processing is performed such that the coloring layer CFR and the coloring layer CFB overlap with each other over the space 580. Thus, a phenomenon of entrance of light emitted from an adjacent light-emitting device can be inhibited.

An inorganic material, an organic material, a composite material of an inorganic material and an organic material, or the like can be used for the insulating layer 705.

The EL layers (103P and 103Q) and the charge-generation layers (106B, 106G, and 106R) included in the light-emitting devices are processed to be separated between the light-emitting devices by patterning using a photolithography method; thus, a high-resolution light-emitting apparatus (display panel) can be fabricated. The end portions (side surfaces) of the EL layers processed by patterning using a photolithography method have substantially the same surface (or are positioned on substantially the same plane).

The hole-injection layers included in the hole-transport regions in the EL layers (103P and 103Q) and the charge-generation layers (106B, 106G, and 106R) often have high conductivity; therefore, these layers formed as layers shared by adjacent light-emitting devices might cause crosstalk. Therefore, processing the EL layers to be separated by patterning using a photolithography method as shown in this structure example can suppress occurrence of crosstalk between adjacent light-emitting devices.

Structure Example 3 of Light-Emitting Apparatus 700

Figure 8:
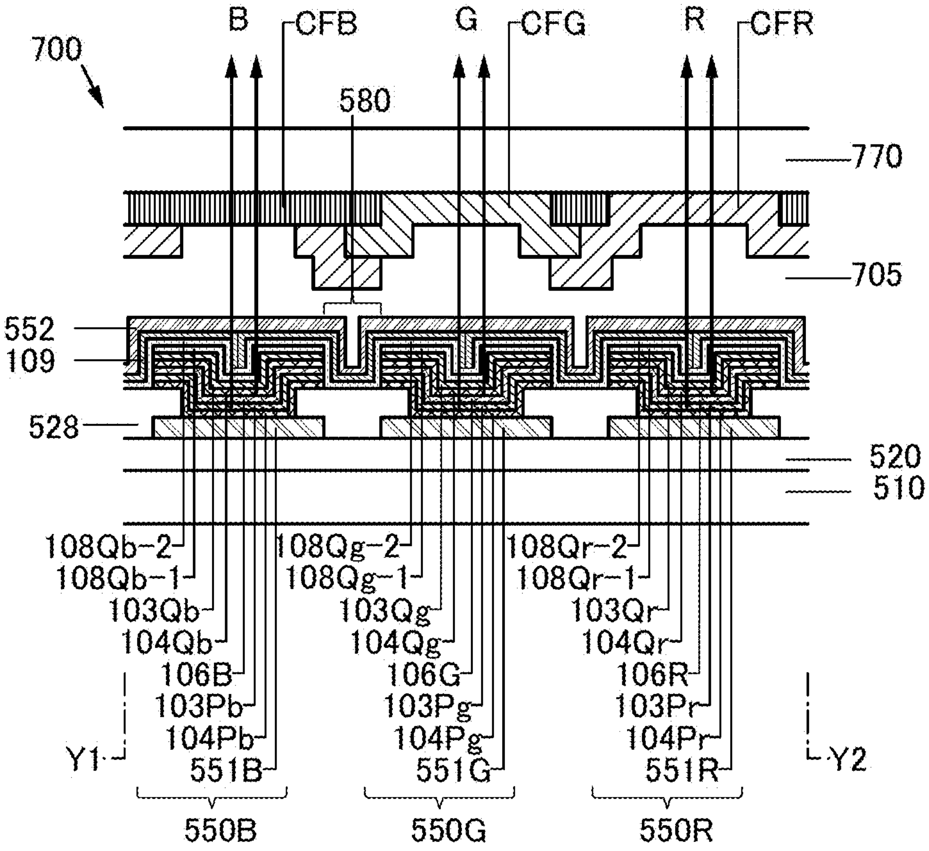
FIG. 8 is a diagram illustrating a light-emitting apparatus according to an embodiment.

The light-emitting apparatus (display panel) 700 illustrated in FIG. 8 includes the light-emitting device 550B, the light-emitting device 550G, and the light-emitting device 550R. The light-emitting device 550B, the light-emitting device 550G, and the light-emitting device 550R are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R, for example, to drive them. The driver circuit GD and the driver circuit SD will be described in Embodiment 4.

The light-emitting device 550B, the light-emitting device 550G, and the light-emitting device 550R each have the device structure described in Embodiment 2. Specifically, the case is described in which the light-emitting devices have the structure illustrated in FIG. 2B, i.e., the tandem structure.

Note that specific structures of the light-emitting devices illustrated in FIG. 8 are the same as the structures of the light-emitting device 550B, the light-emitting device 550G, and the light-emitting device 550R described with reference to FIG. 3B, and each of the light-emitting devices emits white light. Note that light-emitting layers in the light-emitting devices may have different structures; to separately form the light-emitting layers in the light-emitting devices of different colors (e.g., blue (B), green (G), and red (R)), the photolithography step described in the later-described manufacturing method is performed repeatedly for each light-emitting device.

As illustrated in FIG. 8, a partition 528 is provided between the light-emitting devices, for example, between the electrode 551B and the electrode 551G. Thus, the second electron-transport layers (108Qb-2, 108Qg-2, and 108Qr-2) are formed over the partition 528.

An insulating layer may be formed in the space 580 over the partition 528 by a sputtering method, a CVD method, an MBE method, a PLD method, an ALD method, or the like after the EL layers (103Pb, 103Pg, and 103Pr), the charge-generation layers (106B, 106G, and 106R), and the layers up to the first electron-transport layers (108Qb-1, 108Qg-1, and 108Qr-1) in the EL layers (103Qb, 103Qg, and 103Qr) are formed by patterning using a photolithography method and these layers are separately formed. Among the above methods, an ALD method, which enables favorable coverage, is further preferable. Furthermore, the second electron-transport layers (108Qb-2, 108Qg-2, and 108Qr-2) and the electron-injection layer 109 included in the EL layers (103Qb, 103Qg, and 103Qr) are formed, and the electrode 552 can be formed thereover.

The EL layers (103P and 103Q) and the charge-generation layers (106B, 106G, and 106R) included in the light-emitting devices are processed to be separated between the light-emitting devices by patterning using a photolithography method; thus, a high-resolution light-emitting apparatus (display panel) can be fabricated. The end portions (side surfaces) of the EL layers processed by patterning using a photolithography method have substantially the same surface (or are positioned on substantially the same plane).

The hole-injection layers included in the hole-transport regions in the EL layers (103P and 103Q) and the charge-generation layers (106B, 106G, and 106R) often have high conductivity; therefore, these layers formed as layers shared by adjacent light-emitting devices might cause crosstalk. Therefore, processing the EL layers to be separated by patterning using a photolithography method as shown in this structure example can suppress occurrence of crosstalk between adjacent light-emitting devices.

In this structure example, the EL layers (103P and 103Q) and the charge-generation layers (106R, 106G, and 106R) of the adjacent light-emitting devices (550B, 550G, and 550R) may be separately formed. In that case, the EL layers (103P and 103Q) can have different structures. For example, the EL layers (103P and 103Q) of the light-emitting device 550B may be formed as blue-light-emitting layers by including a blue-light-emitting substance, the EL layers (103P and 103Q) of the light-emitting device 550G may be formed as green-light-emitting layers by including a green-light-emitting substance, and the EL layers (103P and 103Q) of the light-emitting device 550R may be formed as red-light-emitting layers by including a red-light-emitting substance. Alternatively, the EL layer 103Pb and the EL layer 103Qb of the light-emitting device 550B, the EL layer 103Pg and the EL layer 103Qg of the light-emitting device 550G, and the EL layer 103Pr and the EL layer 103Qr of the light-emitting device 550R may be formed using light-emitting substances exhibiting different emission colors.

In this specification and the like, a device formed using a metal mask or an FMM (a fine metal mask, a high-resolution metal mask) may be referred to as a device having an MM (a metal mask) structure. In this specification and the like, a device formed without using a metal mask or an FMM is sometimes referred to as a device having an MML (metal maskless) structure. A light-emitting apparatus having an MML structure is formed without using a metal mask and thus has higher flexibility in designing the pixel arrangement, the pixel shape, and the like than a light-emitting apparatus having an FMM structure or an MM structure.

Note that the island-shaped EL layers of the light-emitting apparatus having the MML structure are formed by not patterning using a metal mask but processing after formation of an EL layer. Accordingly, a light-emitting apparatus having a higher resolution or a higher aperture ratio than a conventional one can be obtained. Moreover, EL layers of different colors can be formed separately, enabling the light-emitting apparatus to perform extremely clear display with high contrast and high display quality. Furthermore, providing a sacrificial layer over an EL layer can reduce damage to the EL layer during the manufacturing process and thereby increase the reliability of a light-emitting device.

In the case of processing the light-emitting layer into an island shape, a structure is possible in which the EL layer whose components up to the light-emitting layer are formed is processed by a photolithography method. In the case of this structure, damage to the light-emitting layer (e.g., processing damage) might significantly degrade the reliability. In view of this, in the manufacture of the display panel of one embodiment of the present invention, it is preferable to employ a method in which a sacrificial layer or the like is formed over a layer above the light-emitting layer (e.g., a carrier-transport layer or a carrier-injection layer, or specifically an electron-transport layer or an electron-injection layer) and the light-emitting layer is processed into an island shape. This method can provide a highly reliable display panel.

The structures described in this embodiment can be used in an appropriate combination with any of the structures described in the other embodiments.

Embodiment 4

In this embodiment, a light-emitting apparatus of one embodiment of the present invention will be described with reference to FIG. 9A to FIG. 11B. The light-emitting apparatus 700 illustrated in FIG. 9A to FIG. 11B includes the light-emitting device described in Embodiment 2. The light-emitting apparatus 700 described in this embodiment can be referred to as a display panel because it can be used in a display portion of an electronic appliance and the like.

Figure 9A:
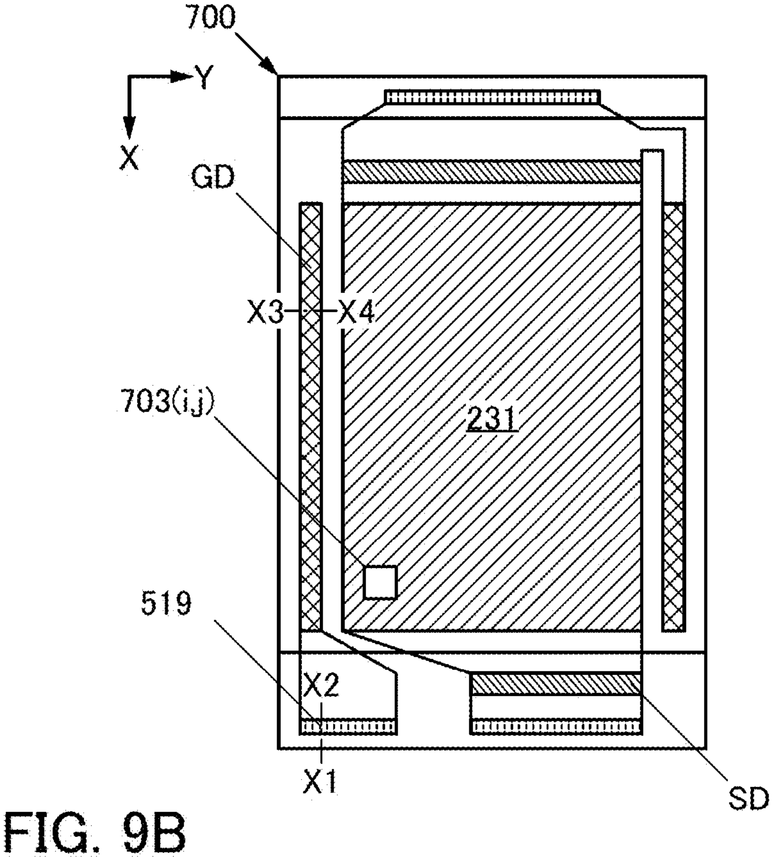
FIG. 9A and FIG. 9B are diagrams illustrating a light-emitting apparatus according to an embodiment.
Figure 9B:
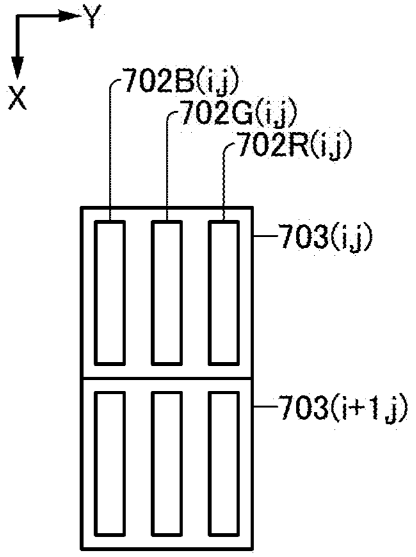

As illustrated in FIG. 9A, the light-emitting apparatus 700 described in this embodiment includes a display region 231, and the display region 231 includes a pixel set 703($i,j$). A pixel set 703($i$+1,j) adjacent to the pixel set 703($i,j$) is provided as illustrated in FIG. 9B.

Note that a plurality of pixels can be used in the pixel 703($i,j$). For example, a plurality of pixels capable of displaying colors with different hues can be used. Note that the plurality of pixels can be referred to as subpixels. A set of subpixels can be referred to as a pixel.

This enables additive mixture or subtractive mixture of colors displayed by the plurality of pixels. It is possible to display a color of a hue that a single pixel cannot display.

Specifically, a pixel 702B(i,j) displaying blue, a pixel 702G(i,j) displaying green, and a pixel 702R(i,j) displaying red can be used in the pixel 703($i,j$). The pixel 702B(i,j), the pixel 702G(i,j), and the pixel 702R(i,j) can each be referred to as a subpixel.

A pixel displaying white or the like may be used in addition to the above set in the pixel 703($i,j$). A pixel displaying cyan, a pixel displaying magenta, and a pixel displaying yellow may be used in the pixel 703($i,j$) as subpixels.

A pixel that emits infrared light in addition to the above set may be used in the pixel 703($i,j$). Specifically, a pixel that emits light including light with a wavelength greater than or equal to 650 nm and less than or equal to 1000 nm can be used in the pixel 703($i,j$).

The driver circuit GD and the driver circuit SD are provided around the display region 231 shown in FIG. 9A. Furthermore, a terminal 519 electrically connected to the driver circuit GD, the driver circuit SD, and the like is provided. The terminal 519 can be electrically connected to a flexible printed circuit FPC1, for example, as shown in FIG. 11A.

The driver circuit GD has a function of supplying a first selection signal and a second selection signal. For example, the driver circuit GD is electrically connected to a conductive film G1($i$) described later to supply the first selection signal, and is electrically connected to a conductive film G2($i$) described later to supply the second selection signal. The driver circuit SD has a function of supplying an image signal and a control signal, and the control signal includes a first level and a second level. For example, the driver circuit SD is electrically connected to a conductive film S1*g*(j) described later to supply the image signal, and is electrically connected to a conductive film S2*g*(j) described later to supply the control signal.

Figure 11A:
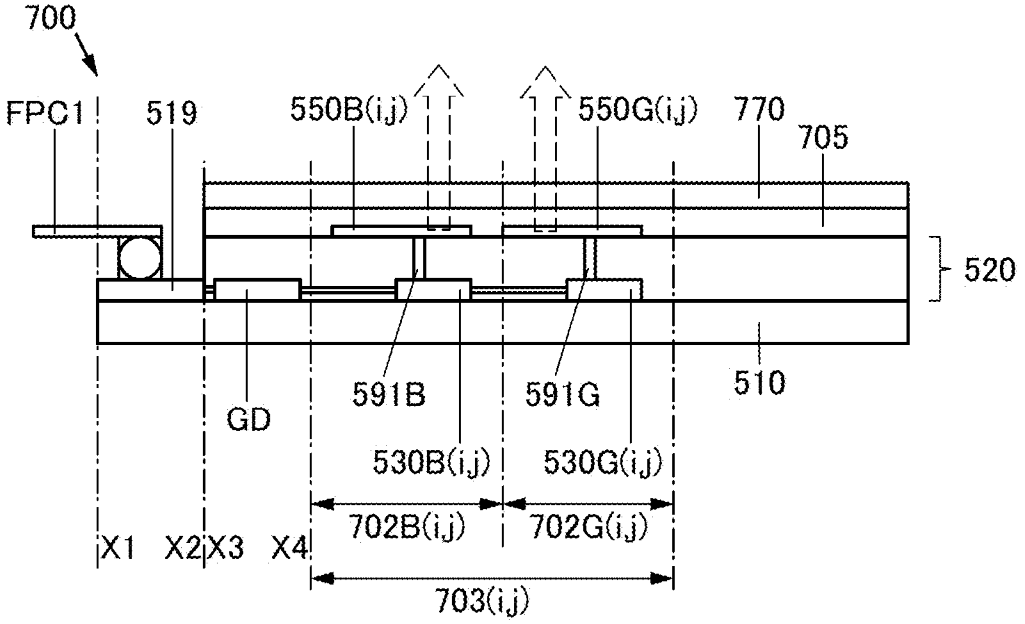
FIG. 11A and FIG. 11B are diagrams illustrating a light-emitting apparatus according to an embodiment.

FIG. 11A shows a cross-sectional view of the light-emitting apparatus taken along each of the dashed-dotted line X1-X2 and the dashed-dotted line X3-X4 in FIG. 9A. As illustrated in FIG. 11A, the light-emitting apparatus 700 includes the functional layer 520 between the first substrate 510 and the second substrate 770. The functional layer 520 includes, for example, the driver circuit GD, the driver circuit SD, and the like that are described above and wirings that electrically connect these circuits. The structure of the functional layer 520 illustrated in FIG. 11A includes a pixel circuit 530B(i,j), a pixel circuit 530G(i,j), and the driver circuit GD; however, one embodiment of the present invention is not limited thereto.

Each pixel circuit (e.g., the pixel circuit 530B(i,j) and the pixel circuit 530G(i,j) in FIG. 11A) included in the functional layer 520 is electrically connected to light-emitting devices (e.g., a light-emitting device 550B(i,j) and a light-emitting device 550G(i,j) in FIG. 11A) formed over the functional layer 520. Specifically, the light-emitting device 550B(i,j) is electrically connected to the pixel circuit 530B (i,j) through an opening 591B, and the light-emitting device 550G(i,j) is electrically connected to the pixel circuit 530G (i,j) through an opening 591G. The insulating layer 705 is provided over the functional layer 520 and the light-emitting devices, and the insulating layer 705 has a function of attaching the second substrate 770 and the functional layer 520.

As the second substrate 770, a substrate where touch sensors are arranged in a matrix can be used. For example, a substrate provided with a capacitive touch sensor or an optical touch sensor can be used for the second substrate 770. Thus, the light-emitting apparatus of one embodiment of the present invention can be used as a touch panel.

Figure 10A:
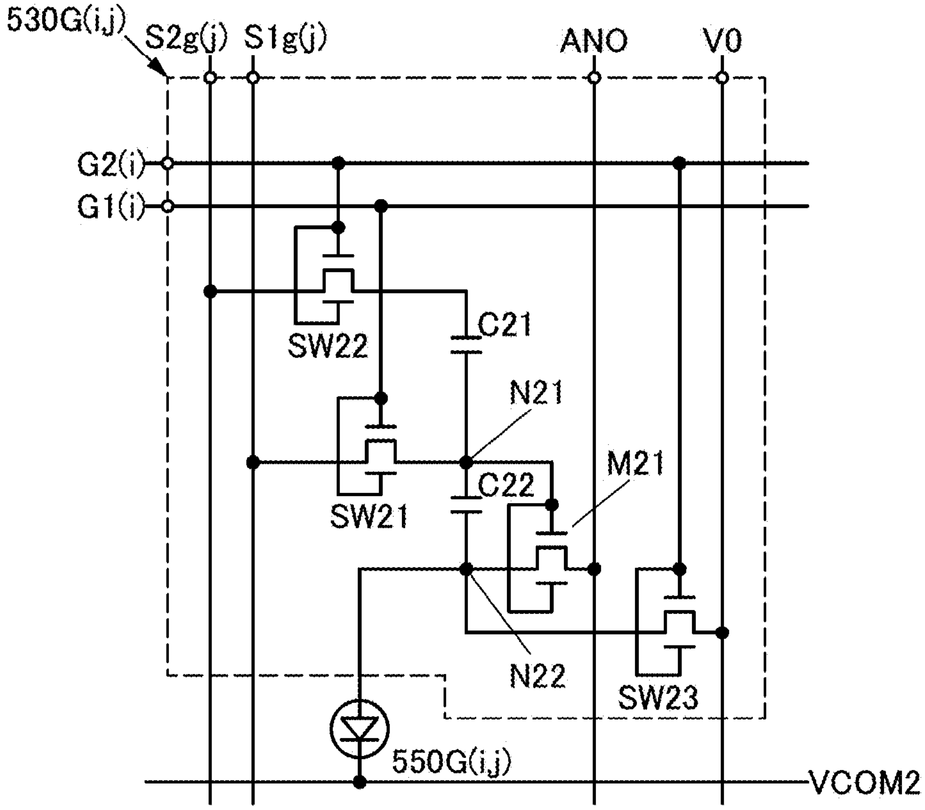
FIG. 10A and FIG. 10B are diagrams illustrating a light-emitting apparatus according to an embodiment.

FIG. 10A illustrates a specific configuration of the pixel circuit 530G(i,j).

The pixel circuit 530G(i,j) includes a switch SW21, a switch SW22, a transistor M21, a capacitor C21, and a node N21 as illustrated in FIG. 10A. In addition, the pixel circuit 530G(i,j) includes a node N22, a capacitor C22, and a switch SW23.

The transistor M21 includes a gate electrode electrically connected to the node N21, a first electrode electrically connected to the light-emitting device 550G(i,j), and a second electrode electrically connected to a conductive film ANO.

The switch SW21 includes a first terminal electrically connected to the node N21 and a second terminal electrically connected to the conductive film S1*g*(j). The switch SW21 has a function of controlling the conduction state or the non-conduction state on the basis of the potential of the conductive film G1(*i*).

The switch SW22 includes a first terminal electrically connected to the conductive film S2*g*(j), and has a function of controlling the conduction state or the non-conduction state on the basis of the potential of the conductive film G2(*i*).

The capacitor C21 includes a conductive film electrically connected to the node N21 and a conductive film electrically connected to a second terminal of the switch SW22.

Thus, the image signal can be stored in the node N21. The potential of the node N21 can be changed using the switch SW22. Alternatively, the intensity of light emitted from the light-emitting device 550G(i,j) can be controlled with the potential of the node N21.

Figure 10B:
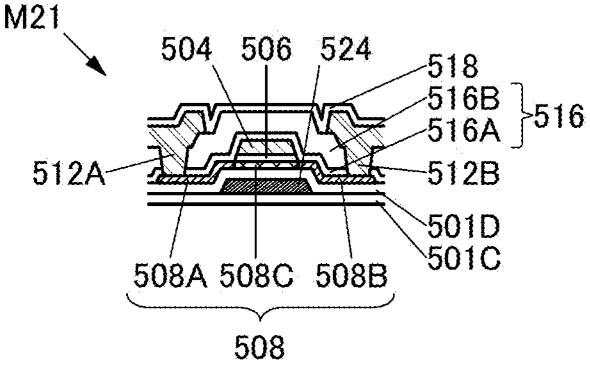

FIG. 10B illustrates an example of a specific structure of the transistor M21 described with reference to FIG. 10A. As the transistor M21, a bottom-gate transistor, a top-gate transistor, or the like can be used as appropriate.

The transistor illustrated in FIG. 10B includes a semiconductor film 508, a conductive film 504, an insulating film 506, a conductive film 512A, and a conductive film 512B. The transistor is formed over an insulating film 501C, for example. The transistor also includes an insulating film 516 (an insulating film 516A and an insulating film 516B) and an insulating film 518.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

The insulating film 506 includes a region interposed between the semiconductor film 508 and the conductive film 504. The insulating film 506 has a function of a first gate insulating film.

The conductive film 512A has one of a function of a source electrode and a function of a drain electrode, and the conductive film 512B has the other of the function of the source electrode and the function of the drain electrode.

A conductive film 524 can be used for the transistor. The conductive film 524 includes a region where the semiconductor film 508 is interposed between the conductive film 524 and the conductive film 504. The conductive film 524 has a function of a second gate electrode. An insulating film 501D is interposed between the semiconductor film 508 and the conductive film 524, and has a function of a second gate insulating film.

The insulating film 516 functions as, for example, a protective film covering the semiconductor film 508. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 516.

For example, a material having a function of inhibiting diffusion of oxygen, hydrogen, water, an alkali metal, an alkaline earth metal, and the like is preferably used for the insulating film 518. Specifically, the insulating film 518 can be formed using silicon nitride, silicon oxynitride, aluminum nitride, or aluminum oxynitride, for example. In each of silicon oxynitride and aluminum oxynitride, the number of nitrogen atoms contained is preferably larger than the number of oxygen atoms contained.

Note that the semiconductor film used in the transistor of the driver circuit can be formed in the step of forming the semiconductor film used in the transistor of the pixel circuit. A semiconductor film having the same composition as the semiconductor film used in the transistor of the pixel circuit can be used in the transistor of the driver circuit, for example.

For the semiconductor film 508, a semiconductor containing a Group 14 element can be used. Specifically, a semiconductor containing silicon can be used for the semiconductor film 508.

Hydrogenated amorphous silicon can be used for the semiconductor film 508. Alternatively, microcrystalline silicon or the like can be used for the semiconductor film 508. In that case, a light-emitting apparatus having less display unevenness than a light-emitting apparatus using polysilicon for the semiconductor film 508, for example, can be provided. Moreover, it is easy to increase the size of the light-emitting apparatus.

Polysilicon can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for fabrication of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the substrate where the pixel circuit is formed. The number of components included in an electronic appliance can be reduced.

Single crystal silicon can be used for the semiconductor film 508. In this case, for example, the resolution can be higher than that of a light-emitting apparatus (or a display panel) using hydrogenated amorphous silicon for the semiconductor film 508. A light-emitting apparatus having less display unevenness than a light-emitting apparatus using polysilicon for the semiconductor film 508, for example, can be provided. Smart glasses or a head-mounted display can be provided, for example.

A metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of an electronic appliance can be reduced. Moreover, power consumption for driving can be reduced.

An oxide semiconductor can be used for the oxide semiconductor film 508. Specifically, an oxide semiconductor containing indium, an oxide semiconductor containing indium, gallium, and zinc, or an oxide semiconductor containing indium, gallium, zinc, and tin can be used for the semiconductor film 508.

When an oxide semiconductor is used for the semiconductor film, a transistor having a lower leakage current in the off state than a transistor using amorphous silicon for the semiconductor film can be obtained. Thus, a transistor using an oxide semiconductor for a semiconductor film is preferably used as a switch or the like. Note that a circuit in which a transistor using an oxide semiconductor for the semiconductor film is used as a switch is capable of holding the potential of a floating node for a longer time than a circuit in which a transistor using amorphous silicon for the semiconductor film is used as a switch.

Figure 11B:
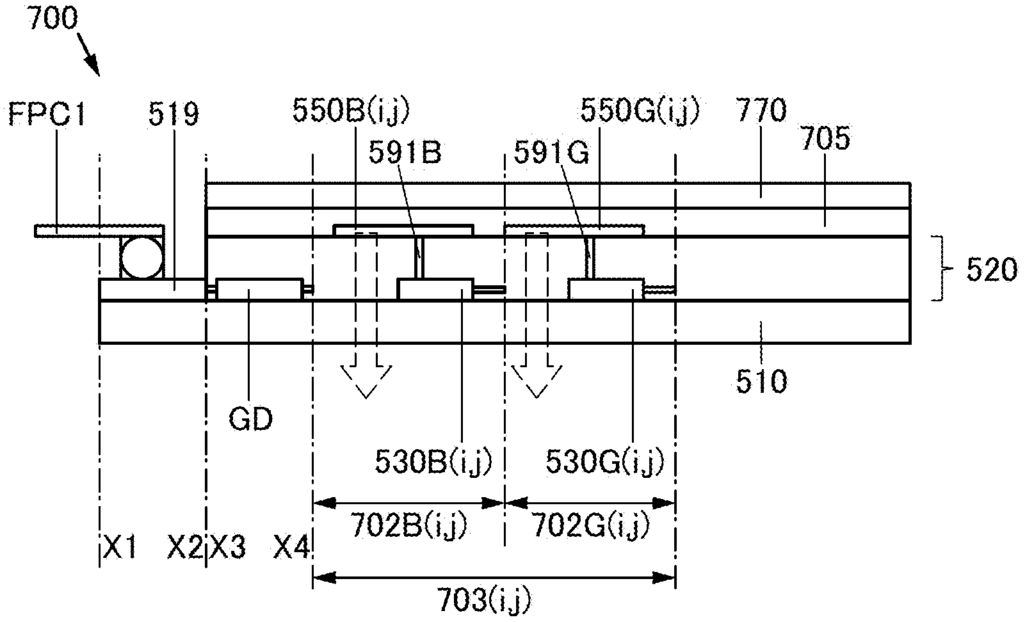

Although the light-emitting apparatus in FIG. 11A has a structure in which light is extracted from the second substrate 770 side (a top-emission structure), the light-emitting apparatus may have a structure in which light is extracted from the first substrate 510 side (a bottom-emission structure) as shown in FIG. 11B. For a bottom-emission light-emitting apparatus, the first electrode is formed so as to function as a semi-transmissive and semi-reflective electrode and the second electrode is formed so as to function as a reflective electrode.

Figure 12A:
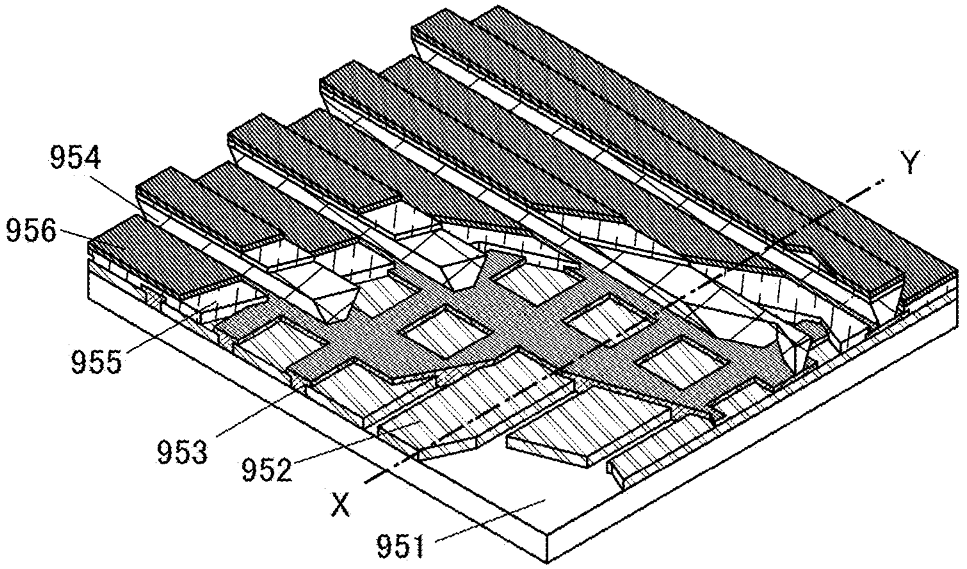
FIG. 12A and FIG. 12B are diagrams illustrating a light-emitting apparatus according to an embodiment.
Figure 12B:
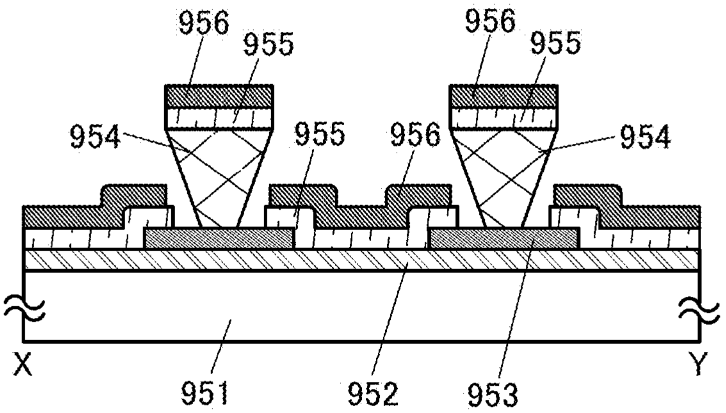

Although FIG. 11A and FIG. 11B each illustrate an active-matrix light-emitting apparatus, the structure of the light-emitting device described in Embodiment 2 may be applied to a passive-matrix light-emitting apparatus illustrated in FIG. 12A and FIG. 12B.

Note that FIG. 12A is a perspective view of a passive matrix light-emitting apparatus, and FIG. 12B is a cross-sectional view taken along the line X-Y in FIG. 12A. In FIG. 12A and FIG. 12B, an electrode 952 and an electrode 956 are provided over a substrate 951, and an EL layer 955 is provided between the electrode 952 and the electrode 956. An end portion of the electrode 952 is covered with an insulating layer 953. A partition layer 954 is provided over the insulating layer 953. Sidewalls of the partition layer 954 are aslope such that the distance between one sidewall and the other sidewall is gradually narrowed toward the surface of the substrate. That is, a cross section in the short side direction of the partition layer 954 is a trapezoidal shape, and the lower side (the side facing the same direction as the plane direction of the insulating layer 953 and touching the insulating layer 953) is shorter than the upper side (the side facing the same direction as the plane direction of the insulating layer 953, and not touching the insulating layer 953). By providing the partition layer 954 in this manner, defects of the light-emitting device due to static charge or the like can be prevented.

Note that the structures described in this embodiment can be used in an appropriate combination with any of the structures described in the other embodiments.

Embodiment 5

In this embodiment, electronic appliances of embodiments of the present invention will be described with reference to FIG. 13A to FIG. 15B.

Figure 13A:
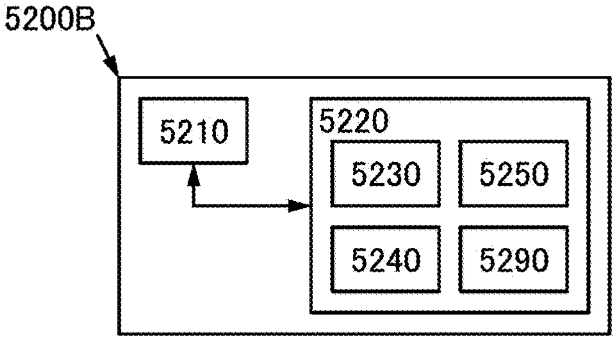
FIG. 13A to FIG. 13E are diagrams illustrating electronic appliances according to an embodiment.
Figure 13B:
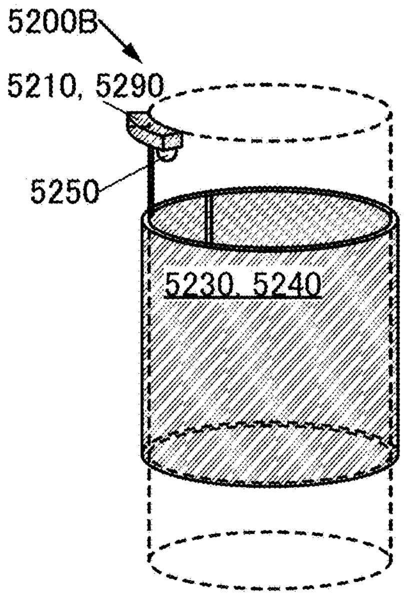
Figure 13C:
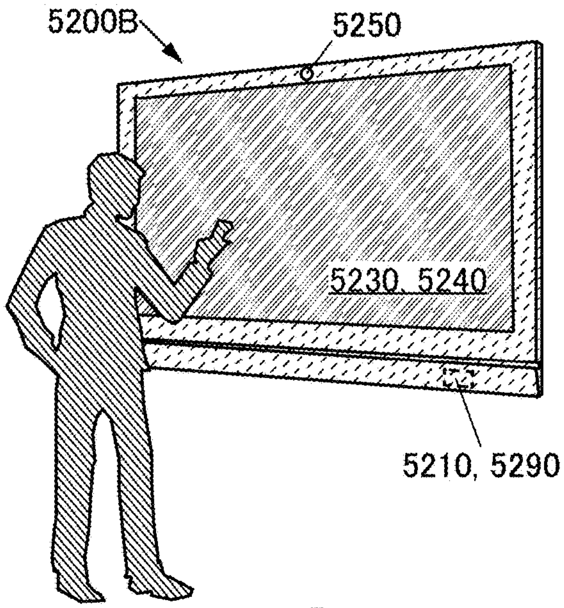
Figure 13D:
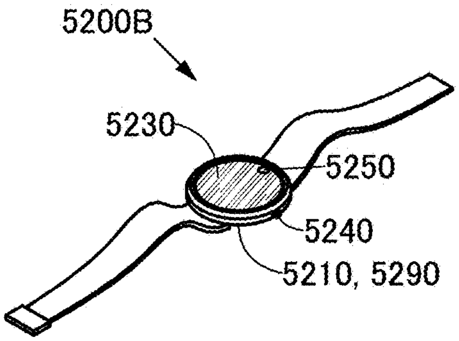
Figure 13E:
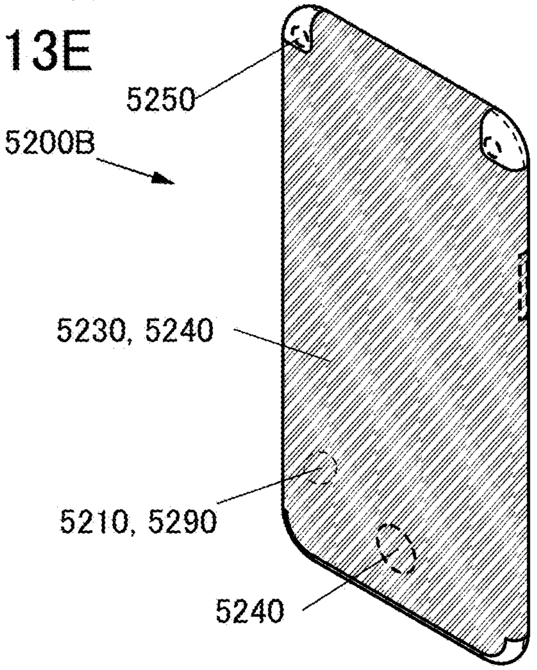
Figure 14A:
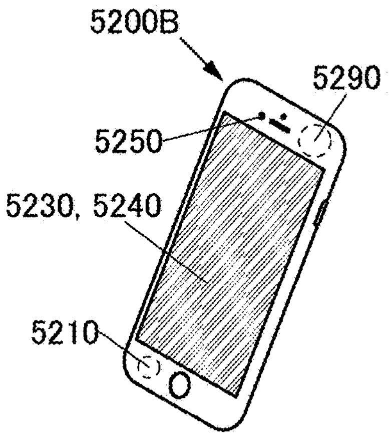
FIG. 14A to FIG. 14E are diagrams illustrating electronic appliances according to an embodiment.
Figure 14B:
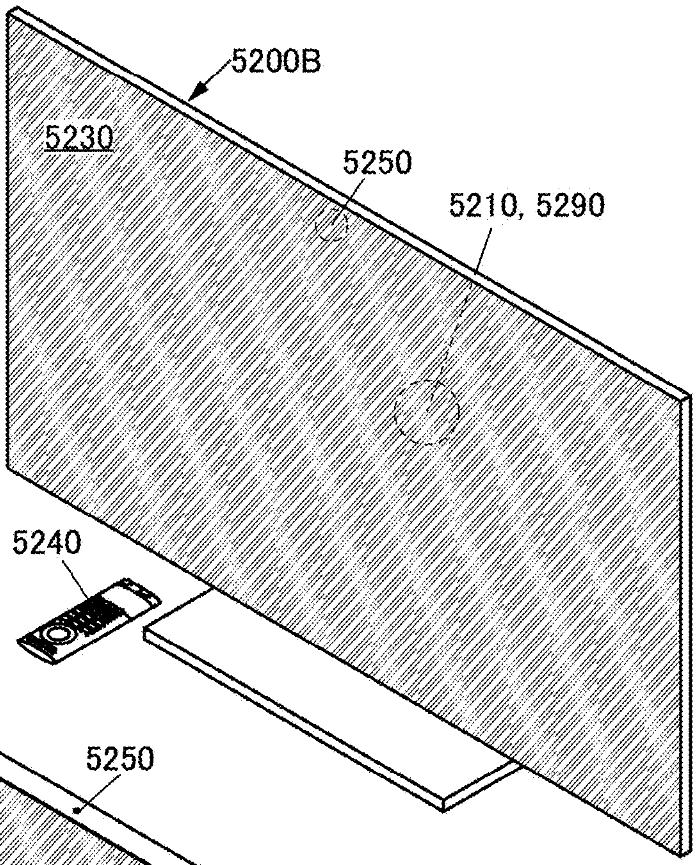
Figure 14C:
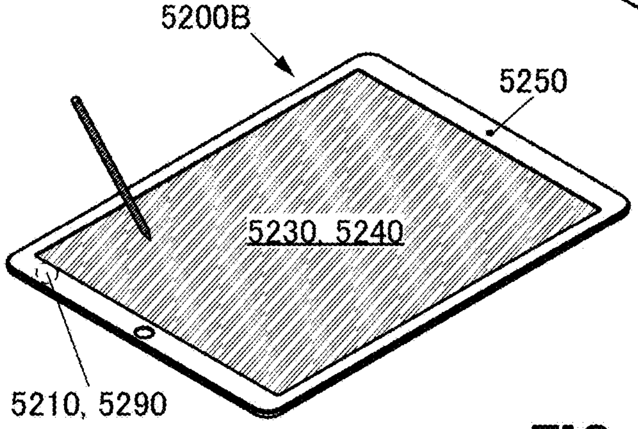
Figure 14D:
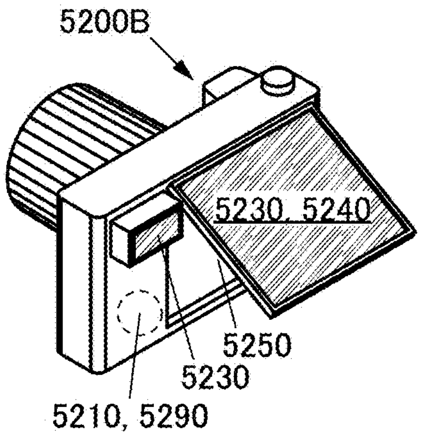
Figure 14E:
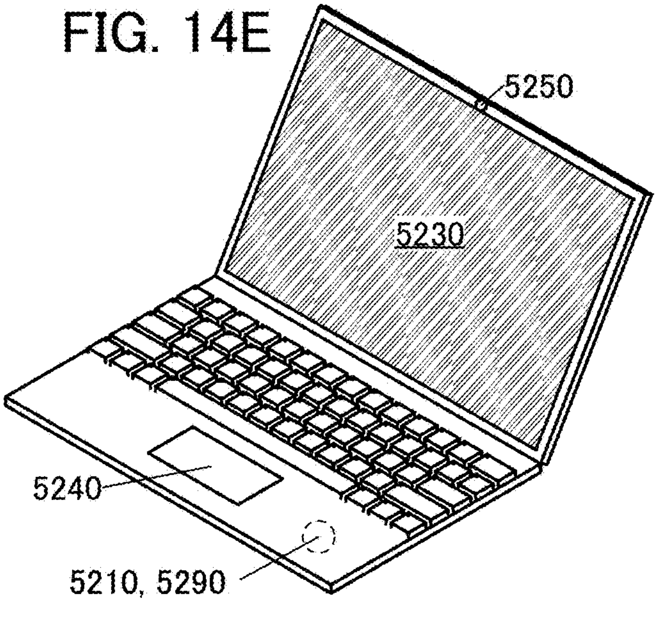
Figure 15A:
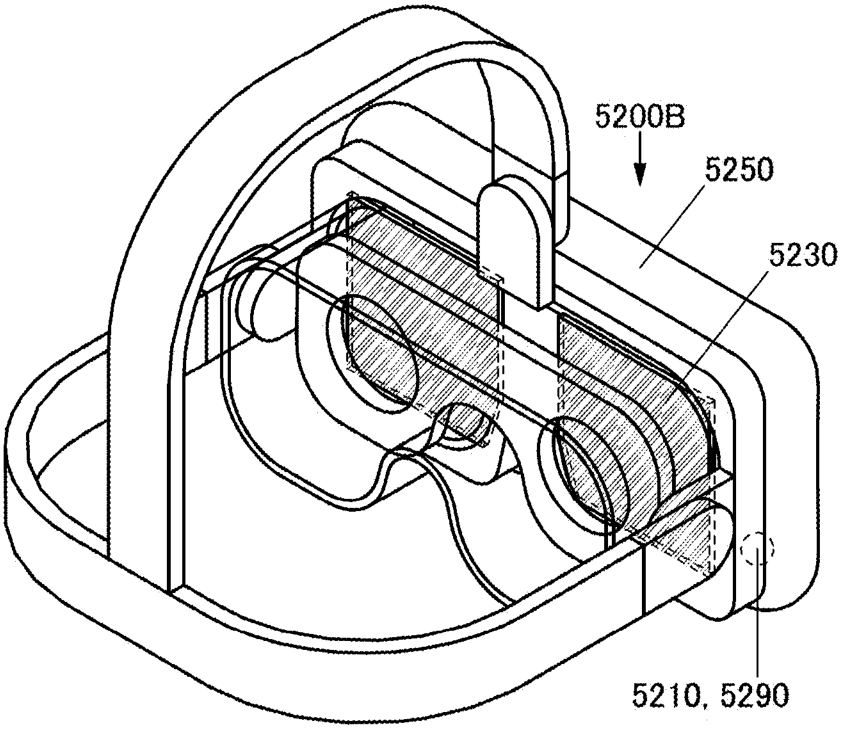
FIG. 15A and FIG. 15B are diagrams illustrating electronic appliances according to an embodiment.
Figure 15B:
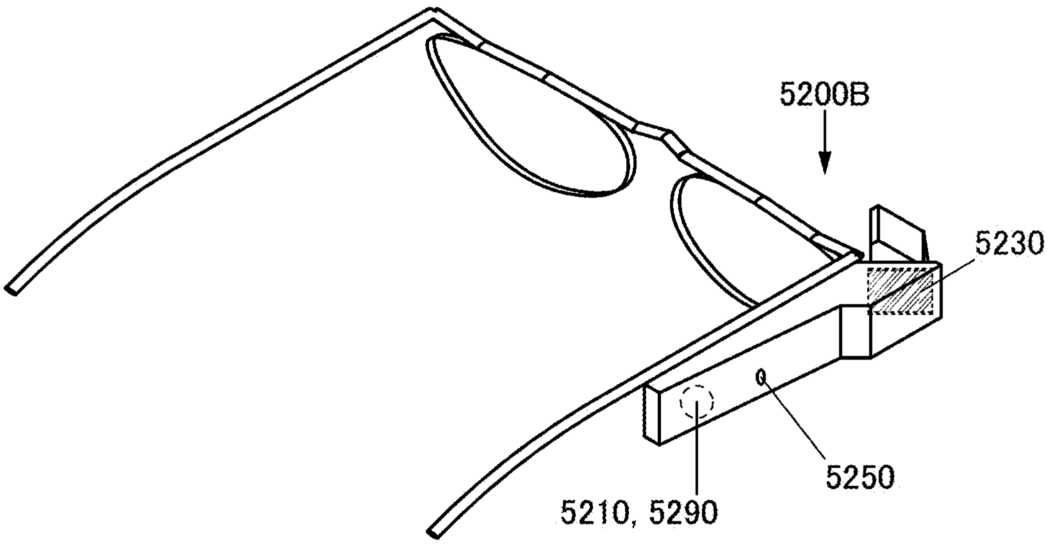

FIG. 13A to FIG. 15B are diagrams illustrating structures of electronic appliances of embodiments of the present invention. FIG. 13A is a block diagram of the electronic appliance and FIG. 13B to FIG. 13E are perspective views illustrating structures of the electronic appliances. FIG. 14A to FIG. 14E are perspective views illustrating structures of electronic appliances. FIG. 15A and FIG. 15B are perspective views illustrating structures of electronic appliances.

An electronic appliance 5200B described in this embodiment includes an arithmetic device 5210 and an input/output device 5220 (see FIG. 13A).

The arithmetic device 5210 has a function of being supplied with operation information and a function of supplying image information on the basis of the operation information.

The input/output device 5220 includes a display portion 5230, an input portion 5240, a sensing portion 5250, and a communication portion 5290. The input/output device 5220 also has a function of supplying operation information, a function of being supplied with image information, a function of supplying sensing information, a function of supplying communication information, and a function of being supplied with communication information.

The input portion 5240 has a function of supplying operation information. For example, the input portion 5240 supplies operation information on the basis of operation by a user of the electronic appliance 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image information. For example, the display panel described in Embodiment 2 can be used for the display portion 5230.

The sensing portion 5250 has a function of supplying sensing information. For example, the sensing portion 5250 has a function of sensing a surrounding environment where the electronic appliance is used and supplying sensing information.

Specifically, an illuminance sensor, an imaging device, an attitude detection device, a pressure sensor, a human motion sensor, or the like can be used as the sensing portion 5250.

The communication portion 5290 has a function of being supplied with communication information and a function of supplying communication information. For example, the communication portion 5290 has a function of being connected to another electronic appliance or a communication network through wireless communication or wired communication. Specifically, the communication portion 5290 has a function of wireless local area network communication, telephone communication, near field communication, or the like.

FIG. 13B illustrates an electronic appliance having an outer shape along a cylindrical column or the like. An example of such an electronic appliance is digital signage. The display panel of one embodiment of the present invention can be used for the display portion 5230. In addition, the electronic appliance may have a function of changing its display method in accordance with the illuminance of a usage environment. Furthermore, the electronic appliance has a function of changing displayed content in response to sensed existence of a person. This allows the electronic appliance to be provided on a column of a building, for example. The electronic appliance can display advertising, guidance, or the like.

FIG. 13C illustrates an electronic appliance having a function of generating image information on the basis of the path of a pointer used by the user. Examples of such an electronic appliance include an electronic blackboard, an electronic bulletin board, and digital signage. Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen.

FIG. 13D illustrates an electronic appliance that is capable of receiving information from another device and displaying the information on the display portion 5230. An example of such an electronic appliance is a wearable electronic appliance. Specifically, the electronic appliance can display several options, or allow a user to choose some from the options and send a reply to a transmitter of the information. For example, the electronic appliance has a function of changing its display method in accordance with the illuminance of a usage environment. Thus, for example, the power consumption of the wearable electronic appliance can be reduced. Alternatively, for example, the wearable electronic appliance can display an image so as to be suitably used even in an environment under strong external light, e.g., outdoors in fine weather.

FIG. 13E illustrates an electronic appliance including the display portion 5230 having a surface gently curved along a side surface of a housing. An example of such an electronic appliance is a mobile phone. The display portion 5230 includes a display panel, and the display panel has a function of performing display on the front surface, the side surfaces, the top surface, and the rear surface, for example. Thus, for example, the mobile phone can display information not only on its front surface but also on its side surfaces, its top surface, and its rear surface.

FIG. 14A illustrates an electronic appliance that is capable of receiving information via the Internet and displaying the information on the display portion 5230. An example of such an electronic appliance is a smartphone. A created message can be checked on the display portion 5230, for example. The created message can be sent to another device. For example, the electronic appliance has a function of changing its display method in accordance with the illuminance of a usage environment. Thus, the power consumption of the smartphone can be reduced. Alternatively, for example, the smartphone can display an image so as to be suitably used even in an environment under strong external light, e.g., outdoors in fine weather.

FIG. 14B illustrates an electronic appliance that can use a remote controller as the input portion 5240. An example of such an electronic appliance is a television system. For example, the electronic appliance can receive information from a broadcast station or via the Internet and display the information on the display portion 5230. An image of a user can be captured using the sensing portion 5250. The image of the user can be transmitted. The electronic appliance can acquire a viewing history of the user and provide it to a cloud service. The electronic appliance can acquire recommendation information from a cloud service and display the information on the display portion 5230. A program or a moving image can be displayed on the basis of the recommendation information. For example, the electronic appliance has a function of changing its display method in accordance with the illuminance of a usage environment. Accordingly, for example, the television system can display an image so as to be suitably used even when irradiated with strong external light that enters a room in fine weather.

FIG. 14C illustrates an electronic appliance that is capable of receiving educational materials via the Internet and displaying them on the display portion 5230. An example of such an electronic appliance is a tablet computer. An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another electronic appliance. When the electronic appliance is placed on a stand or the like, the display portion 5230 can be used as a sub-display. Thus, for example, the tablet computer can display an image so as to be suitably used even in an environment under strong external light, e.g., outdoors in fine weather.

FIG. 14D illustrates an electronic appliance including a plurality of the display portions 5230. An example of such an electronic appliance is a digital camera. For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The electronic appliance has a function of changing its shooting conditions in accordance with the illuminance of a usage environment. Accordingly, for example, a subject can be displayed on the digital camera to be favorably viewed even in an environment under strong external light, e.g., outdoors in fine weather.

FIG. 14E illustrates an electronic appliance in which the electronic appliance of this embodiment is used as a master to control another electronic appliance used as a slave. An example of such an electronic appliance is a portable personal computer. For example, part of image information can be displayed on the display portion 5230 and another part of the image information can be displayed on a display portion of another electronic appliance. An image signal can be supplied. With the communication portion 5290, information to be written can be obtained from an input portion of another electronic appliance. Thus, a large display region can be utilized by using the portable personal computer, for example.

FIG. 15A illustrates an electronic appliance including the sensing portion 5250 that senses an acceleration or a direction. An example of such an electronic appliance is a goggles-type electronic appliance. The sensing portion 5250 can supply information on the position of the user or the direction in which the user faces. The electronic appliance can generate image information for the right eye and image information for the left eye in accordance with the position of the user or the direction in which the user faces. The display portion 5230 includes a display region for the right eye and a display region for the left eye. Thus, a virtual reality image that gives the user a sense of immersion can be displayed on the goggles-type electronic appliance, for example.

FIG. 15B illustrates an electronic appliance including an imaging device and the sensing portion 5250 that senses an acceleration or a direction. An example of such an electronic appliance is a glasses-type electronic appliance. The sensing portion 5250 can supply information on the position of the user or the direction in which the user faces. The electronic appliance can generate image information in accordance with the position of the user or the direction in which the user faces. Accordingly, the information can be shown together with a real-world scene, for example. An augmented reality image can be displayed on the glasses-type electronic appliance.

Note that this embodiment can be combined with any of the other embodiments described in this specification as appropriate.

Embodiment 6

Figure 16A:
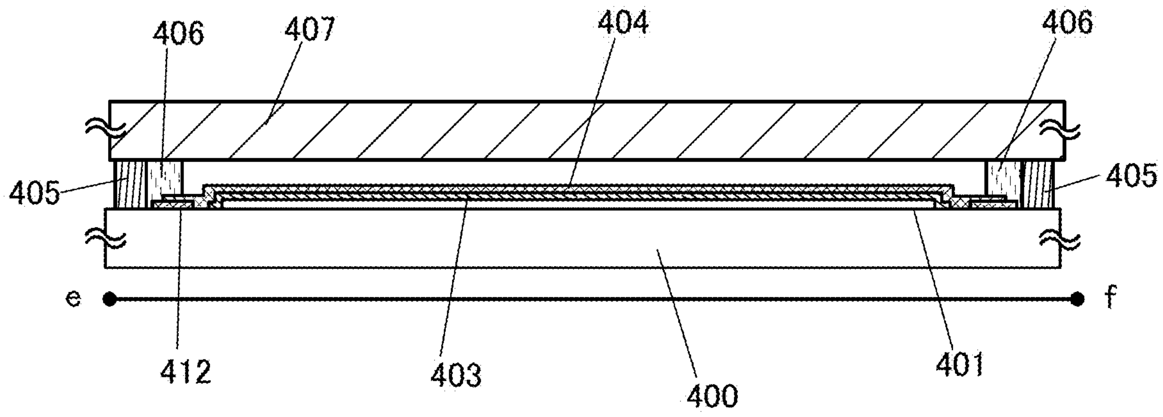
FIG. 16A and FIG. 16B are diagrams illustrating an electronic appliance according to an embodiment.
Figure 16B:
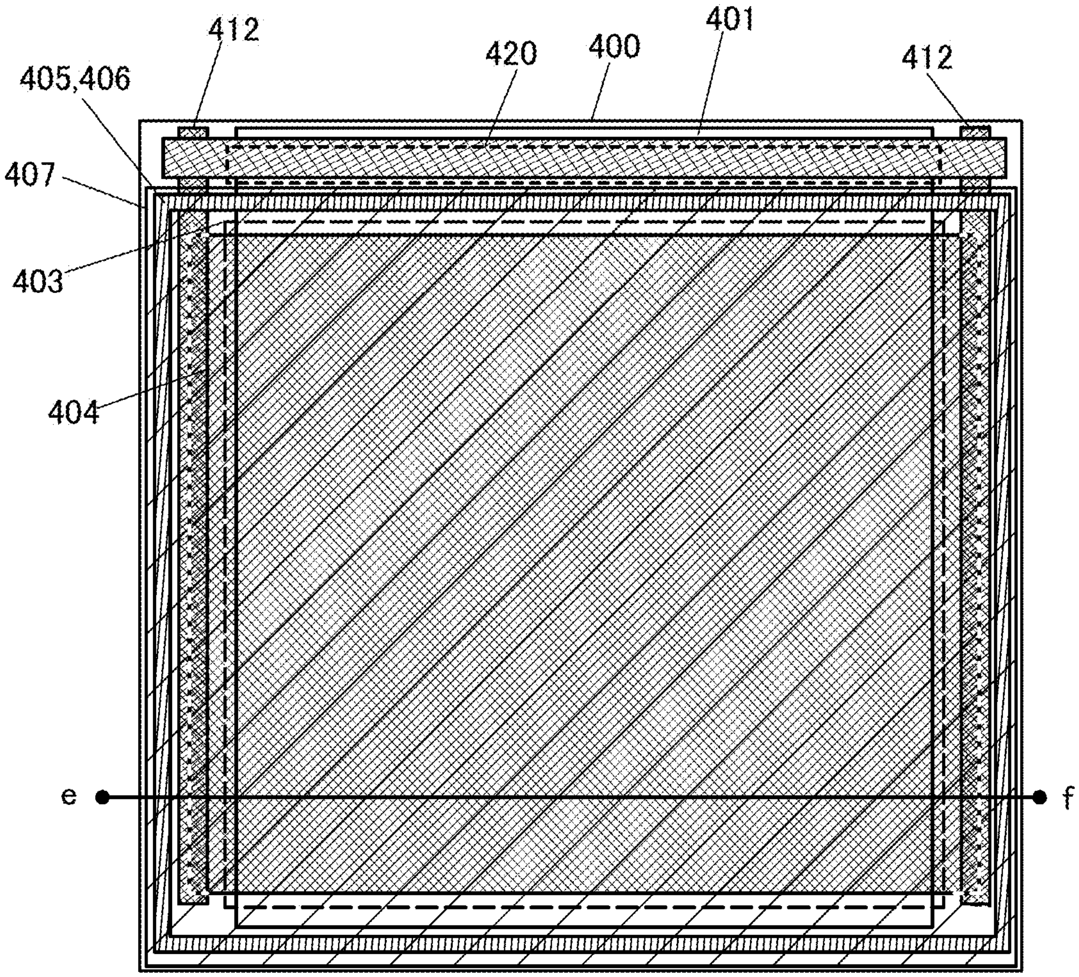

In this embodiment, a structure in which the light-emitting device described in Embodiment 2 is used for a lighting device will be described with reference to FIG. 16. FIG. 16A shows a cross section taken along the line e-f in a top view of the lighting device in FIG. 16B.

In the lighting device in this embodiment, a first electrode 401 is formed over a substrate 400 which is a support and has a light-transmitting property. The first electrode 401 corresponds to the first electrode 101 in Embodiment 2. In the case where light emission is extracted from the first electrode 401 side, the first electrode 401 is formed with a material having a light-transmitting property.

A pad 412 for supplying a voltage to a second electrode 404 is formed over the substrate 400.

An EL layer 403 is formed over the first electrode 401. The structure of the EL layer 403 corresponds to, for example, the structure of the EL layer 103 in Embodiment 2 or the structure in which the EL layers 103*a*, 103*b*, and 103*c* and the charge-generation layers 106 (106*a* and 106*b*) are combined. Note that for these structures, the corresponding description can be referred to.

The second electrode 404 is formed to cover the EL layer 403. The second electrode 404 corresponds to the second electrode 102 in Embodiment 2. In the case where light-emission is extracted from the first electrode 401 side, the second electrode 404 is formed with a material having high reflectivity. The second electrode 404 is supplied with a voltage when connected to the pad 412.

As described above, the lighting device described in this embodiment includes a light-emitting device including the first electrode 401, the EL layer 403, and the second electrode 404. Since the light-emitting device is a light-emitting device with high emission efficiency, the lighting device in this embodiment can be a lighting device with low power consumption.

The substrate 400 over which the light-emitting device having the above structure is formed is fixed to a sealing substrate 407 with sealants 405 and 406 and sealing is performed, whereby the lighting device is completed. It is possible to use only either the sealant 405 or the sealant 406. In addition, the inner sealant 406 (not shown in FIG. 16B) can be mixed with a desiccant, which enables moisture to be adsorbed, resulting in improved reliability.

When parts of the pad 412 and the first electrode 401 are extended to the outside of the sealants 405 and 406, the extended parts can serve as external input terminals. An IC chip 420 mounted with a converter or the like may be provided over the external input terminals.

Embodiment 7

Figure 17:
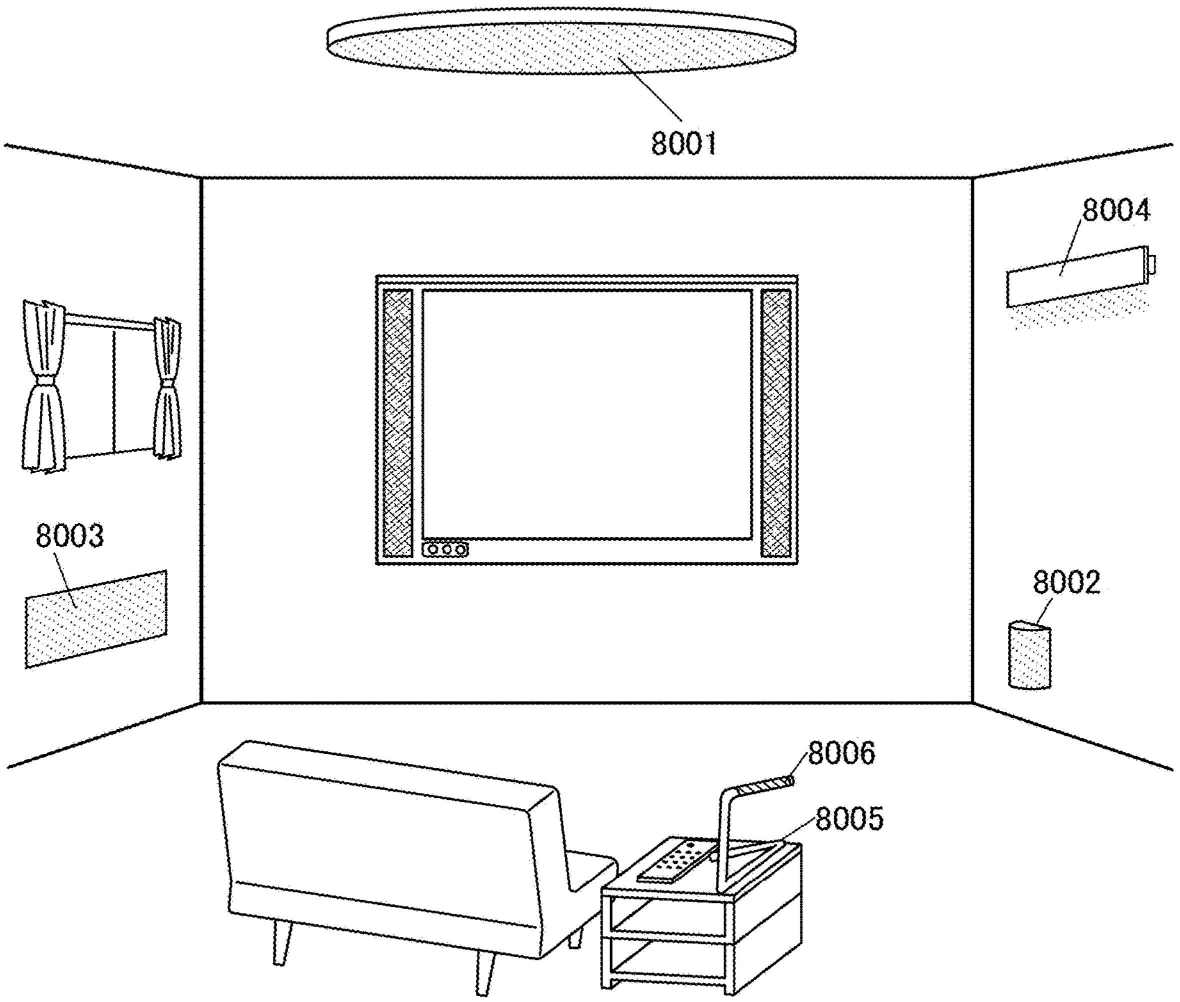
FIG. 17 is a diagram illustrating electronic appliances according to an embodiment.
Figure 18A:
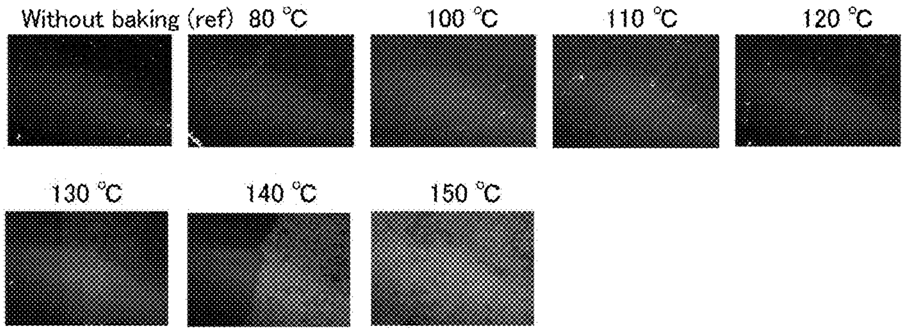
FIG. 18A to FIG. 18E are photographs according to an example.
Figure 18B:
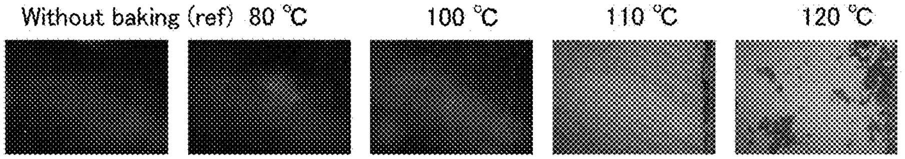
Figure 18C:
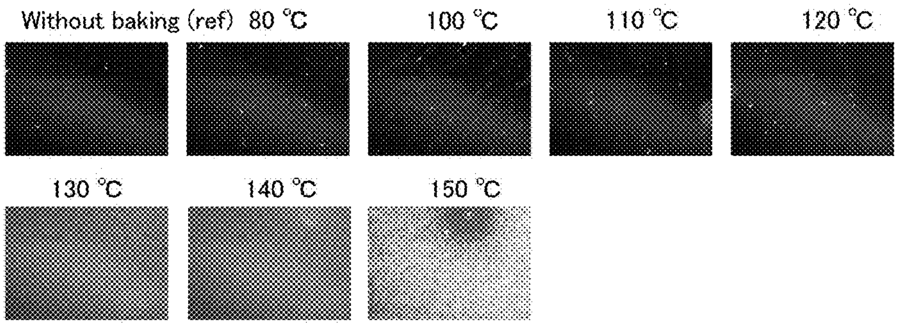
Figure 18D:
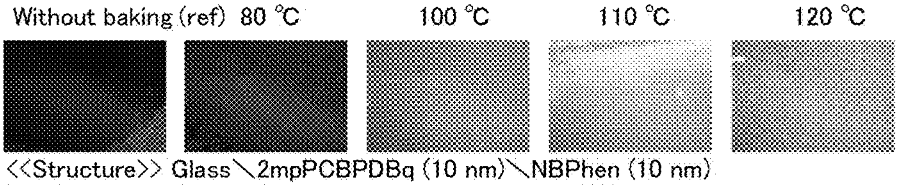
Figure 18E:
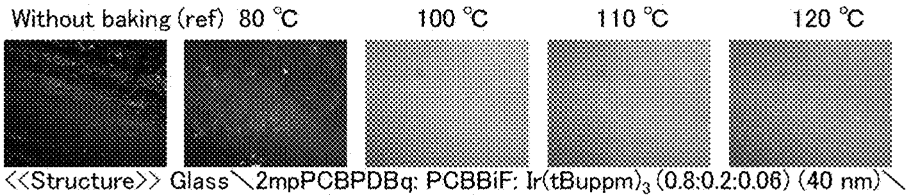
Figure 19A:
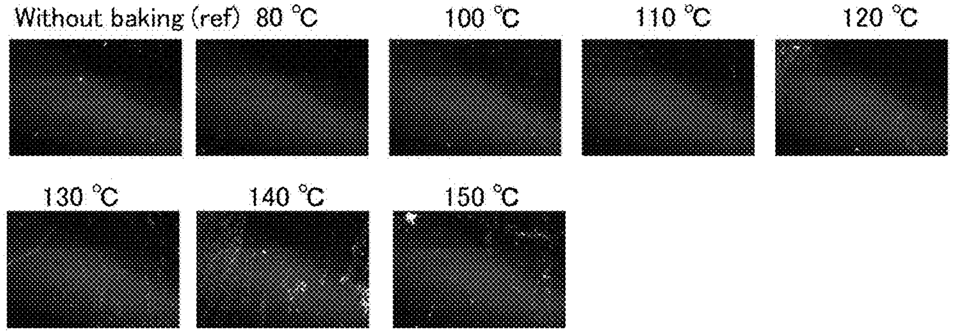
FIG. 19A to FIG. 19D are photographs according to an example.
Figure 19B:
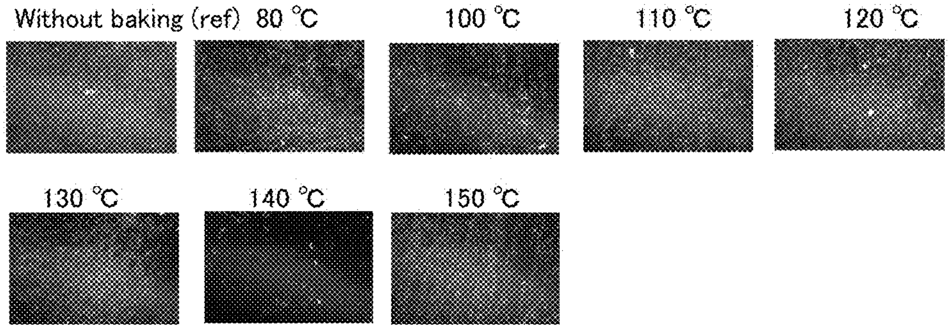
Figure 19C:
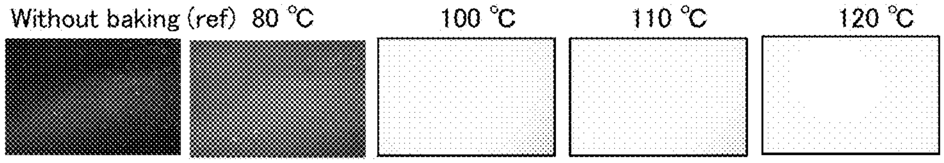
Figure 19D:
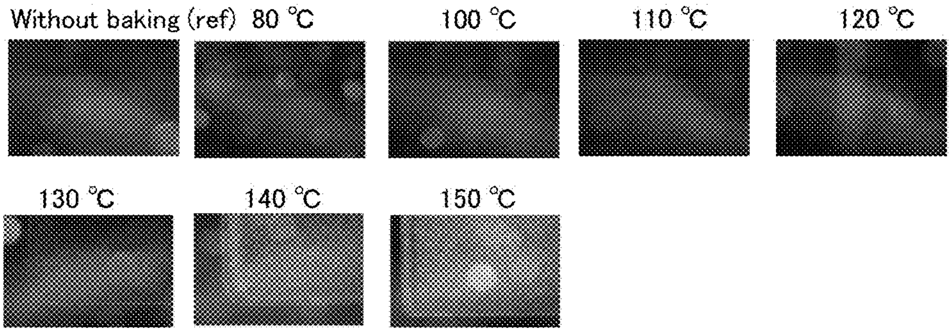

In this embodiment, an application example of a lighting device fabricated using the light-emitting apparatus of one embodiment of the present invention or the light-emitting device which is part of the light-emitting apparatus will be described with reference to FIG. 17.

Application to a ceiling light 8001, which is an indoor lighting device, is possible. Examples of the ceiling light 8001 include a direct-mount light and an embedded light. Such a lighting device is fabricated using the light-emitting apparatus and a housing or a cover in combination. Besides, application to a cord pendant light (light that is suspended from a ceiling by a cord) is also possible.

A foot light 8002 lights a floor so that safety on the floor can be improved. For example, it can be effectively used in a bedroom, on a staircase, on a passage, or the like. In such a case, the size and shape of the foot light can be changed depending on the area and structure of a room. The foot light can also be a stationary lighting device fabricated using the light-emitting apparatus and a support base in combination.

A sheet-shaped lighting 8003 is a thin sheet-shaped lighting device. The sheet-shaped lighting, which is attached to a wall when used, is space-saving and thus can be used for a wide variety of uses. The area of the sheet-shaped lighting can be easily increased. The sheet-shaped lighting can also be used on a wall or a housing that has a curved surface.

In addition, a lighting device 8004 in which the direction of light from a light source is controlled to be only a desired direction can be used.

A desk lamp 8005 includes a light source 8006. As the light source 8006, the light-emitting apparatus of one embodiment of the present invention or the light-emitting device, which is part of the light-emitting apparatus, can be used.

Besides the above examples, when the light-emitting apparatus of one embodiment of the present invention or the light-emitting device which is a part thereof is used as part of furniture in a room, a lighting device that functions as the furniture can be obtained.

As described above, a variety of lighting devices that include the light-emitting apparatus can be obtained. Note that these lighting devices are also embodiments of the present invention.

The structures described in this embodiment can be used in an appropriate combination with any of the structures described in the other embodiments.

Example 1

Films differing in their material or structure (a stacked-layer film, a mixed film, or the like) were formed over glass substrates, and the obtained samples (films) were subjected to a heat resistance test, the results of which will be described in this example. Note that 9 kinds of samples were formed by changing the combination of a plurality of heteroaromatic compounds or the film structure. Table 1 below shows the structure of each sample as well as the results. The chemical formulae of the materials used in this example are shown below.

[Chemical Formula 3]

(i)

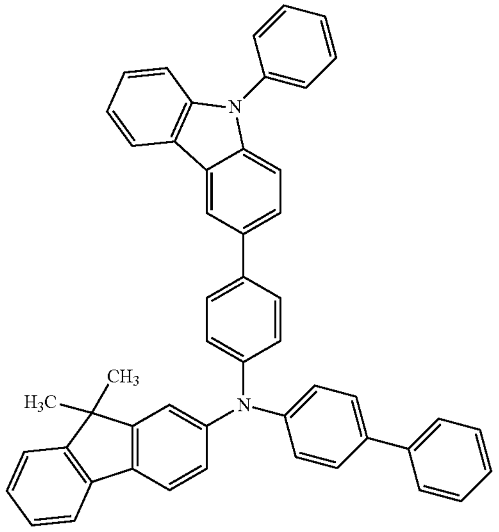

PCBBiF

-continued (ii)

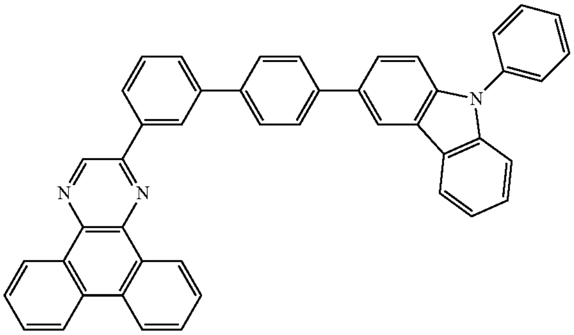

2mpPCBPDBq (iii)

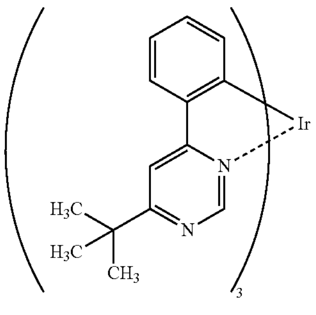

$Ir(tBuppm)_3$ (iv)

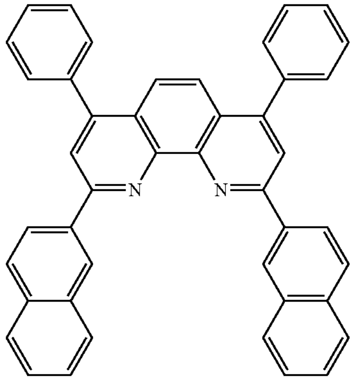

NBPhen

Formation methods of the samples (a sample 1 to a sample 9) are described below.

First, a sample layer was formed over a glass substrate with a vacuum evaporation apparatus, and cut into strips of 1 cm×3 cm. Next, the substrate was introduced into a bell jar type heater (BV-001 bell jar type vacuum oven, SHIBATA SCIENTIFIC TECHNOLOGY LTD.), the pressure was reduced to approximately 10 hPa and then, 1-hour baking was performed with the temperature set in the range of 80° C. to 150° C.

The sample 1 was a single-layer film of one kind of heteroaromatic compound, which was formed by evaporation of 2,9-di(2-naphthyl)-4,7-diphenyl-1,10-phenanthroline (abbreviation: NBPhen) to a thickness of 10 nm over the glass substrate.

The sample 2 was a single-layer film of one kind of heteroaromatic compound, which was formed by evaporation of 2-[4'-(9-phenyl-9H-carbazol-3-yl)-3,1'-biphenyl-1-yl]dibenzo[f,h]quinoxaline (abbreviation: 2mpPCBPDBq) to a thickness of 10 nm over the glass substrate.

The sample 3 was a mixed film of a plurality of heteroaromatic compounds, which was formed by co-evaporation of 2mpPCBPDBq, N-(1,1'-biphenyl-4-yl)-N-[4-(9-phenyl-9H-carbazol-3-yl)phenyl]-9,9-dimethyl-9H-fluoren-2-amine (abbreviation: PCBBiF), and tris(4-t-butyl-6-phenylpyrimidinato)iridium(III) (abbreviation: $Ir(tBuppm)_3$) to 40 nm over the glass substrate such that the weight ratio was 0.8:0.2:0.06 (=2mpPCBPDBq: PCBBiF: $Ir(tBuppm)_3$).

The sample 4 was a stacked-layer film of a plurality of heteroaromatic compounds, which was formed by evaporation of 2mpPCBPDBq to 10 nm and subsequent evaporation of NBPhen to 10 nm over the glass substrate.

The samples formed by such methods were observed visually and with an optical microscope (MX61L semiconductor/FPD inspection microscope, Olympus Corporation).

FIG. 18A to FIG. 18E and FIG. 19A to FIG. 19D show photographs of the samples formed in this example (dark field observation at a magnification of 100 times). As comparative examples, the samples without baking (ref) are also shown.

Table 1 shows the structures and observation results of the samples formed in this example. In Table 1, circles indicate that no crystal was generated and crosses indicate that a crystal was generated. Triangles indicate that a definite judgement could not be made.

TABLE 1

| Sample NO. | Structure | rt | 80° C. | 100° C. | 110° C. | 120° C. | 130° C. | 140° C. | 150° C. |
|---|---|---|---|---|---|---|---|---|---|
| 1 | NBPhen (10 nm) | ○ | ○ | ○ | ○ | ○ | ○ | Δ | Δ |
| 2 | 2mpPCBPDBq (10 nm) | ○ | ○ | ○ | Δ or x | Δ or x | — | — | — |
| 3 | 2mpPCBPDBq:PCBBiF:$Ir(tBuppm)_3$ (0.8:0.2:0.06) (40 nm) | ○ | ○ | ○ | ○ | ○ | x | x | x |
| 4 | NBPhen (10 nm)<br>2mpPCBPDBq (10 nm) | ○ | ○ | x | x | x | — | — | — |
| 5 | NBPhen (10 nm)<br>2mpPCBPDBq (10 nm)<br>2mpPCBPDBq:PCBBiF:$Ir(tBuppm)_3$ (0.8:0.2:0.06) (40 nm) | ○ | ○ | x | x | x | — | — | — |
| 6 | PCBBiF (40 nm) | ○ | ○ | ○ | ○ | ○ | ○ | ○ | ○ |
| 7 | 2mpPCBPDBq:NBPhen (0.5:0.5) (20 nm) | ○ | ○ | ○ | ○ | ○ | ○ | ○ | ○ |
| 8 | NBPhen (20 nm)<br>2mpPCBPDBq:PCBBiF:$Ir(tBuppm)_3$ (0.8:0.2:0.06) (40 nm) | ○ | x | x | x | x | — | — | — |
| 9 | 2mpPCBPDBq:NBPhen (0.5:0.5) (20 nm)<br>2mpPCBPDBq:PCBBiF:$Ir(tBuppm)_3$ (0.8:0.2:0.06) (40 nm) | ○ | ○ | ○ | ○ or Δ | ○ or Δ | Δ or x | x | x |

* rt: room temperature

The sample 5 was a mixed film of a plurality of heteroaromatic compounds, which was formed by co-evaporation of 2mpPCBPDBq, PCBBiF, and Ir(tBuppm); to 40 nm such that the weight ratio was 0.8:0.2:0.06 (=2mpPCBPDBq: PCBBiF: $Ir(tBuppm)_3$), subsequent evaporation of 2mpPCBPDBq to 10 nm, and further evaporation of NBPhen to 10 nm over the glass substrate.

The sample 6 was a single-layer film of one kind of heteroaromatic compound, which was formed by evaporation of PCBBiF to a thickness of 40 nm over the glass substrate.

The sample 7 was a single-layer mixed film of a plurality of heteroaromatic compounds, which was formed by co-evaporation of 2mpPCBPDBq and NBPhen to 20 nm over the glass substrate such that the weight ratio was 0.5:0.5 (=2mpPCBPDBq: NBPhen).

The sample 8 was a mixed film of a plurality of heteroaromatic compounds, which was formed by co-evaporation of 2mpPCBPDBq, PCBBiF, and $Ir(tBuppm)_3$ to 40 nm such that the weight ratio was 0.8:0.2:0.06 (=2mpPCBPDBq: PCBBiF: $Ir(tBuppm)_3$) and subsequent evaporation of NBPhen to 20 nm over the glass substrate.

The sample 9 was a mixed film of a plurality of heteroaromatic compounds, which was formed by co-evaporation of 2mpPCBPDBq, PCBBiF, and $Ir(tBuppm)_3$ to 40 nm such that the weight ratio was 0.8:0.2:0.06 (=2mpPCBPDBq: PCBBiF: $Ir(tBuppm)_3$) and subsequent co-evaporation of 2mpPCBPDBq and NBPhen to 20 nm such that the weight ratio was 0.5:0.5 (=2mpPCBPDBq: NBPhen) over the glass substrate.

The above results showed that crystals were less likely to be generated in the sample 3 and the sample 7, each of which was a mixed film of a plurality of heteroaromatic compounds, than in the sample 4 and the sample 5, each of which was a stacked-layer film of a plurality of heteroaromatic compounds. It was thus found that a mixed film of a plurality of heteroaromatic compounds has improved heat resistance. Specifically, according to comparison between the sample 4 and the sample 7, the sample 4 as a stacked-layer film was crystallized at 100° C., whereas the sample 7 as a mixed film was not crystallized even at 150° C., despite the fact that they included the same heteroaromatic compounds. This showed that especially a mixed film of a plurality of π-electron deficient heteroaromatic compounds has an effect of improving heat resistance.

The above results show that even a material having relatively high heat resistance in the form of a single film is sometimes crystallized at low temperatures by being stacked. According to comparison between the sample 5, the sample 8, and the sample 9, in each of which a plurality of films were stacked, the sample 5 was crystallized at 100° C. and the sample 8 was crystallized at 80° C., whereas the sample 9 exhibited no clear crystallization even at 130° C. It was found that forming an electron-transport layer in the form of a mixed film including a plurality of heteroaromatic compounds has an effect of making heat resistance higher than that in the case where an electron-transport layer is formed using one material by 30° C. or more. A light-emitting device is fabricated by stacking a plurality of organic compounds in many cases. Thus, using the light-emitting device of one embodiment of the present invention can significantly improve the heat resistance of the light-emitting device.

Example 2

The results in Example 1 revealed that the mixed film of the heteroaromatic compound and the organic compound that are used for the electron-transport layer in the light-emitting device of one embodiment of the present invention has higher heat resistance than the stacked-layer film in which the single-layer films of these compounds are stacked; thus, a light-emitting device 1 including the mixed film of the heteroaromatic compound and the organic compound as an electron-transport layer and a comparative light-emitting device 1 including a stacked-layer film of the heteroaromatic compound and the organic compound as an electron-transport layer were fabricated, and the characteristics of the devices were compared. The element structures and their characteristics are described below. Table 2 shows specific structures of the light-emitting device 1 and the comparative light-emitting device 1 used in this example. The chemical formulae of materials used in this example are shown below.

TABLE 2

| | Thickness | Light-emitting device 1 | Comparative light-emitting device 1 |
|---|---|---|---|
| Second electrode | 200 nm | Al | |
| Electron-injection layer | 1 nm | LiF | |
| Electron-transport layer | 30 nm | 2mpPCBPDBq:NBPhen (1:1) | NBPhen (20 nm) 2mpPCBPDBq (10 nm) |
| Light-emitting layer | 50 nm | 2mpPCBPDBq:PCBBiF:Ir(tBuppm)$_3$ (0.8:0.2:0.05) | |
| Hole-transport layer | 50 nm | PCBBiF | |
| Hole-injection layer | 10 nm | PCBBiF:OCHD-003 (1:0.03) | |
| First electrode | 70 nm | ITSO | |

[Chemical Formula 4]

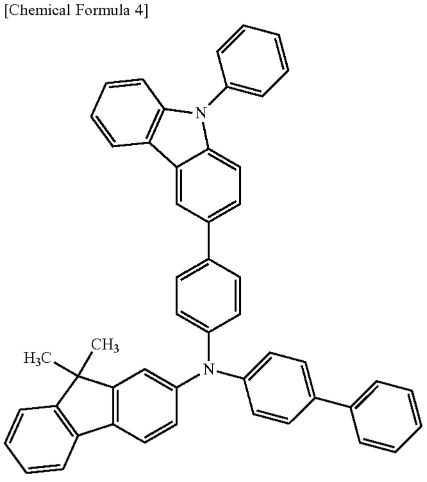

(i) PCBBiF

TABLE 2-continued

| | Thickness | Light-emitting device 1 | Comparative light-emitting device 1 |
|---|---|---|---|

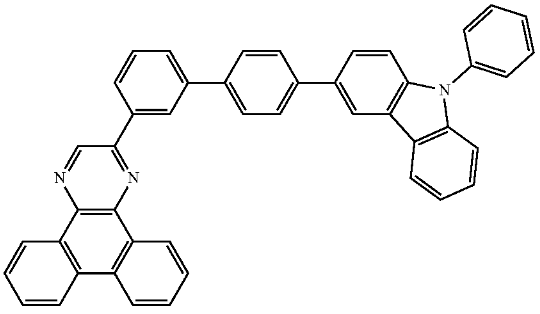

(ii) 2mpPCBPDBq

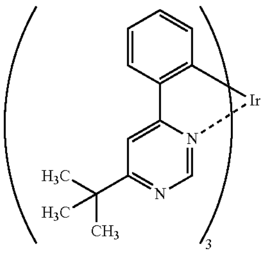

(iii) Ir(tBuppm)$_3$

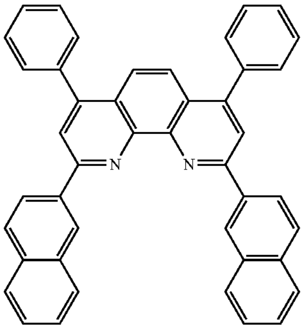

(iv) NBPhen

<<Fabrication of Light-Emitting Device 1>>

Figure 20:
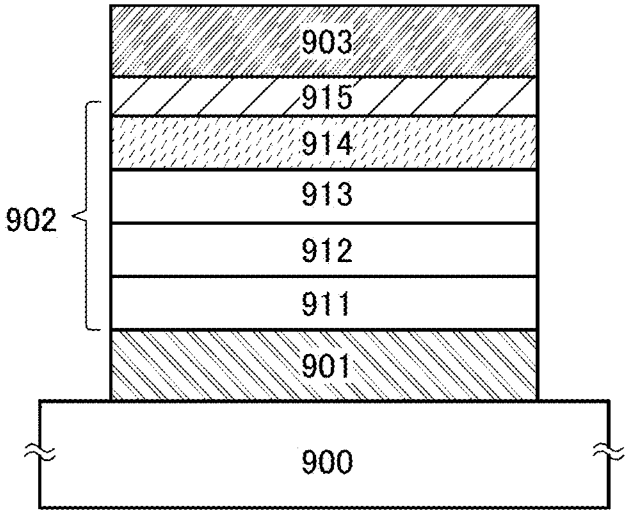
FIG. 20 is a diagram illustrating a structure of a light-emitting device according to an example.

The light-emitting device 1 described in this example included, as illustrated in FIG. 20, an EL layer 902 formed between a first electrode 901 and a second electrode 903. Specifically, the light-emitting device 1 had a structure in which a hole-injection layer 911, a hole-transport layer 912, a light-emitting layer 913, an electron-transport layer 914, and an electron-injection layer 915 were stacked in this order over the first electrode 901 formed over a substrate 900, and the second electrode 903 was stacked over the electron-injection layer 915.

First, the first electrode 901 was formed over the substrate 900. The electrode area was set to 4 $mm^2$ (2 mm×2 mm). A glass substrate was used as the substrate 900. The first electrode 901 was formed to a thickness of 70 nm using indium tin oxide containing silicon oxide (ITSO) by a sputtering method.

Here, for pretreatment, a surface of the substrate was washed with water, baking was performed at 200° C. for 1 hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for approximately 30 minutes.

Next, the hole-injection layer 911 was formed over the first electrode 901. After the pressure in the vacuum evaporation apparatus was reduced to 10-+Pa, and the hole-injection layer 911 was formed by co-evaporation of N-(1, 1'-biphenyl-4-yl)-N-[4-(9-phenyl-9H-carbazol-3-yl) phenyl]-9,9-dimethyl-9H-fluoren-2-amine (abbreviation: PCBBiF) represented by Structural Formula (i) above and an electron acceptor material (OCHD-003) containing fluorine and having a molecular weight of 672, to 10 nm, such that the weight ratio was 1:0.03 (=PCBBIF: OCHD-003).

Then, the hole-transport layer 912 was formed over the hole-injection layer 911. The hole-transport layer 912 was formed by evaporation of PCBBiF to 50 nm.

Next, the light-emitting layer 913 was formed over the hole-transport layer 912.

The light-emitting layer 913 was formed by co-evaporation of 2-[4'-(9-phenyl-9H-carbazol-3-yl)-3, l'-biphenyl-1-yl]dibenzo[f,h]quinoxaline (abbreviation: 2mpPCBPDBq) represented by Structural Formula (ii) above, PCBBiF, and tris(4-t-butyl-6-phenylpyrimidinato)iridium(III) (abbreviation: $Ir(tBuppm)_3$) represented by Structural Formula (iii) above, to 50 nm, such that the weight ratio was 2mpPCBPDBq: PCBBiF: $Ir(tBuppm)_3$=0.8:0.2:0.05.

element, and at the time of sealing, UV treatment was performed and heat treatment was performed at 80° C. for 1 hour).

<<Fabrication of Comparative Light-Emitting Device 1>>

The comparative light-emitting device 1 was fabricated in a manner similar to that of the light-emitting device 1 except that the electron-transport layer 914 was formed not by co-evaporation of 2mpPCBPDBq and NBPhen but by evaporation of 2mpPCBPDBq to 10 nm and subsequent evaporation of NBPhen to 20 nm.

<<Operating Characteristics of Light-Emitting Device 1>>

Figure 21:
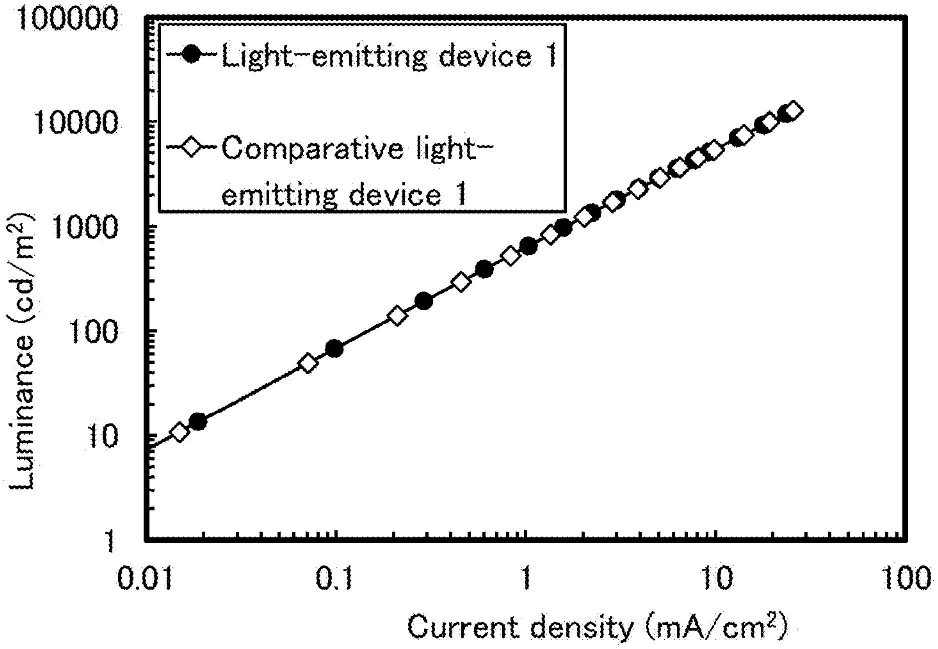
FIG. 21 shows luminance-current density characteristics of a light-emitting device 1 and a comparative light-emitting device 1.
Figure 22:
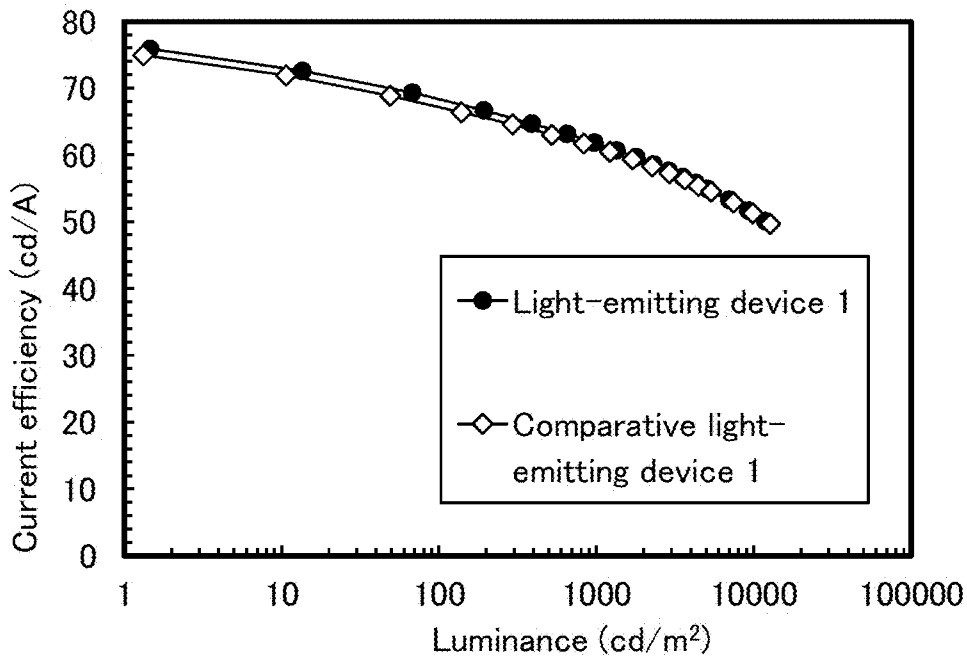
FIG. 22 shows current efficiency-luminance characteristics of the light-emitting device 1 and the comparative light-emitting device 1.
Figure 23:
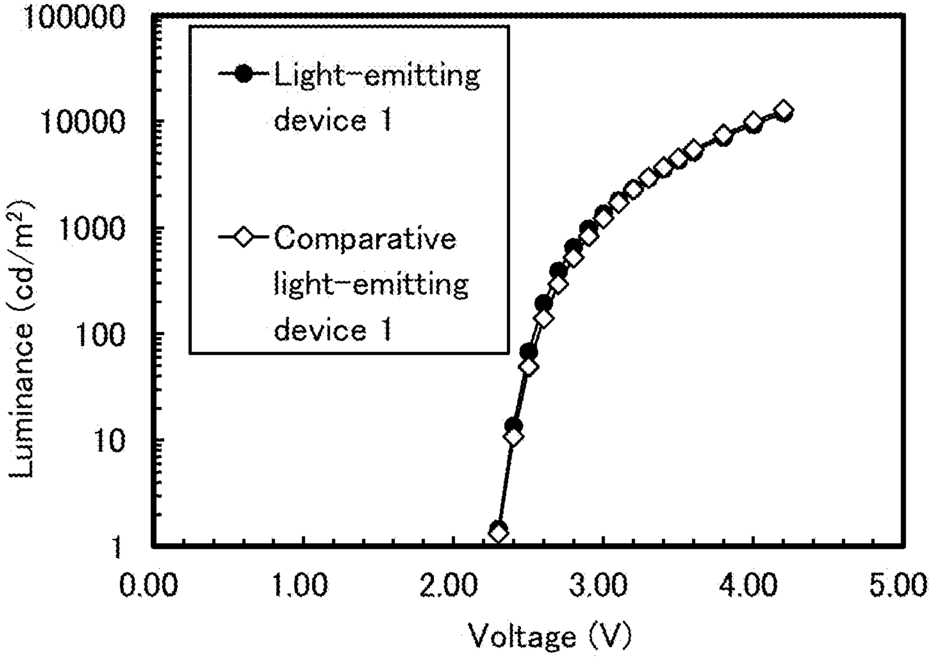
FIG. 23 shows luminance-voltage characteristics of the light-emitting device 1 and the comparative light-emitting device 1.
Figure 24:
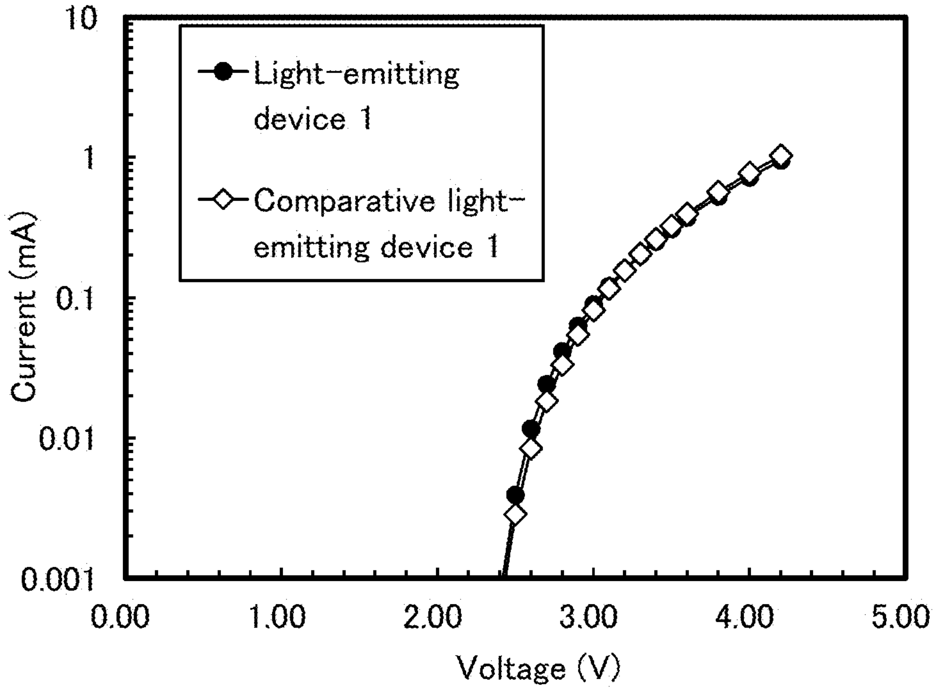
FIG. 24 shows current-voltage characteristics of the light-emitting device 1 and the comparative light-emitting device 1.
Figure 25:
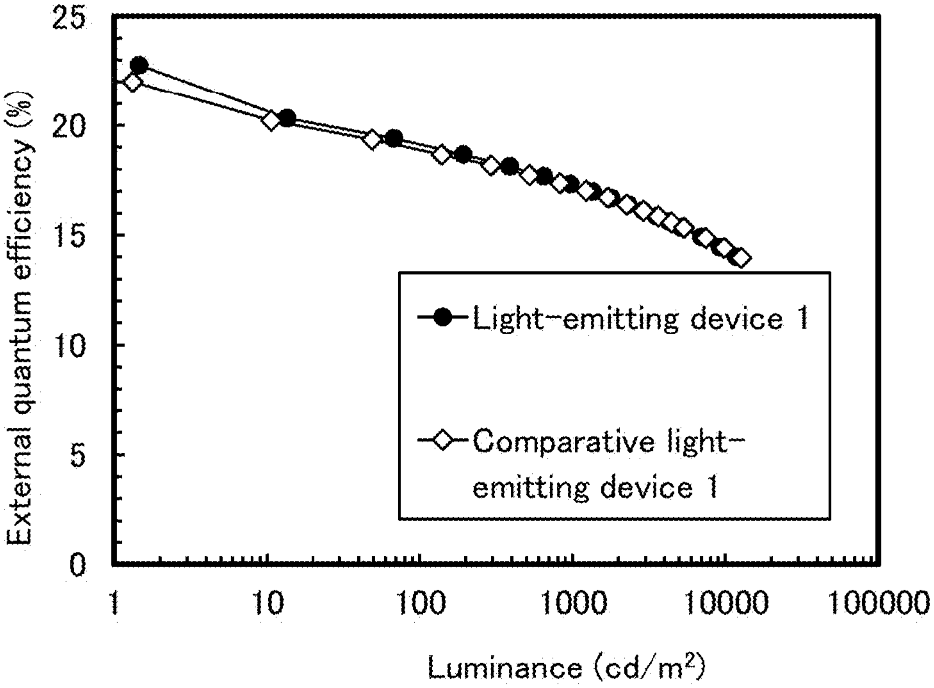
FIG. 25 shows external quantum efficiency-luminance characteristics of the light-emitting device 1 and the comparative light-emitting device 1.
Figure 26:
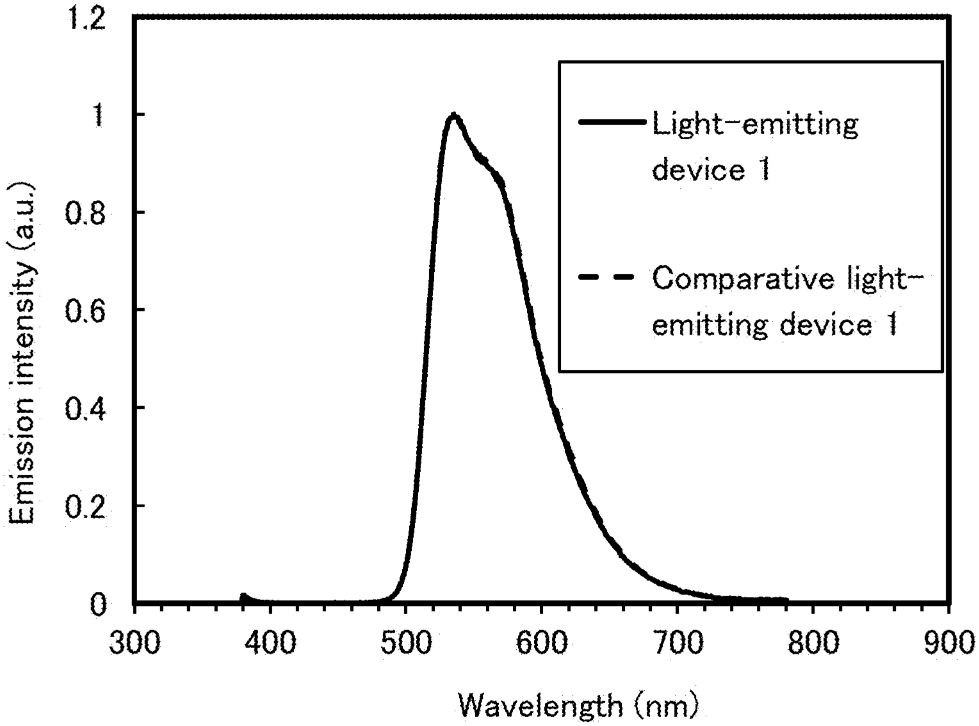
FIG. 26 shows emission spectra of the light-emitting device 1 and the comparative light-emitting device 1.

FIG. 21 shows the luminance-current density characteristics of the light-emitting device 1 and the comparative light-emitting device 1. FIG. 22 shows the current efficiency-luminance characteristics thereof. FIG. 23 shows the luminance-voltage characteristics thereof. FIG. 24 shows the current-voltage characteristics thereof. FIG. 25 shows the external quantum efficiency-luminance characteristics thereof. FIG. 26 shows the emission spectra thereof. Table 3 shows the main characteristics of the light-emitting device 1 and the comparative light-emitting device 1 at approximately 1000 cd/m$^2$. The luminance, CIE chromaticity, and emission spectra were measured at normal temperature with a spectroradiometer (SR-UL1R manufactured by TOPCON TECHNOHOUSE CORPORATION).

TABLE 3

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting device 1 | 2.9 | 0.06 | 1.6 | 0.40 | 0.58 | 61.9 | 17.3 |
| Comparative light-emitting device 1 | 2.9 | 0.05 | 1.4 | 0.41 | 0.58 | 61.7 | 17.4 |

Next, the electron-transport layer 914 was formed over the light-emitting layer 913. The electron-transport layer 914 was formed by co-evaporation of 2mpPCBPDBq and 2,9-di(2-naphthyl)-4,7-diphenyl-1,10-phenanthroline (abbreviation: NBPhen) represented by Structural Formula (iv) above, to 30 nm, such that the weight ratio was 2mpPCBPDBq:NBPhen=1:1.

Then, the electron-injection layer 915 was formed over the electron-transport layer 914. The electron-injection layer 915 was formed to a thickness of 1 nm by evaporation of lithium fluoride (LiF).

After that, the second electrode 903 was formed over the electron-injection layer 915. The second electrode 903 was formed to a thickness of 200 nm by an evaporation method using aluminum. In this example, the second electrode 903 functions as a cathode.

Through the above steps, the light-emitting device 1 including the EL layer between the pair of electrodes was formed over the substrate 900. Note that the hole-injection layer 911, the hole-transport layer 912, the light-emitting layer 913, the electron-transport layer 914, and the electron-injection layer 915 described in the above steps are functional layers forming the EL layer in one embodiment of the present invention. Furthermore, in all the evaporation steps in the above fabrication method, an evaporation method by a resistance-heating method was used.

The fabricated light-emitting device 1 was sealed in a glove box containing a nitrogen atmosphere so as not to be exposed to the air (a sealant was applied to surround the The results in FIG. 21 to FIG. 26 and Table 3 revealed that the light-emitting device 1 of one embodiment of the present invention had operation characteristics equivalent to those of the comparative light-emitting device 1.

Figure 27:
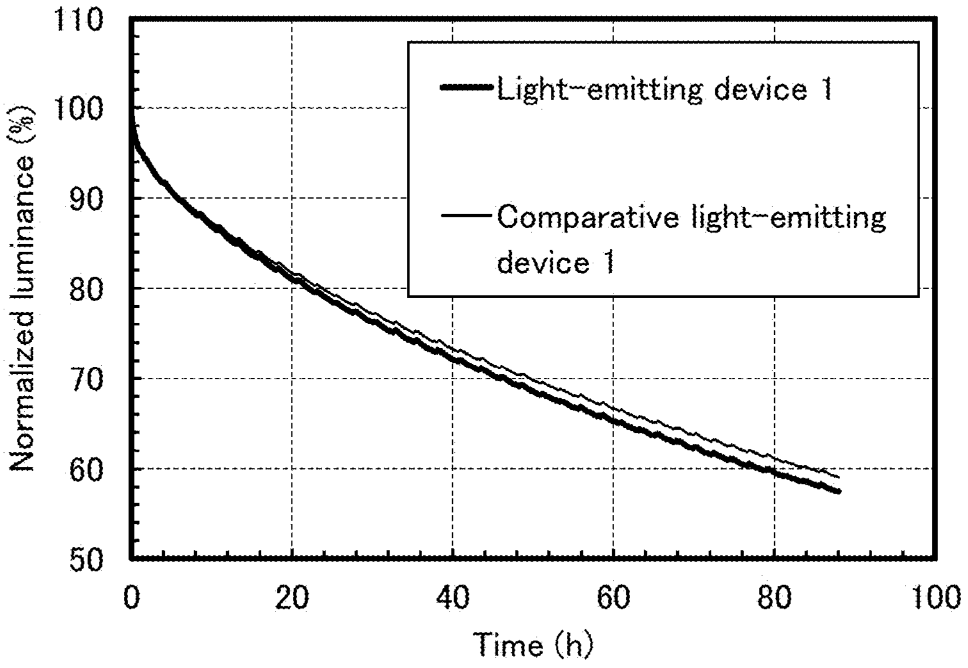
FIG. 27 is a diagram showing reliabilities of the light-emitting device 1 and the comparative light-emitting device 1.

Next, reliability tests were performed on the light-emitting devices. FIG. 27 shows the results of the reliability tests of the light-emitting device 1 and the comparative light-emitting device 1. In FIG. 27, the vertical axis represents normalized luminance (%) on the assumption that the initial luminance is 100%, and the horizontal axis represents driving time (h) of the devices. As the reliability tests, driving tests at a constant current density of 50 mA/cm$^2$ were performed on the light-emitting devices.

The results in FIG. 27 showed that the light-emitting device 1 of one embodiment of the present invention had favorable reliability comparable to that of the comparative light-emitting device 1.

Example 3

In this example, a synthesis method of 2-[4'-(9-phenyl-9H-carbazol-3-yl)-3,1'-biphenyl-1-yl]dibenzo[f,h]quinoxaline (abbreviation: 2mpPCBPDBq) used in Example 1 and Example 2 is described. The structural formula of 2mpPCBPDBq is shown below.

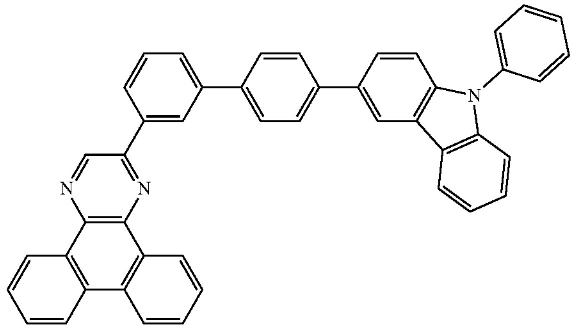

2mpPCBPDBq

<<Synthesis of 2mpPCBPDBq>>

Into a 200-mL three-neck flask were put 6.9 g (17 mmol) of 3-(4-bromophenyl)-9-phenylcarbazole, 4.4 g (17 mmol) of bis(pinacolate)diborane, 0.17 g (0.4 mmol) of 2-di-tert-butylphosphino-2',4',6'-triisopropylbiphenyl (tBuXPhos), 4.0 g (40 mmol) of potassium acetate, and 90 mL of xylene; then, degassing under reduced pressure was performed and subsequently, a nitrogen gas was made to flow continuously in the system. This mixture was heated to 80° C., 0.17 mg (0.2 mmol) of [1,1'-bis(diphenylphosphino)ferrocene]palladium(II) dichloride (Pd(dppf)$Cl_2$) was then added, and the mixture was stirred at 120° C. for 10 hours.

To the resultant mixture, 5.8 g (17 mmol) of 2-(3-chlorophenyl)dibenzo[f,h]quinoxaline, 13 g (40 mmol) of cesium carbonate, and 0.18 mg (0.4 mmol) of tBuXPhos were added, degassing under reduced pressure was performed and then, a nitrogen gas was made to flow continuously in the system. This mixture was heated to 80° C., 0.16 mg (0.2 mmol) of Pd(dppf)$Cl_2$ was then added, and this mixture was heated and stirred at 130° C. for 3 hours and then at 150° C. for 15 hours. After the stirring, the precipitated solid was collected by suction filtration was washed with water and ethanol. The obtained solid was suction-filtered through Celite (Catalog No. 537-02305 produced by Wako Pure Chemical Industries, Ltd.) and alumina with the use of 1 L of toluene; then, recrystallization was performed with toluene to give 1.4 g of a white powder, which was an objective substance (yield: 12%). The synthesis scheme is shown in Formula (a-1) below.

[Chemical Formula 6]

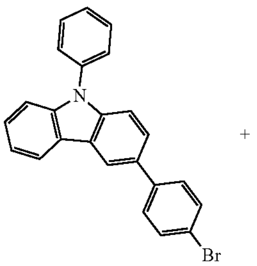

-continued

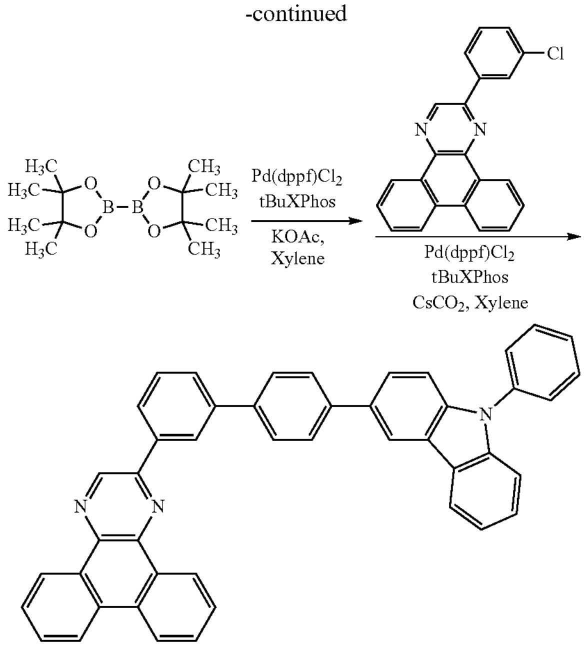

(a-1)
2mpPCBPDBq

The obtained solid was sublimated and purified by a train sublimation method. In the sublimation purification, 1.3 g of the obtained solid was heated at 340° C. for 15 hours. The pressure during the sublimation purification was 3.9 Pa and the argon flow rate was 15 sccm. After the sublimation purification, 1.5 g of a solid of the objective substance was obtained at a collection rate of 85%.

Analysis results by nuclear magnetic resonance (1H-NMR) spectroscopy of the solid obtained as described above are shown below. The results show that 2mpPCBPDBq was obtained in this example.

$^{1}$H NMR (chloroform-d, 500 MHz): δ=7.32-7.35 (m, 1H), 7.446 (s, 1H), 7.454 (s, 1H), 7.49-7.53 (m, 2H), 7.61-7.66 (m, 4H), 7.71-7.92 (m, 11H), 8.24 (d, J=8.0 Hz, 1H), 8.33 (d, J=8.0 Hz, 1H), 8.46 (sd, J=1.0 Hz, 1H), 8.67-8.68 (m, 3H), 9.26 (dd, J=7.8 Hz, J=1.3 Hz, 1H), 9.47 (dd, J=8.0 Hz, J=1.5 Hz, 1H), 9.48 (s, 1H).

REFERENCE NUMERALS

100: light-emitting device, 101: first electrode, 102: second electrode, 103*a*: EL layer, 103*b*: EL layer, 103*c*: EL layer, 103P: EL layer, 103Pb: EL layer, 103Pg: EL layer, 103Pr: EL layer, 103Q: EL layer, 103Qb: EL layer, 103Qg: EL layer, 103Qr: EL layer, 103: EL layer, 104*a*: hole-injection/transport layer, 104*b*: hole-injection/transport layer, 104P: hole-injection/transport layer, 104Pb: hole-injection/transport layer, 104Pg: hole-injection/transport layer, 104Pr: hole-injection/transport layer, 104Q: hole-injection/transport layer, 104Qb: hole-injection/transport layer, 104Qg: hole-injection/transport layer, 104Qr: hole-injection/transport layer, 106*a*: charge-generation layer, 106B: charge-generation layer, 106*b*: charge-generation layer, 106G: charge-generation layer, 106R: charge-generation layer, 106: charge-generation layer, 107: insulating layer, 108*a*: electron-transport layer, 108: second electron-transport layer, 109*a*: electron-injection layer, 109*b*: electron-injection layer, 109: electron-injection layer, 110: sacrificial layer, 111*a*: hole-injection layer, 111*b*: hole-injection layer, 111: hole-injection layer, 112*a*: hole-transport layer, 112*b*: hole-transport layer, 112: hole-transport layer, 113*a*: light-emitting layer, 113B: light-emitting layer, 113*b*: light-emitting layer, 113G: light-emitting layer, 113R: light-emitting layer, 113: light-emitting layer, 114*b*: electron-transport layer, 114: electron-transport layer, 115*b*: electron-injection layer, 115: electron-injection layer, 231: display region, 400: substrate, 401: first electrode, 403: EL layer, 404: second electrode, 405: sealant, 406: sealant, 407: sealing substrate, 412: pad, 420: IC chip, 501C: insulating film, 501D: insulating film, 504: conductive film, 506: insulating film, 508A: region, 508B: region, 508C: region, 508: semiconductor film, 510: first substrate, 512A: conductive film, 512B: conductive film, 516A: insulating film, 516B: insulating film, 516: insulating film, 518: insulating film, 519: terminal, 520: functional layer, 524: conductive film, 528: partition, 530B: pixel circuit, 530G: pixel circuit, 550B: light-emitting device, 550G: light-emitting device, 550R: light-emitting device, 550: light-emitting device, 551B: electrode, 551G: electrode, 551R: electrode, 552: electrode, 573: insulating layer, 580: space, 591B: opening, 591G: opening, 700: light-emitting apparatus, 702B: pixel, 702G: pixel, 702R: pixel, 703: pixel, 705: insulating layer, 770: second substrate, 900: substrate, 901: first electrode, 903: second electrode, 911: hole-injection layer, 912: hole-transport layer, 913: light-emitting layer, 914: electron-transport layer, 915: electron-injection layer, 951: substrate, 952: electrode, 953: insulating layer, 954: partition layer, 955: EL layer, 956: electrode, 5200B: electronic appliance, 5210: arithmetic device, 5220: input/output device, 5230: display portion, 5240: input portion, 5250: sensing portion, 5290: communication portion, 8001: ceiling light, 8002: foot light, 8003: sheet-shaped lighting, 8004: lighting device, 8005: desk lamp, 8006: light source This application is based on Japanese Patent Application Serial No. 2021-021325 filed on Feb. 12, 2021, the entire contents is hereby incorporated herein by reference.

The invention claimed is:

1. A light-emitting device comprising:

a first electrode;

a second electrode over the first electrode;

a first EL layer between the first electrode and the second electrode;

a second EL layer over the first EL layer; and an insulating layer, wherein the first EL layer comprises at least a first light-emitting layer, wherein the second EL layer comprises at least a second light-emitting layer, a first electron-transport layer, and a second electron-transport layer, wherein the first electron-transport layer is over the second light-emitting layer, wherein the second electron-transport layer is over the first electron-transport layer, wherein the insulating layer is in contact with a side surface of the first light-emitting layer, a side surface of the second light-emitting layer, and a side surface of the first electron-transport layer, wherein the insulating layer is positioned between the second electron-transport layer and the side surface of the first light-emitting layer, the side surface of the second light-emitting layer, and the side surface of the first electron-transport layer, and wherein the first electron-transport layer comprises a heteroaromatic compound comprising at least one heteroaromatic ring and an organic compound different from the heteroaromatic compound.

2. The light-emitting device according to claim 1, wherein the organic compound comprises at least one heteroaromatic ring.

3. The light-emitting device according to claim 1, wherein the heteroaromatic ring comprises any one of a pyridine skeleton, a diazine skeleton, a triazine skeleton, and a polyazole skeleton.

4. The light-emitting device according to claim 1, wherein the heteroaromatic ring comprises a fused heteroaromatic ring having a fused ring structure.

5. The light-emitting device according to claim 4, wherein the fused heteroaromatic ring is any one of a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

6. A light-emitting apparatus comprising the light-emitting device according to claim 1.

7. A light-emitting device comprising:

a first electrode;

a second electrode over the first electrode;

a first EL layer between the first electrode and the second electrode;

a second EL layer over the first EL layer; and an insulating layer, wherein the first EL layer comprises at least a first light-emitting layer, wherein the second EL layer comprises at least a second light-emitting layer, a first electron-transport layer, and a second electron-transport layer, wherein the first electron-transport layer is over the second light-emitting layer, wherein the second electron-transport layer is over the first electron-transport layer, wherein the insulating layer is in contact with a side surface of the first light-emitting layer, a side surface of the second light-emitting layer, and a side surface of the first electron-transport layer, wherein the insulating layer is positioned between the second electron-transport layer and the side surface of the first light-emitting layer, the side surface of the second light-emitting layer, and the side surface of the first electron-transport layer, wherein the first electron-transport layer comprises a first heteroaromatic compound comprising at least one heteroaromatic ring and an organic compound different from the first heteroaromatic compound, and wherein the second electron-transport layer comprises a second heteroaromatic compound comprising at least one heteroaromatic ring.

8. The light-emitting device according to claim 7, wherein the organic compound comprises at least one heteroaromatic ring.

9. The light-emitting device according to claim 7, wherein the heteroaromatic ring comprises any one of a pyridine skeleton, a diazine skeleton, a triazine skeleton, and a polyazole skeleton.

10. The light-emitting device according to claim 7, wherein the heteroaromatic ring comprises a fused heteroaromatic ring having a fused ring structure.

11. The light-emitting device according to claim 10, wherein the fused heteroaromatic ring is any one of a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

12. A light-emitting apparatus comprising the light-emitting device according to claim 7 and a transistor or a substrate.

* * * * *